United States Patent
Takayama et al.

(10) Patent No.: US 7,538,636 B2
(45) Date of Patent: May 26, 2009

(54) ELECTRONIC PART WITH A COMB ELECTRODE AND PROTECTIVE FILM AND ELECTRONIC EQUIPMENT INCLUDING SAME

(75) Inventors: Ryouichi Takayama, Hirakata (JP); Hidekazu Nakanishi, Neyagawa (JP); Takashi Inoue, Suita (JP); Tetsuo Kawasaki, Katano (JP); Kouji Hasegawa, Muroran (JP); Yukio Iwasaki, Tadaoka-cho (JP)

(73) Assignee: Panasonic Corporation, Osaka (JP)

( * ) Notice: Subject to any disclaimer, the term of this patent is extended or adjusted under 35 U.S.C. 154(b) by 369 days.

(21) Appl. No.: 10/540,399

(22) PCT Filed: Dec. 24, 2003

(86) PCT No.: PCT/JP03/16513

§ 371 (c)(1),
(2), (4) Date: Feb. 22, 2006

(87) PCT Pub. No.: WO2004/059837

PCT Pub. Date: Jul. 15, 2004

(65) Prior Publication Data

US 2006/0158800 A1    Jul. 20, 2006

(30) Foreign Application Priority Data

Dec. 25, 2002 (JP) ............................. 2002-374396
Dec. 25, 2002 (JP) ............................. 2002-374397
Dec. 25, 2002 (JP) ............................. 2002-374398
Dec. 25, 2002 (JP) ............................. 2002-374402

(51) Int. Cl.
*H03H 9/13* (2006.01)
*H03H 9/25* (2006.01)
*H03H 9/64* (2006.01)

(52) U.S. Cl. ................ 333/193; 310/313 A; 310/313 B
(58) Field of Classification Search ................ 333/193, 333/195; 310/313 A, 312
See application file for complete search history.

(56) References Cited

U.S. PATENT DOCUMENTS

| 5,302,877 A | 4/1994 | Sato et al. |
| 5,923,231 A * | 7/1999 | Ohkubo et al. ............... 333/193 |
| 6,037,847 A | 3/2000 | Ueda et al. |

(Continued)

FOREIGN PATENT DOCUMENTS

| EP | 0 734 120 | 9/1996 |
| EP | 0 744 830 | 11/1996 |

OTHER PUBLICATIONS

Supplementary European Search Report issued Mar. 26, 2008 in European Application No. EP 03 78 2874.

(Continued)

*Primary Examiner*—Barbara Summons
(74) *Attorney, Agent, or Firm*—Wenderoth, Lind & Ponack, L.L.P.

(57) ABSTRACT

An electronic part, object of which is to improve temperature characteristics and electrical properties, includes a substrate (1), a comb-type electrode (2) that is disposed on the upper surface of the substrate (1), and a protective film (4) that covers the comb-type electrode (2) and has an uneven shape at its top surface. If the pitch width of one pitch in the uneven shape of the protective film (4) is L, the width of one pitch of a convex portion (4a) of the unevenness in the uneven shape of the protective film (4) is L1, the width of one pitch of a concave portion (4b) thereof is L2, the pitch width of one pitch of the comb-type electrode (2) is p, the width of one of electrode fingers which form the comb-type electrode (2) is p1 and the width between the electrode fingers is p2, then each parameter is set so that the following expressions are satisfied, $L1 \leq p1$ and $L2 \geq p2$ (herein, the correlations of $L \approx p$, $p1+p2=p$ and $L1+L2=L$ are satisfied).

8 Claims, 35 Drawing Sheets

1.SUBSTRATE
2.COMB-TYPE ELECTRODE
3.REFLECTOR
4.PROTECTIVE FILM
5.PAD

FOREIGN PATENT DOCUMENTS

| | | |
|---|---|---|
| JP | 61-136312 | 6/1986 |
| JP | 5-259802 | 10/1993 |
| JP | 6-90412 | 3/1994 |
| JP | 8-265088 | 10/1996 |
| JP | 9-167936 | 6/1997 |
| JP | 10-126207 * | 5/1998 |
| WO | 96/04713 | 2/1996 |

OTHER PUBLICATIONS

Kengo Asai et al., Experimental and Theoretical Investigation for Temperature Characteristics and Propagation Losses of SAWs on $SiO_2/Al/LiTaO_3$, IEEE Ultrasonics Symposium, Nov. 8, 2002-Nov. 11, 2002, pp. 235-238.

Fred S. Hickernell, "The Application of Dielectric Thin Films to Enhance the Properties of SAW Devices", IEEE MTT-S International Microwave Symposium Digest, vol. 1, May 20, 2001-May 25, 2001, pp. 363-366.

Osamu Kawachi et al., "Optimal Cut for Leaky SAW on $LiTaO_3$ for High Performance Resonators and Filters", IEEE Transactions on Ultrasonics, Ferroelectrics and Frequency Control, vol. 48, No. 5, Sep. 2001, pp. 1442-1448.

Kazuhiko Yamanouchi et al., "High Temperature Stable Ghz-Range Low-Loss Wide Band Transducers and Filter Using $SiO_2/LiNbO_3$, $LiTaO_3$", IEEE Transactions on Ultrasonics, Ferroelectrics and Frequency Control, vol. 42, No. 3, May 1995, pp. 392-396.

* cited by examiner

1. SUBSTRATE
2. COMB-TYPE ELECTRODE
3. REFLECTOR
4. PROTECTIVE FILM
5. PAD

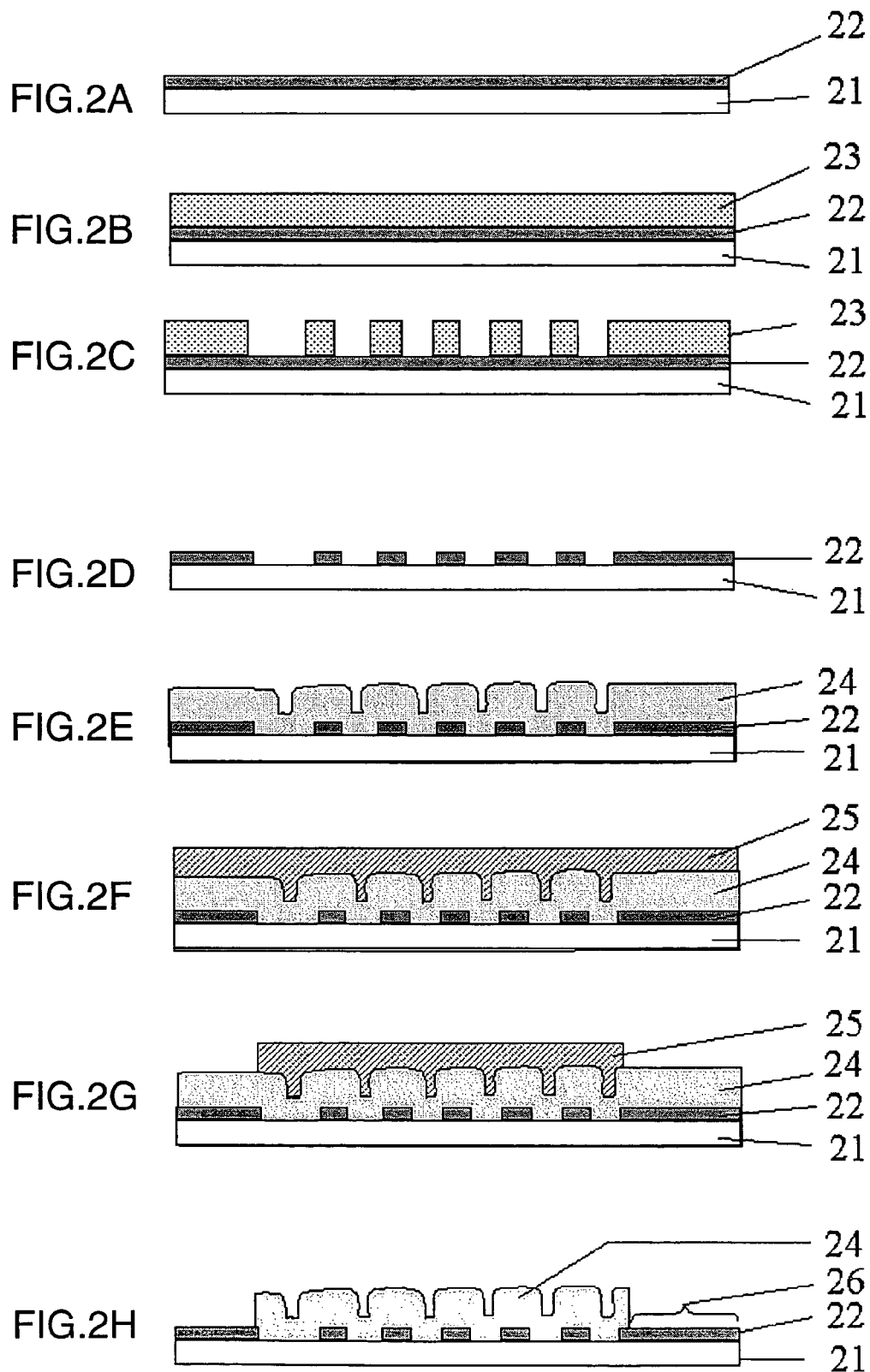

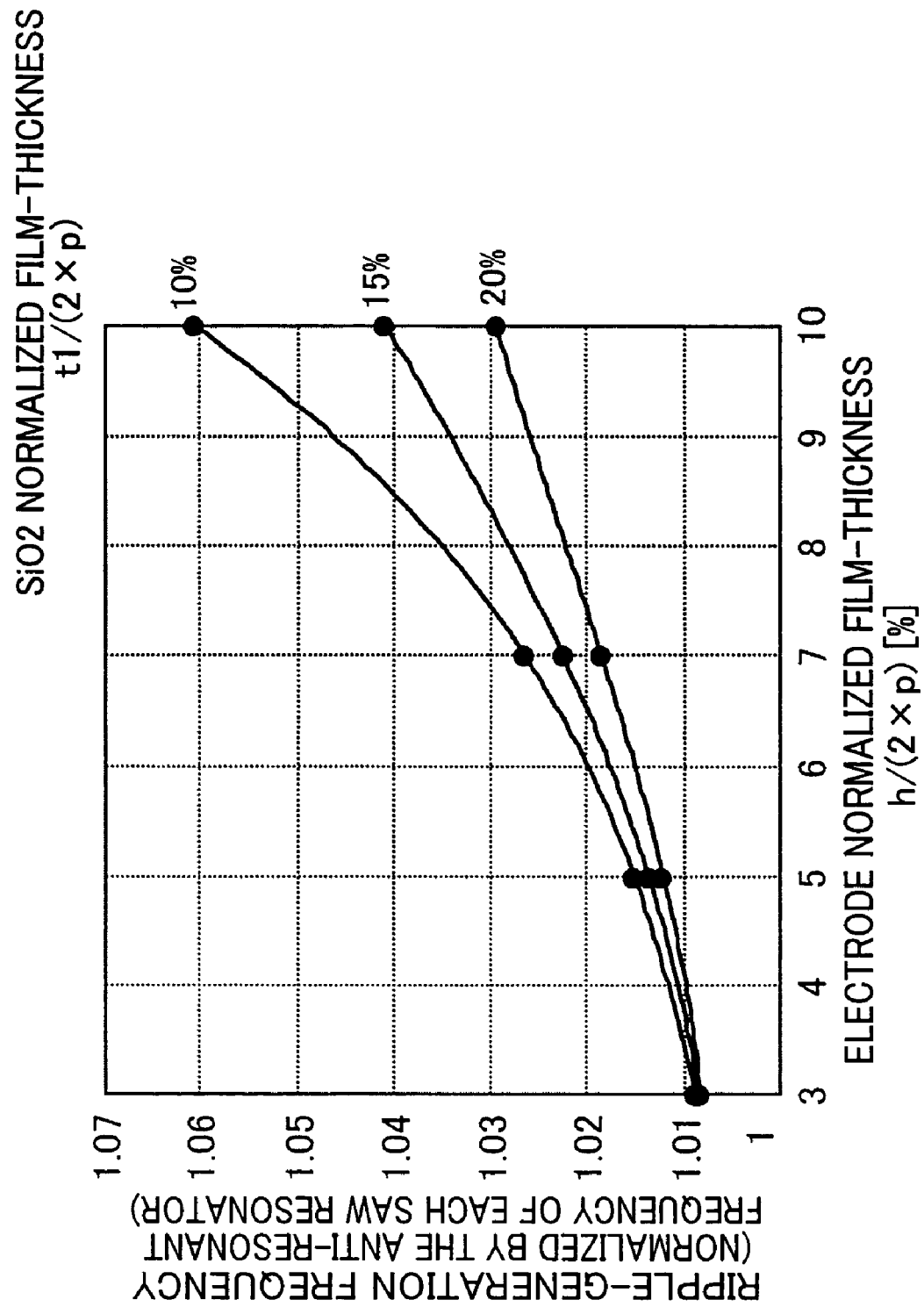

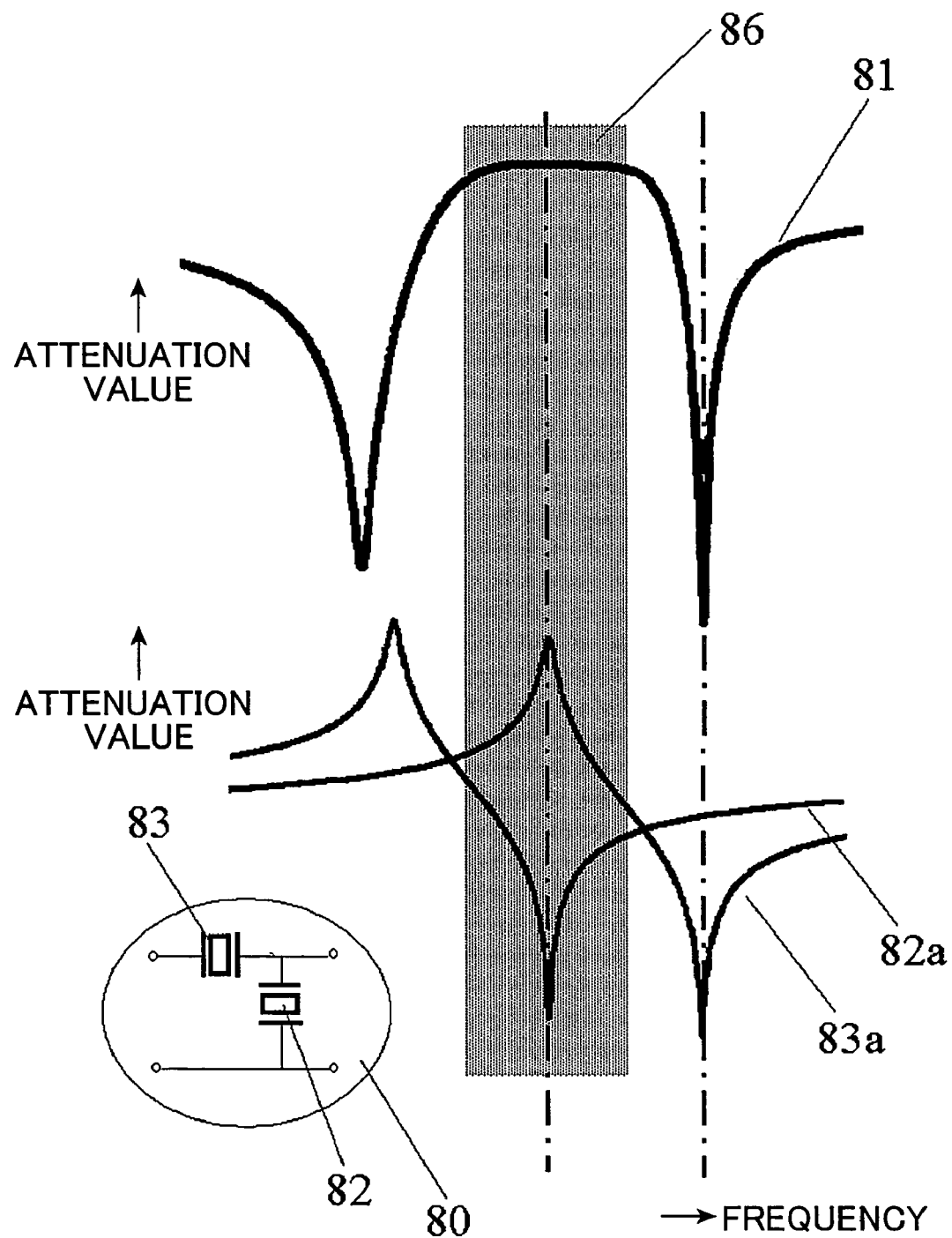

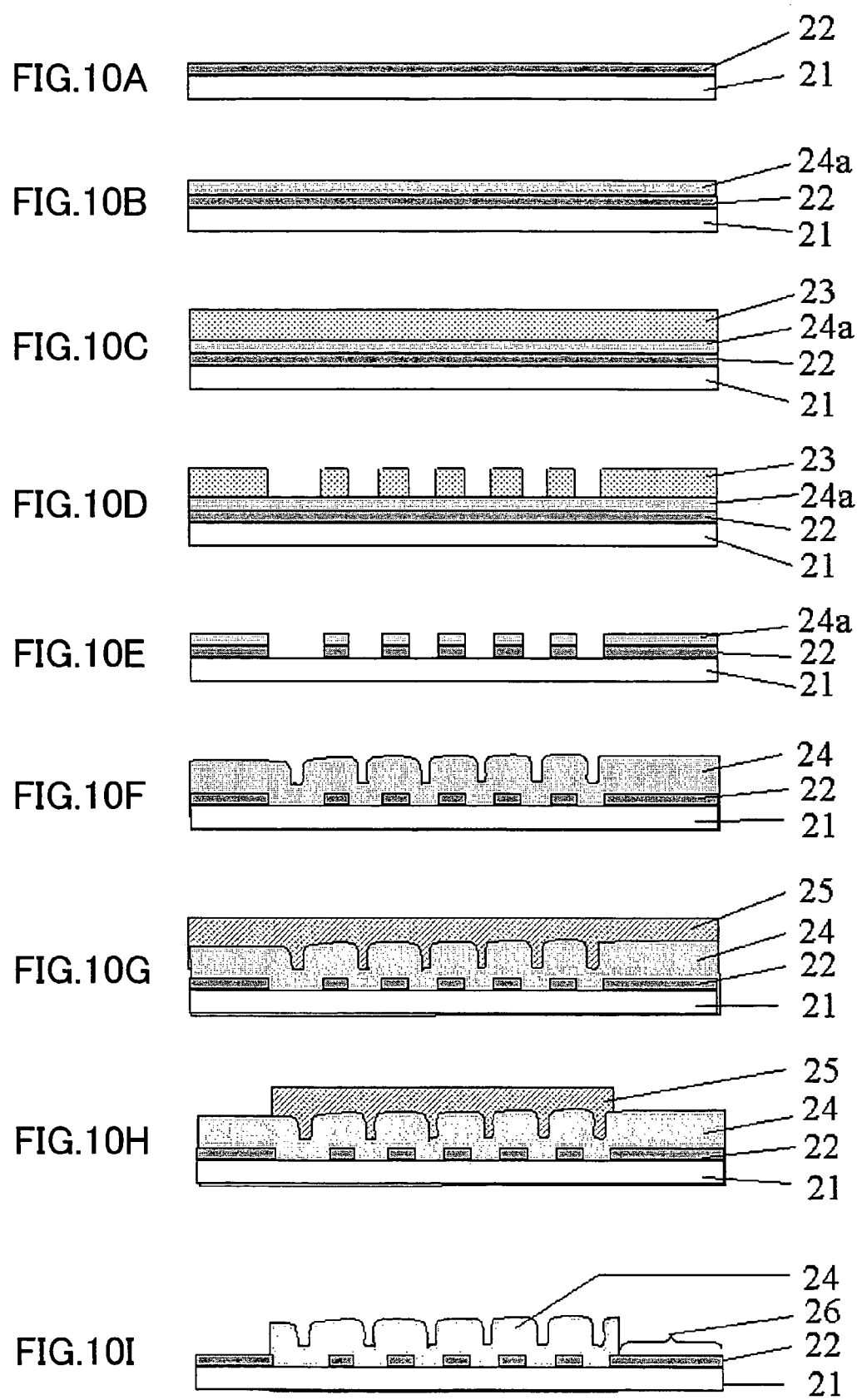

FIG.15A EMBODIMENT 3
 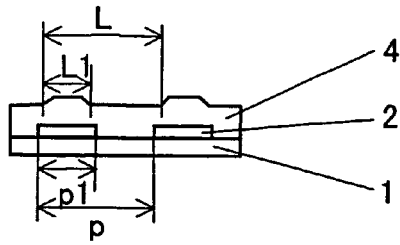
FIG.15B EMBODIMENT 4
 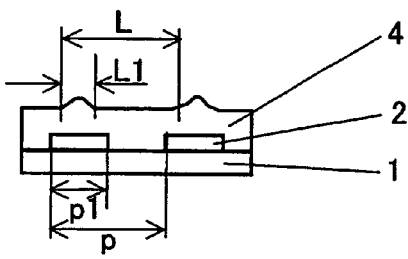
FIG.15C EMBODIMENT 5
 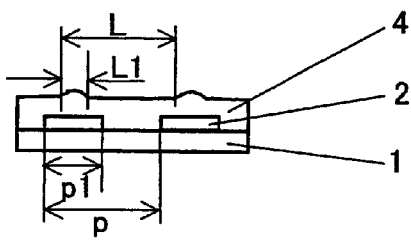
FIG.15D COMPARATIVE EXAMPLE 6
 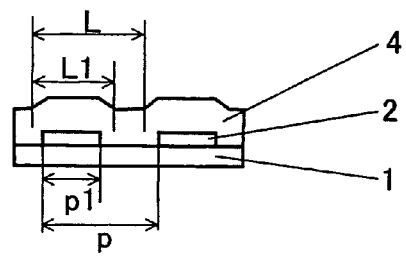
FIG.15E COMPARATIVE EXAMPLE 7
 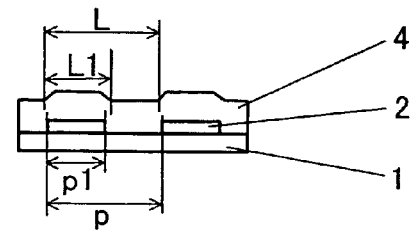

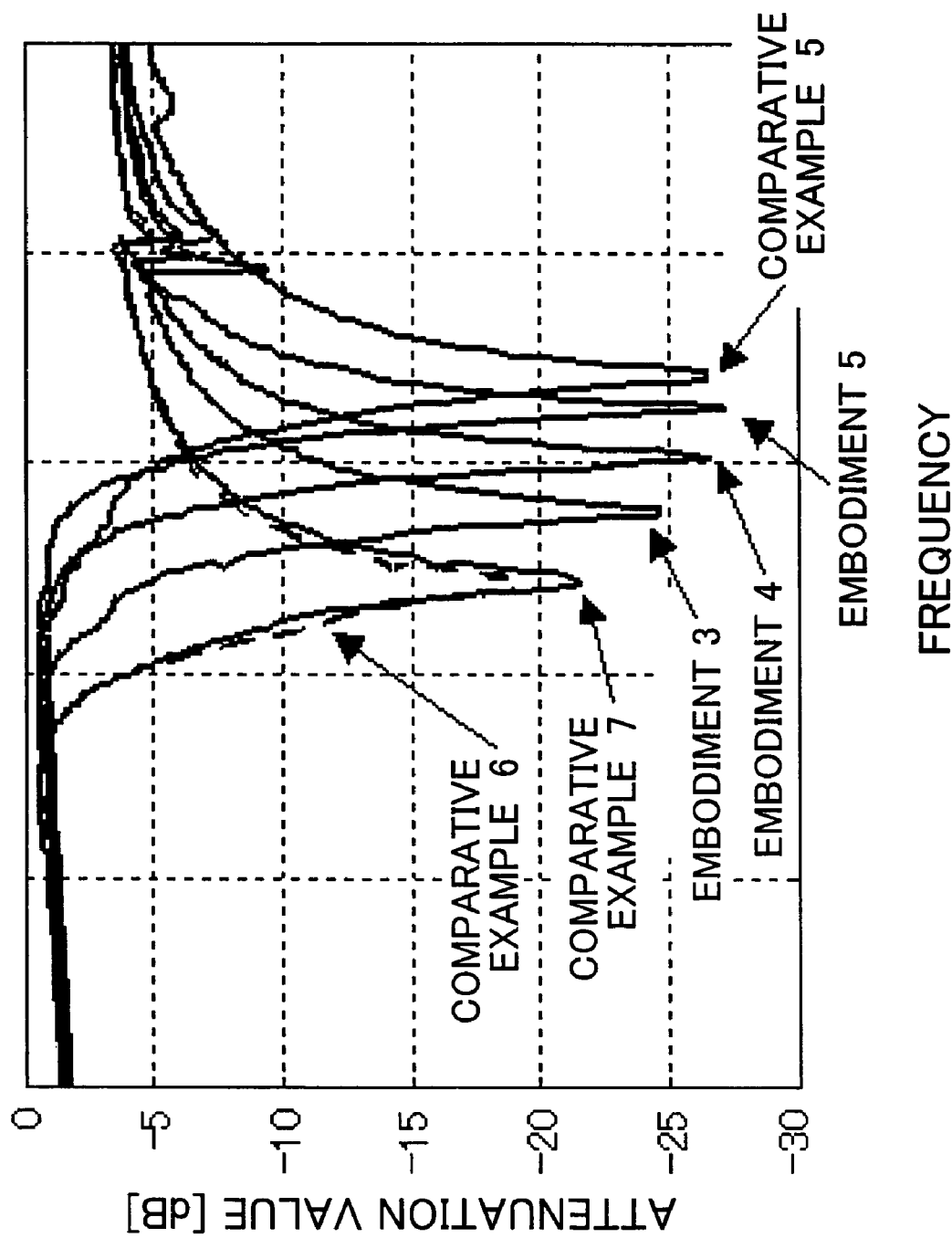

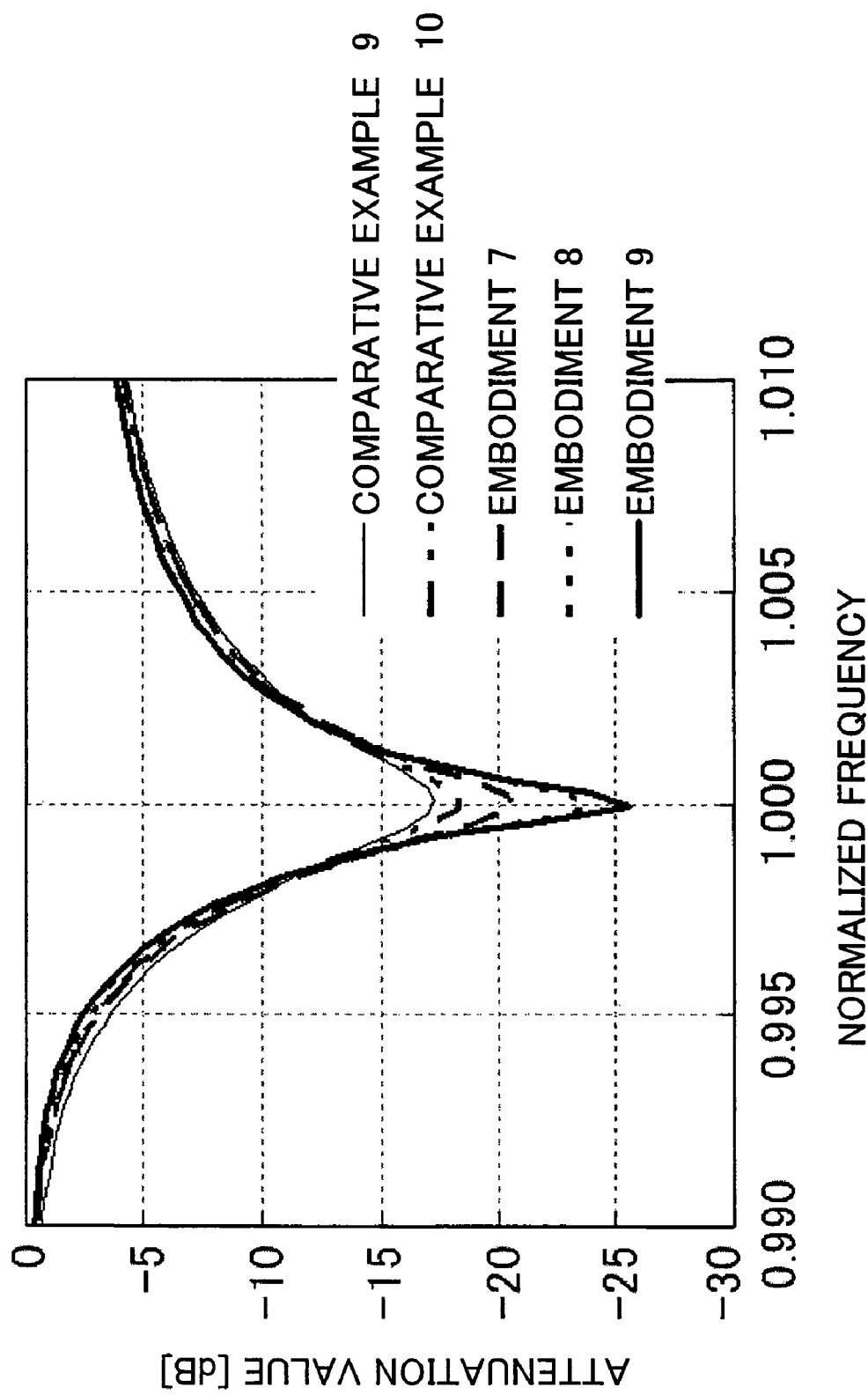

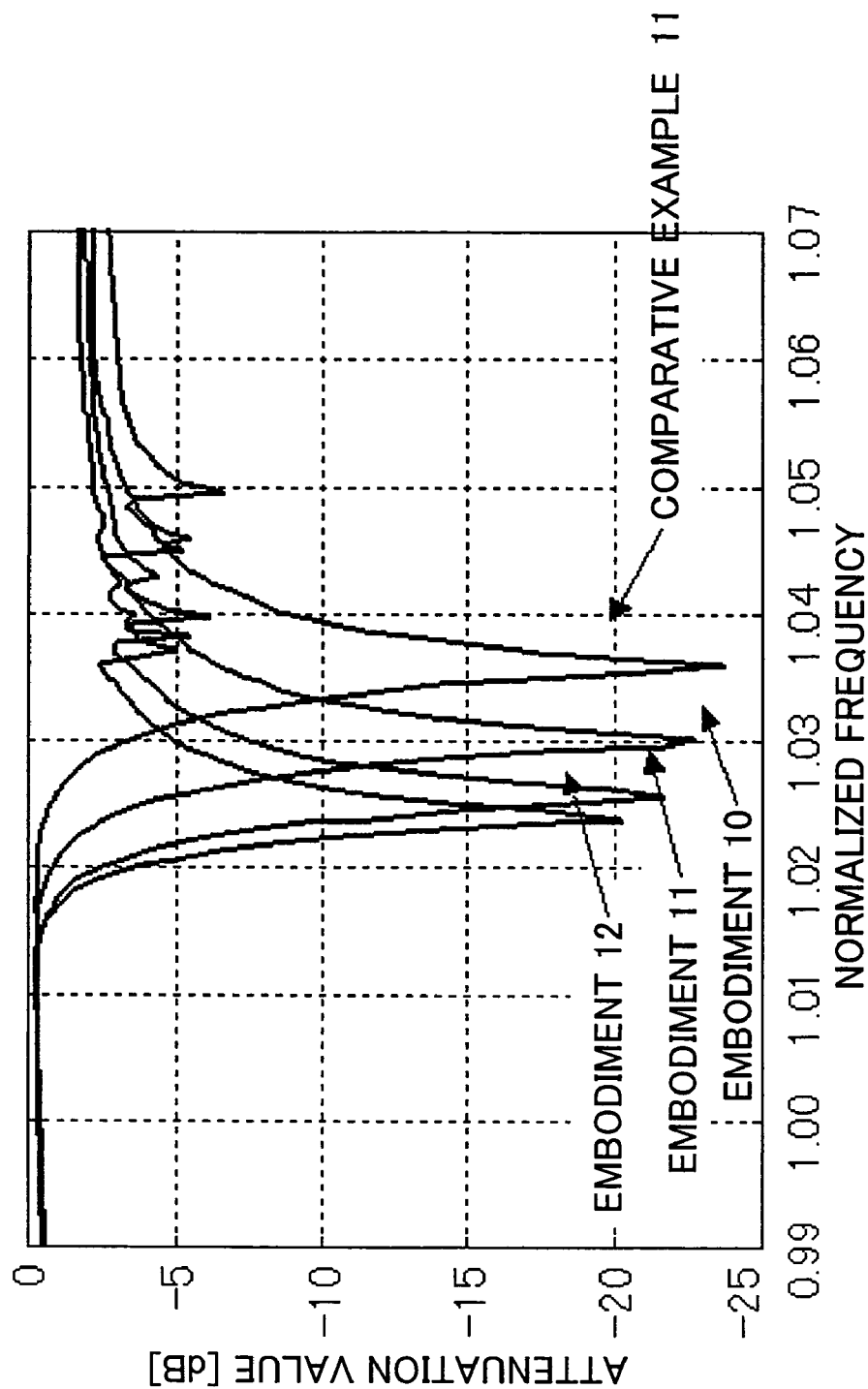

131. TRANSMISSION BAND
132. RECEPTION BAND

ELECTRONIC PART WITH A COMB ELECTRODE AND PROTECTIVE FILM AND ELECTRONIC EQUIPMENT INCLUDING SAME

TECHNICAL FIELD

The present invention relates to an electronic part, and electronic equipment provided with this electronic part.

BACKGROUND ART

Hereinafter, a conventional electronic part will be described.

In the prior art, a surface acoustic-wave device (hereinafter, referred to as the "SAW device") is described as an example of an electronic part.

In recent years, a small and light SAW device is prevalently used for electronic equipment, such as various types of mobile communication terminal equipment. Especially, in a radio circuit section of a mobile-phone system within a band of 800 MHz to 2 GHz, an SAW filter has been widely used. Such an SAW filter is formed by a lithium-tantalate (hereinafter, referred to as the "LT") substrate which is cut out of a Y-sheet at a cutout angle of 36° as its rotational angle around the X-axis in the Z-axis direction, or a so-called 36° Y-cut X-propagation LT (hereinafter, referred to as the "36° YLT") substrate. However, depending upon a place at which a filter is used in a mobile-phone system or its radio circuit section, filter characteristics are required, such as a small insertion loss within a further passing band and a steep skirt property of the filter, as well as a high suppression level within a block band. In order to meet such demands, there is a method in which an LT substrate is used that is cut out of a Y-sheet at a cutout angle of 42° as its rotational angle around the X-axis in the Z-axis direction, or a so-called 42° Y-cut X-propagation LT (hereinafter, referred to as the "42° YLT") substrate is used. According to this method, an SAW filter can be realized which has a smaller loss and a steeper filter skirt property than those of the conventional 36° YLT substrate. Such a method is described in Japanese Patent Laid-Open No. 9-167936 specification.

However, similarly to the conventional 36° YLT substrate, such a 42° YLT substrate has a great thermal-expansion coefficient in the direction where a surface acoustic wave is propagated. Beside, the elastic constant itself varies according to the temperature. Thereby, the frequency characteristics of a filter may also be largely shifted by approximately −35 ppm/°K according to a change in the temperature. This is disadvantageous in temperature characteristics. For example, taking a PCS transmission filter from the United States into account, its center frequency of 1.88 GHz at the room temperature changes by about ±3.3 MHz or some 6.6 MHz within an range of ±50 ° C. In the case of the PCS, there is an interval of only 20 MHz between its transmission band and reception band. Hence, also considering the dispersion of frequencies in its production, in practice, the transmission and reception interval is only substantially 10 MHz for the filter. Thus, for example, if the transmission band is desired to be secured over the entire temperature (i.e., within the whole range of ±50° C at the room temperature) an adequate attenuation value cannot be obtained on the reception side.

Summary OF THE INVENTION

In order to resolve the above described conventional disadvantages, it is an object of the present invention to obtain an electronic part which is excellent in temperature characteristics and electrical properties by forming a protective film on an electrode.

In order to attain the above described object, one aspect of the present invention is an electronic part, and in a protective film which has an uneven shape at its top surface that is provided in the electronic part, if a height from the surface of the substrate which is in contact with the protective film to a top part of a convex portion of the protective film is t, a height from the surface of the substrate which is in contact with the protective film to a bottom part of a concave portion of the protective film is t1, a height (t-t1) from the top part of the convex portion of the protective film to the bottom part of the concave portion of the protective film is t2 a pitch width of one pitch in the uneven shape of the protective film is L, a width of one pitch of the convex portion of an unevenness in the uneven shape of the protective film is L1, a width of one pitch of the concave portion is L2, a pitch width of one pitch of the comb-type electrode is p, a width of one of electrode fingers which form the comb-type electrode is p1, a width between the electrode fingers is p2, and a film thickness of the comb-type electrode is h, that satisfies, $t2 \leq h$ (herein, correlations of $L \approx p$, $p1+p2=p$, $L1+L2=L$, $L1 \leq p1$ and $L2 \geq p2$ are satisfied).

The objects, characteristics, aspects and advantages of the present invention will be more obvious in the following detailed description and attached drawings.

BRIEF DESCRIPTION OF THE DRAWINGS

FIG. 2A to FIG. 2H are each a sectional view of the electronic part according to the first embodiment of the present invention, showing its production method.

FIG. 7 is a graphical representation, showing correlations between the normalized film thickness of an electrode and a ripple-generation frequency according to the first embodiment of the present invention.

FIG. 8 is a representation, showing the configuration of a ladder-type SAW filter.

FIG. 10A to FIG. 10I are each a sectional view of the electronic part according to the second embodiment of the present invention, showing its production method.

FIG. 15A to FIG. 15E are each a sectional SEM photograph and a sectional view of the electronic part according to the third embodiment of the present invention.

FIG. 16 is a graphical representation, showing an electrical characteristic of the electronic part according to the third embodiment of the present invention.

FIG. 20 is a graphical representation, showing an electrical characteristic of an electronic part according to a fifth embodiment of the present invention.

FIG. 21 is a graphical representation, showing an electrical characteristic of an electronic part according to a sixth embodiment of the present invention.

DETAILED DESCRIPTION OF PREFERRED EMBODIMENTS Detailed Description of Preferred Embodiments Hereinafter, an electronic part according to each embodiment of the present invention will be described with reference to the drawings. In each embodiment, an SAW device is described as an example of the electronic part.

First Embodiment

Figure 1A:
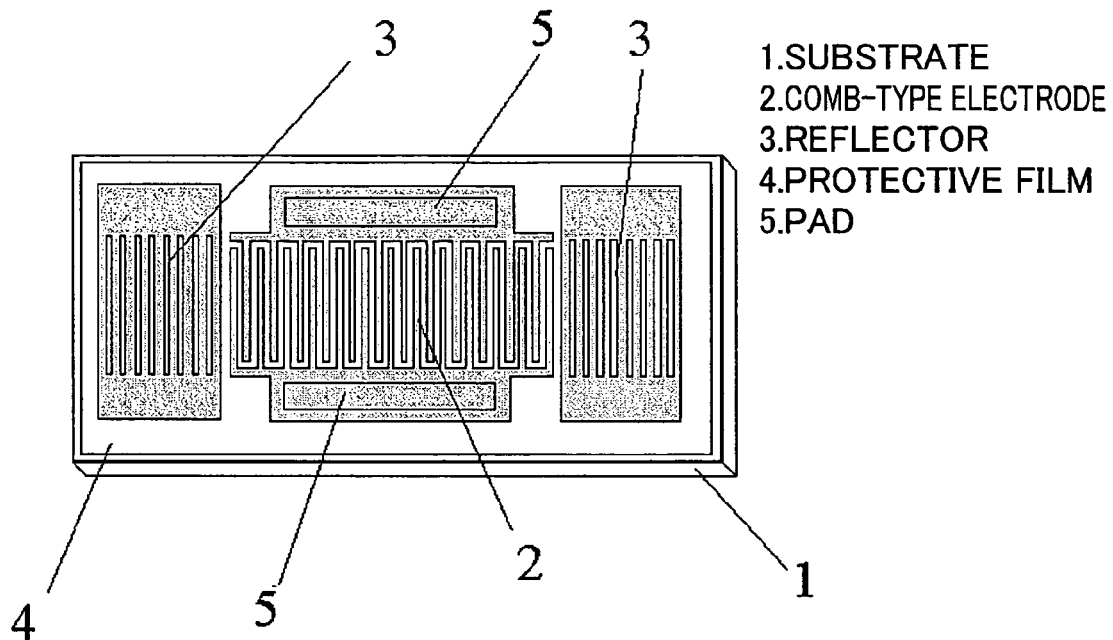
FIG. 1A is a top view of an electronic part according to a first embodiment of the present invention, showing its configuration.
Figure 1B:
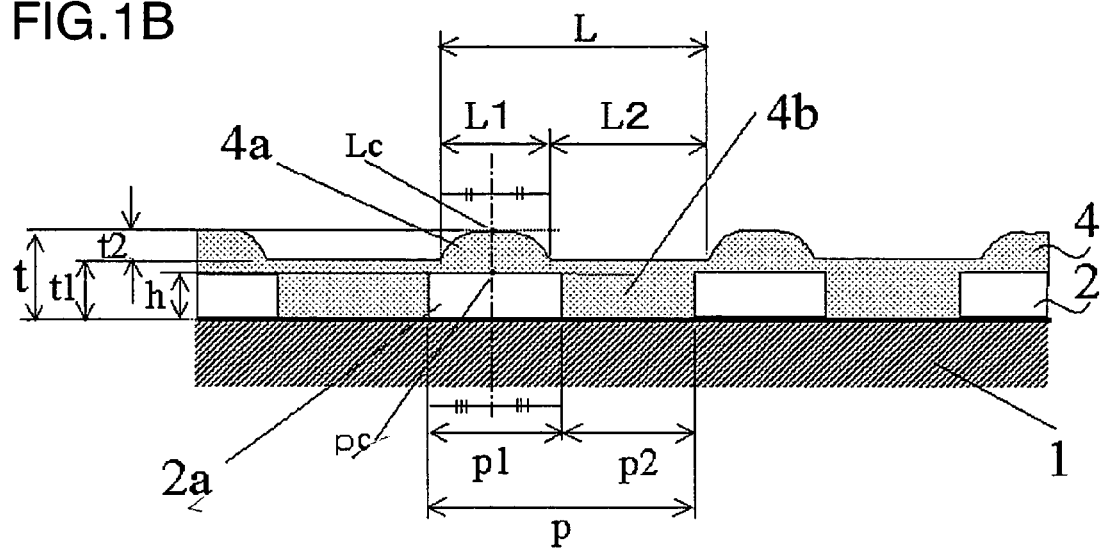
FIG. 1B is a sectional view of the electronic part according to the first embodiment of the present invention.

FIG. 1A is a top view of an SAW device as the electronic part according to a first embodiment of the present invention, showing its configuration. FIG. 1B is a sectional view of the same.

As shown in these figures, the SAW device according to the first embodiment includes a comb-type electrode 2 on the upper surface of a substrate 1, a reflector 3 on both sides of this comb-type electrode 2, and a protective film 4 which covers at least these comb-type electrode 2 and reflector 3. In addition, the comb-type electrode 2 is provided with a pad 5 for taking out an electric signal which is electrically connected to the comb-type electrode 2. Thereby, the SAW device is configured.

The substrate 1 is made of lithium tantalate (hereinafter, referred to as "LT") which is cut out of a Y-sheet that is turned by several degrees around the X-axis in the Z-axis direction. It is a 36° YLT substrate which is obtained at a turning angle of 36°.

The comb-type electrode 2 is made of aluminum (hereinafter, referred to as "Al"), or an aluminum alloy.

The protective film 4 is preferably made of silicon dioxide (hereinafter, referred to as "SiO2"), or an aluminum alloy. As shown in FIG. 1B, an uneven shape is formed at its top surface. A convex portion 4a of the protective film 4 is provided over the part where the comb-type electrode 2 is disposed on the upper surface of the substrate 1. On the other hand, a concave portion 4b of the protective film 4 is provided, in the part where no comb-type electrode 2 is disposed on the upper surface of the substrate 1 between the convex portions 4a, and in its vicinity.

Herein, the height from the surface of the substrate 1 which is in contact with the protective film 4 to the top part of the convex portion 4a of the protective film 4 is t, the height from the surface of the substrate 1 which is in contact with the protective film 4 to the bottom part of the concave portion 4b of the protective film 4 is t1, and the height (t-t1) from the bottom part of the concave portion 4b of the protective film 4 to the top part of the convex portion 4a of the protective film 4 is t2.

In addition, the height of the comb-type electrode 2 from the surface of the substrate 1 which is in contact with the protective film 4 to the top part of an electrode finger 2a is h.

Besides, one convex portion 4a and one concave portion 4b of the protective film 4 are one pitch, the pitch width of one pitch is L, the width of the convex portion 4a of the protective film 4 is L1, and the width of the concave portion 4b of the protective film 4 is L2 (herein, L=L1+L2 is satisfied). Further, in the same way as one pitch of the protective film 4, the width of one pitch of the comb-type electrode 2 from one electrode finger 2a of the comb-type electrode 2 to the part in which the adjacent electrode finger 2a is disposed on one side is p.

Moreover, the width of each electrode finger is p1, the width between the adjacent electrode fingers is p2 (herein, p=p1+p2 is satisfied).

In addition, the ratio L1/L of the width L1 of the convex portion 4a of the protective film 4 to the pitch width L of the protective film 4 is η' and the ratio p1/p of the width p1 of each electrode finger to the width p of one pitch of the comb-type electrode 2 is η.

A manufacturing method for the SAW device which is configured as described above will be described below with reference to the drawings.

FIG. 2A to FIG. 2H are each a sectional view of the SAW device according to the first embodiment of the present invention, showing its production method.

First, as shown in FIG. 2A, using a method such as vapor deposition and sputtering, an electrode film 22 as a comb-type electrode or/and a reflector which is made of Al or an Al alloy is formed on the upper surface of an LT substrate 21.

Next, as shown in FIG. 2B, a resist film 23 is formed on the upper surface of the electrode film 22.

Next, as shown in FIG. 2C, using an exposure-development technique or the like, the resist film 23 is processed so as to turn into a desirable shape.

Next, as shown in FIG. 2D, using a dry-etching technique or the like, the electrode film 22 is processed so as to turn into the desirable shape, such as a comb-type electrode and a reflector, and thereafter, the resist film 23 is removed.

Next, as shown in FIG. 2E, using a method such as vapor deposition and sputtering, a protective film 24 is made of SiO2 so as to cover the electrode film 22.

Next, further, as shown in FIG. 2F, a resist film 25 is formed on the surface of the protective film 24.

Next, as shown in FIG. 2G, using a technique such as exposure and development, the resist film 25 is processed so as to turn into a desirable shape.

Next, as shown in FIG. 2H, using a dry-etching technique or the like, a protective film which is the part unnecessary for the protective film 24, such as a pad 26 for taking out an electrical signal, is removed, and thereafter, the resist film 25 is removed.

Finally, using dicing, it is divided into pieces, and thereafter, mounted in a ceramic package using die bonding or the like. After wire bonding, a lid is welded to execute a hermetic seal.

According to the first embodiment of the present invention, the following correlation is satisfied, $$t2 \leq h$$

(herein, the correlations of L≈p, p1+p2=p, L1+L2=L, L1≦p1 and L2≧p2 are satisfied).

As the method of obtaining the shape which satisfies this correlation, a so-called bias-sputtering method is used. This is the method of applying a bias on the substrate side and forming a film by sputtering in the formation of the SiO2 film of FIG. 2E which shows the production method. In that case, in order to control the shape of the SiO2 film, it is executed by changing the ratio of the bias which is applied on the substrate to the sputtering power.

Figure 3:
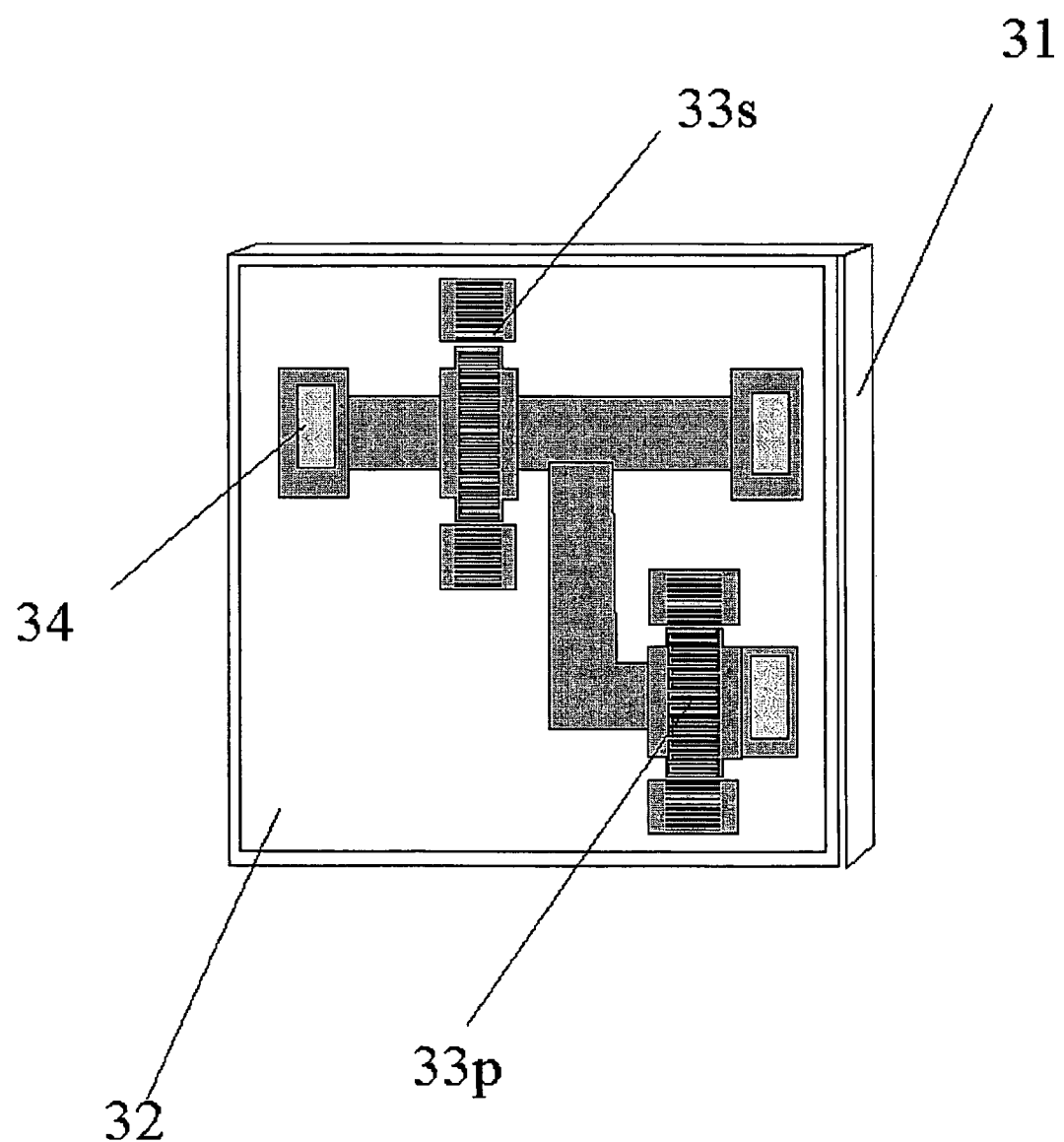
FIG. 3 is a schematic perspective view of an SAW filter according to the first embodiment of the present invention.

This first embodiment takes into account how the height t2 from the top part of the convex portion of the protective film to the bottom part of the concave portion of this protective film should be correlated to the film thickness h of the electrode. Thereby, even if the protective film is formed, it can be seen that good characteristics can be obtained. As an embodiment 1 and a comparative example 2, an SAW device is created which is t2≦h (herein, the correlations of L≈p, p1+p2=p, L1+L2=L, L1≦p1 and L2≧p2 are satisfied). As a comparative example 1, an SAW device is created which is h<t2 (herein, the correlations of L≈p, p1+p2=p, L1+L2=L, L1≦p1 and L2≧p2 are satisfied). Their electrical characteristics are measured. Herein, the normalized film thickness (h/2×p) of each electrode film in the embodiment 1 and the comparative example 1 is 7%, and the normalized film thickness (h/2×p) of an electrode film in the comparative example 2 is 4%. The SiO2 film thickness t1 is 20% in the embodiment 1 and the comparative examples 1, 2. In addition, the created SAW devices are an SAW resonator shown in FIG. 1A, and a ladder-type SAW filter shown in FIG. 3 which is obtained by connecting SAW resonators that each have the configuration of FIG. 1A so that they are shaped like a ladder with several steps. In FIG. 3, reference numeral 31 denotes an LY substrate; 32, an SiO2 film; 34, an electrode pad; 33s, an SAW resonator which is disposed in a series arm; and 33p, an SAW resonator which is disposed in a parallel arm.

Figure 4A:
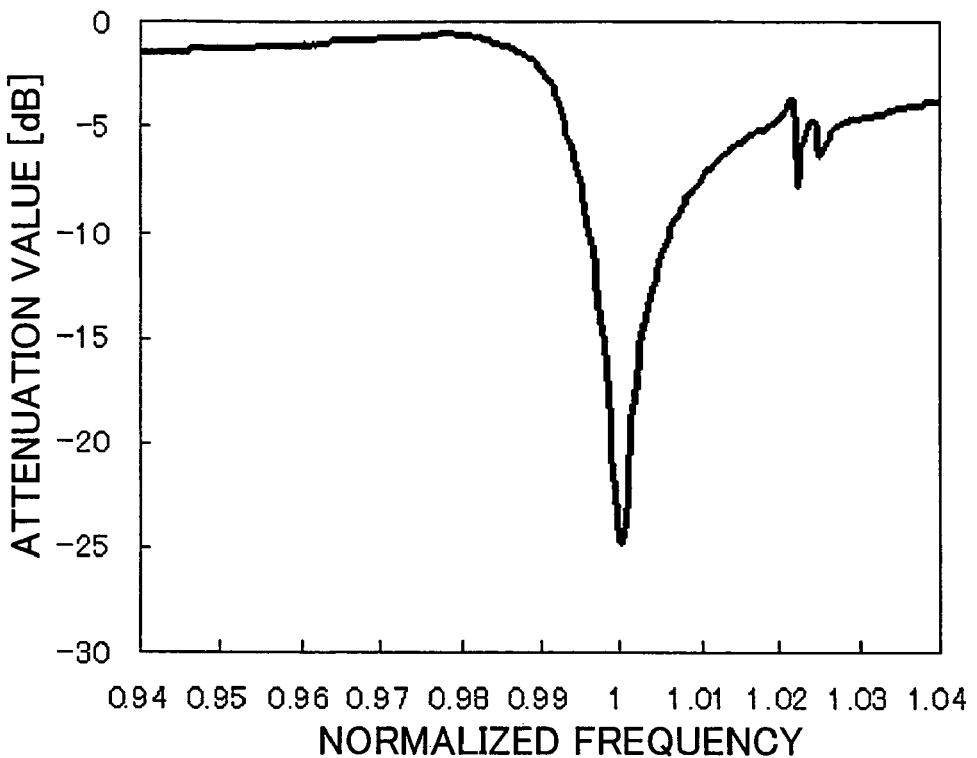
FIG. 4A is a graphical representation, showing an electrical characteristic of an SAW resonator according to the first embodiment of the present invention.
Figure 4B:
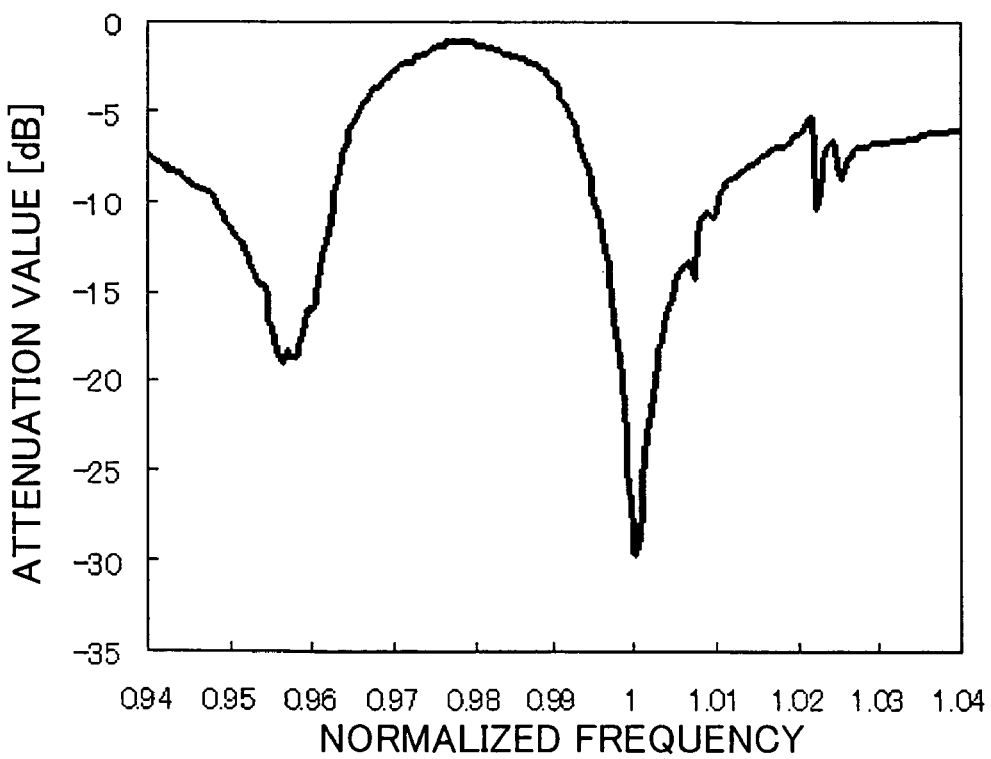
FIG. 4B is a graphical representation, showing an electrical characteristic of the SAW filter according to the first embodiment of the present invention.
Figure 5A:
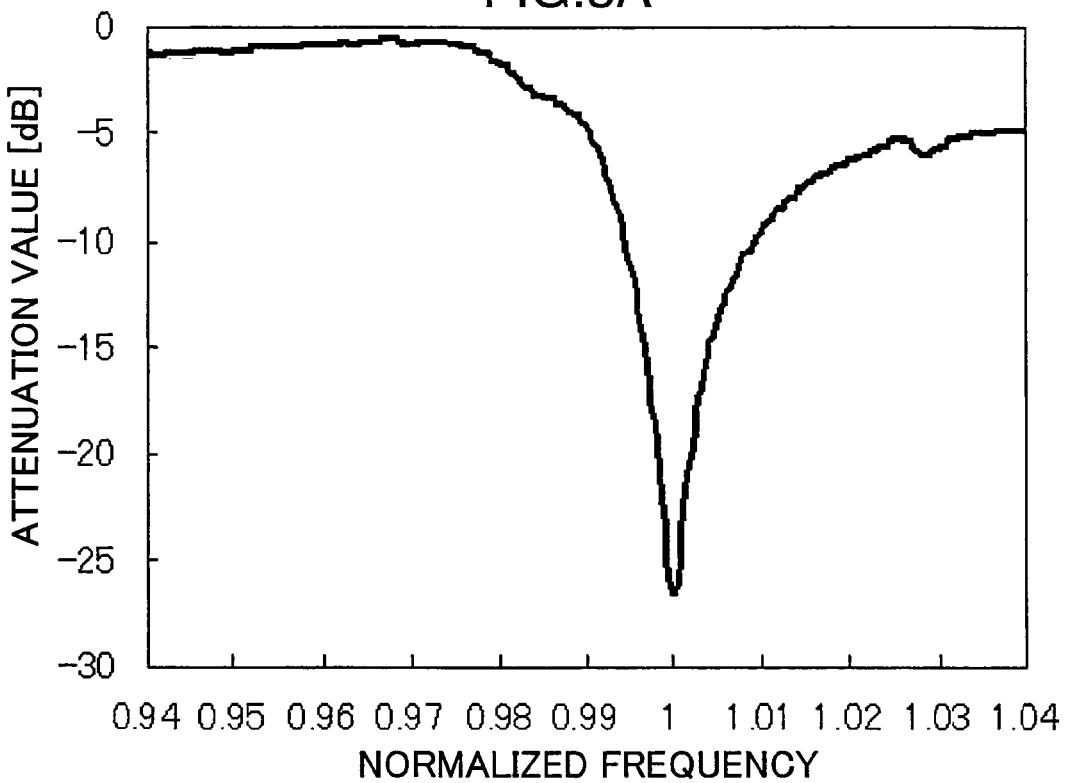
FIG. 5A is a graphical representation, showing an electrical characteristic of the SAW resonator according to the first embodiment of the present invention.
Figure 5B:
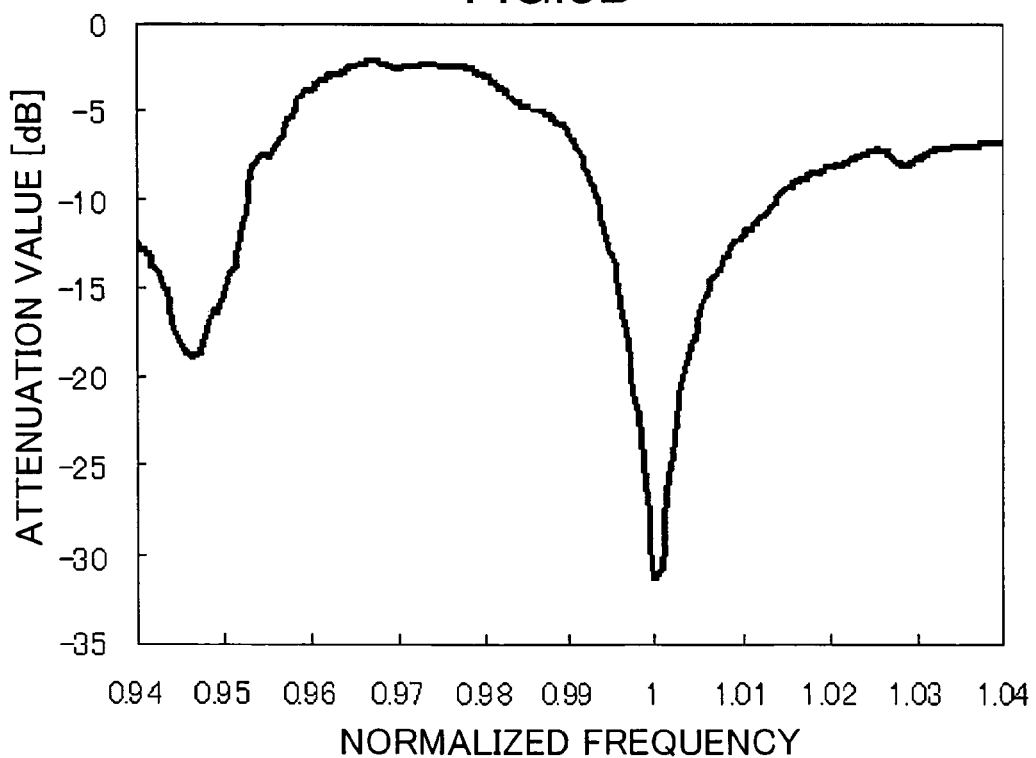
FIG. 5B is a graphical representation, showing an electrical characteristic of the SAW filter according to the first embodiment of the present invention.
Figure 6A:
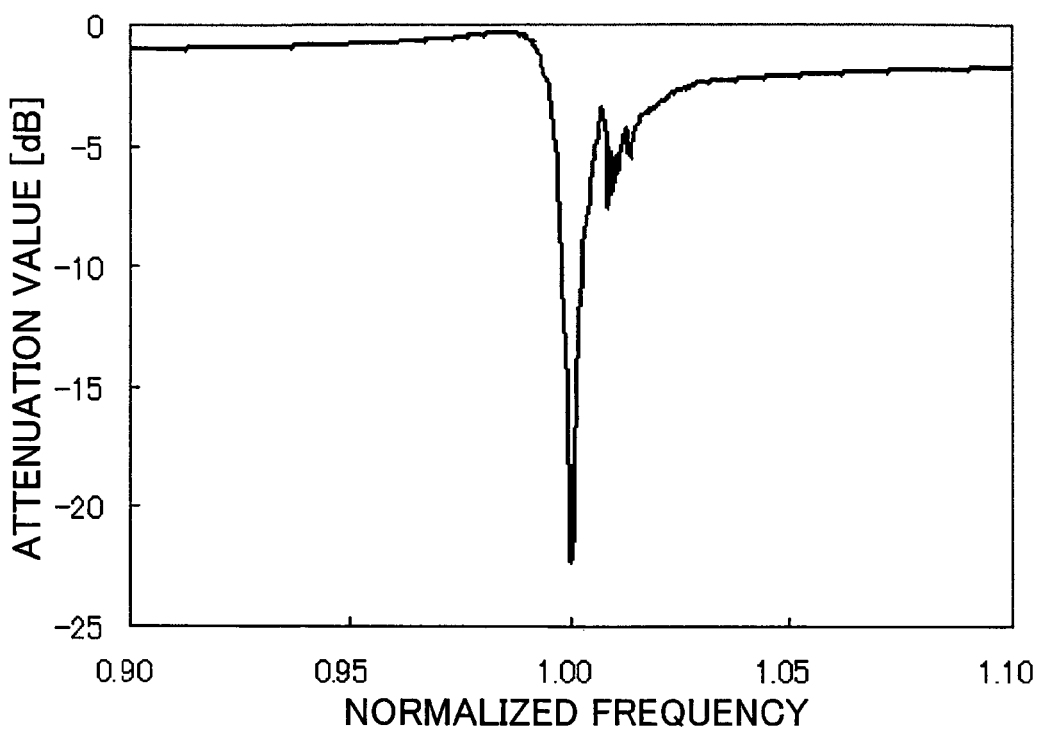
FIG. 6A is a graphical representation, showing an electrical characteristic of the SAW resonator according to the first embodiment of the present invention.
Figure 6B:
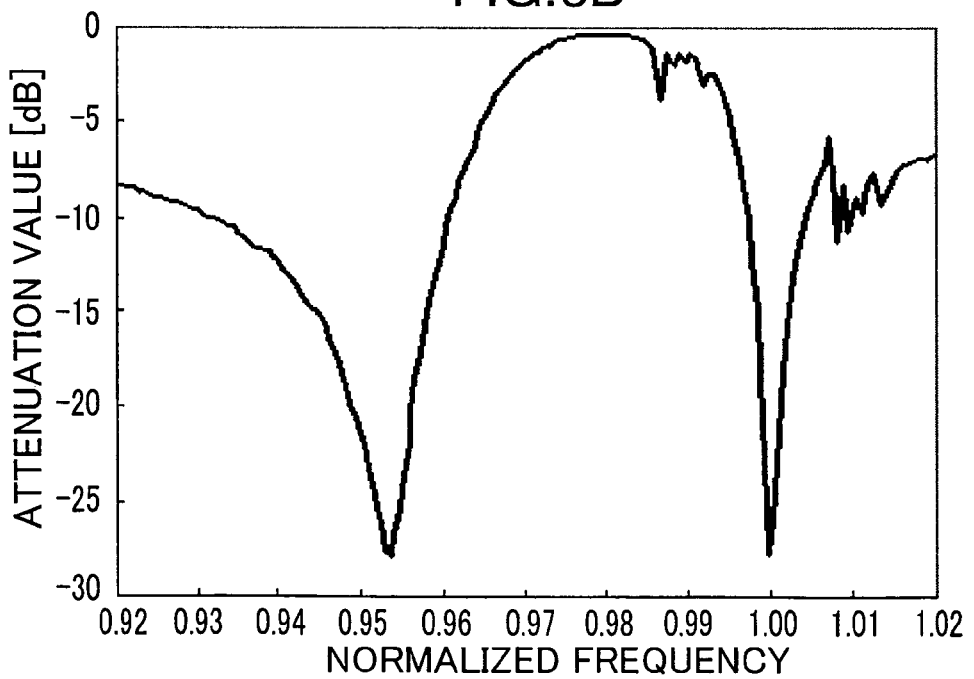
FIG. 6B is a graphical representation, showing an electrical characteristic of the SAW filter according to the first embodiment of the present invention.

FIG. 4A shows an electrical characteristic of the SAW resonator in the embodiment 1 according to the embodiments of the present invention. FIG. 4B shows an electrical characteristic of the SAW filter. In addition, FIG. 5A shows an electrical characteristic of the SAW resonator in the comparative example 1 and FIG. 5B shows an electrical characteristic of the SAW filter in the comparative example 1 FIG. 6A shows an electrical characteristic of the SAW resonator in the comparative example 2 and FIG. 6B shows an electrical characteristic of the SAW filter in the comparative example 2 Herein, with respect to the electrical characteristic, in order to take into account the frequency shift between the devices and clarify the distinction in characteristics between the devices, the characteristics of the resonators are normalized using an anti-resonant frequency. Besides, the SAW filter is normalized and shown, using an attenuation-pole frequency on the high-frequency side. Furthermore, a table 1 shows parameters on the structure in each embodiment and comparative example.

TABLE 1

|  | t2, h | h/(2p) | t1/(2p) | L1, p1 |
|---|---|---|---|---|
| Embodiment 1 | t2 ≦ h | 0.07 | 0.20 | L1 ≦ p1 |
| Comparative Example 1 | h < t2 | 0.07 | 0.20 | L1 ≦ p1 |
| Comparative Example 2 | t2 ≦ h | 0.04 | 0.20 | L1 ≦ p1 |

From the characteristic of the SAW resonator shown in FIG. 4A, FIG. 5A and FIG. 6A, it can be seen that the SAW resonator of the embodiment 1 and the comparative example 2 which is t2≦h (herein, the correlations of L≈p, p1+p2=p, L1+L2=L, L1≦p1 and L2≧p2 are satisfied) has a great attenuation value and has a steep characteristic. In addition, in the SAW resonator of the embodiment 1 and the comparative example 1 where the normalized film thickness of the electrode is 7%, the spuriousness which is generated on the high-frequency side of the anti-resonant frequency is apart from the anti-resonant frequency. In contrast, in the SAW resonator of the comparative example 2 where the normalized film thickness of the electrode is 4%, this spuriousness which is generated on the high-frequency side of the anti-resonant frequency is closer to the anti-resonant frequency. Similarly, if the characteristics of the SAW filter are compared, the SAW filter of the embodiment 1 and the comparative example 2 which is t2≦h (herein, the correlations of L≈p, p1+p2=p, L1+L2=L, L1≦p1 and L2≧p2 are satisfied) has a steep skirt characteristic. However, in the SAW filter where the normalized film thickness of the electrode is 4% in the comparative example 2 which is shown in FIG. 6B, a ripple which is caused by a ripple of the resonator is generated in the band. On the other hand, in the SAW filter of the embodiment 1 and the comparative example 1 where the film thickness of the electrode is 7%, there is a ripple out of the band. Hence, no unnecessary ripple is generated within the band.

Therefore, in the filter which is obtained by connecting SAW resonators so that they are shaped like a ladder with several steps, unless a ripple which is generated on the higher-frequency side than the anti-resonant frequency of the SAW resonator which configures the filter appears as a ripple within the filter band, in order to realize a steep filter skirt characteristic and obtain a high suppression level with a small loss, the shape of SiO2 of the SAW resonator which configures the filter should satisfy t2≦h (herein, the correlations of L≈p, p1+p2=p, L1+L2=L, L1≦p1 and L2≧p2 are satisfied). This is found out by the inventors.

Furthermore, from these embodiment and comparative examples, it can be seen that in the SAW resonator, the difference in frequency between the frequency at which a ripple generated on the higher-frequency side than the anti-resonant frequency is generated and the anti-resonant frequency depends upon the film thickness of an electrode and the structure of an SiO2 film. Therefore, in order to check how thick a desirable electrode film should be if the structure of SiO2 satisfies t2≦h (herein, the correlations of L≈p, p1+p2=p, L1+L2=L, L1≦p1 and L2≧p2 are satisfied), the inventors further create an SAW resonator in the case where the electrode normalized film thickness h/(2×p) is 3, 5, 7, 10% and the SiO2 normalized film thickness t1/(2×p) is 10, 15, 20%. Then, they examine its correlation with a ripple generation frequency. FIG. 7 shows the results. Herein, as the structure of SiO2, they create the one in the state of t≈t1 where the ripple of the resonator is likely to come closest to the anti-resonant frequency.

Herein, the correlation between the generation frequency of a ripple of the resonator and the characteristic of the filter will be considered, using the simplest reverse-L-shaped ladder-type filter shown in FIG. 8. In FIG. 8, reference numeral 80 designates the configuration of the filter; 81, a filter characteristic; 82, an SAW resonator which is disposed in a parallel arm; 83, an SAW resonator which is disposed in a series arm; 82a, an admittance characteristic of the SAW resonator which is disposed in a parallel arm; and 83a, an admittance characteristic of the SAW resonator which is disposed in a series arm. The area of reference numeral 86 shows the passing band of the filter. In the ladder-type SAW filter, the parallel resonance frequency the resonator of the series arm and the resonance frequency of the series arm are set substantially in the middle of the band. On the low-frequency side of the band, the characteristic of the resonator 83 of the series arm is dominant, and on the high-frequency side of the band, the characteristic of the parallel arm 82 is dominant. Therefore, in order to prevent a ripple which is generated on the higher-frequency side than the anti-resonant frequency of the SAW resonator from affecting the passing band of the filter, a ripple which is generated in the resonator of the series arm needs to be hindered from coming into the band of the filter. Hence, in this case, among the SAW resonators which configure the filter, in terms of the generation frequency of a ripple in the SAW resonator of the series arm resonator of the series arm, (the generation frequency of a ripple—the anti-resonant frequency) needs to be equal to, or more than, (the passing band of the filter/2). Taking into account the fact that a passing band which is required for an ordinary mobile-communication filter is approximately 0.3 to 0.4 in a specific passing band, the target value of (the generation frequency of a ripple—the anti-resonant frequency) is 0.15 or more. Thus, from FIG. 7, it can be seen that the normalized film thickness of the electrode should preferably be 5% or higher.

As described so far, in the filter which is obtained by connecting SAW resonators so that they are shaped like a ladder with several steps, unless a ripple which is generated on the higher-frequency side than the anti-resonant frequency of the SAW resonator which configures the filter appears as a ripple within the filter band, in order to realize a steep filter skirt characteristic and obtain a high suppression level with a small loss, the shape of SiO2 of the SAW resonator which configures the filter should satisfy t2≦h (herein, the correlations of L≈p, p1+p2=p, L1+L2=L, L1≦p1 and L2≧p2 are satisfied). Especially, it is preferable that the normalized film thickness h/(2×p) of the electrode be 0.05 or more. This is found out by the inventors.

In this first embodiment, the SiO2 film is used as the protective film. However, the protective film is not limited to this. Even if another dielectric film such as SiN, SiON and Ta2O5 is used, needless to say, the same advantages can be obtained, as long as its shape meets the above described conditions. In addition, in the first embodiment, the 36° LT is used as the substrate. However, the substrate is not limited to this. In an SAW device where LT which is cut out at another angle, or another piezo-electric substrate of, for example, LiNbO3, LiB2O3, KnbO3, or the like, is used, or in an SAW device where an electrode is formed on a piezo-electric film, in the case where a protective film is formed on its surface, needless to say, the same advantages can be obtained, as long as its shape meets the above described conditions.

Besides, as the method of obtaining such a shape, in this first embodiment, bias sputtering is used, but it is not limited to this method.

Second Embodiment

Hereinafter, an SAW device according to a second embodiment of the present invention will be described with reference to the drawings.

Figure 9:
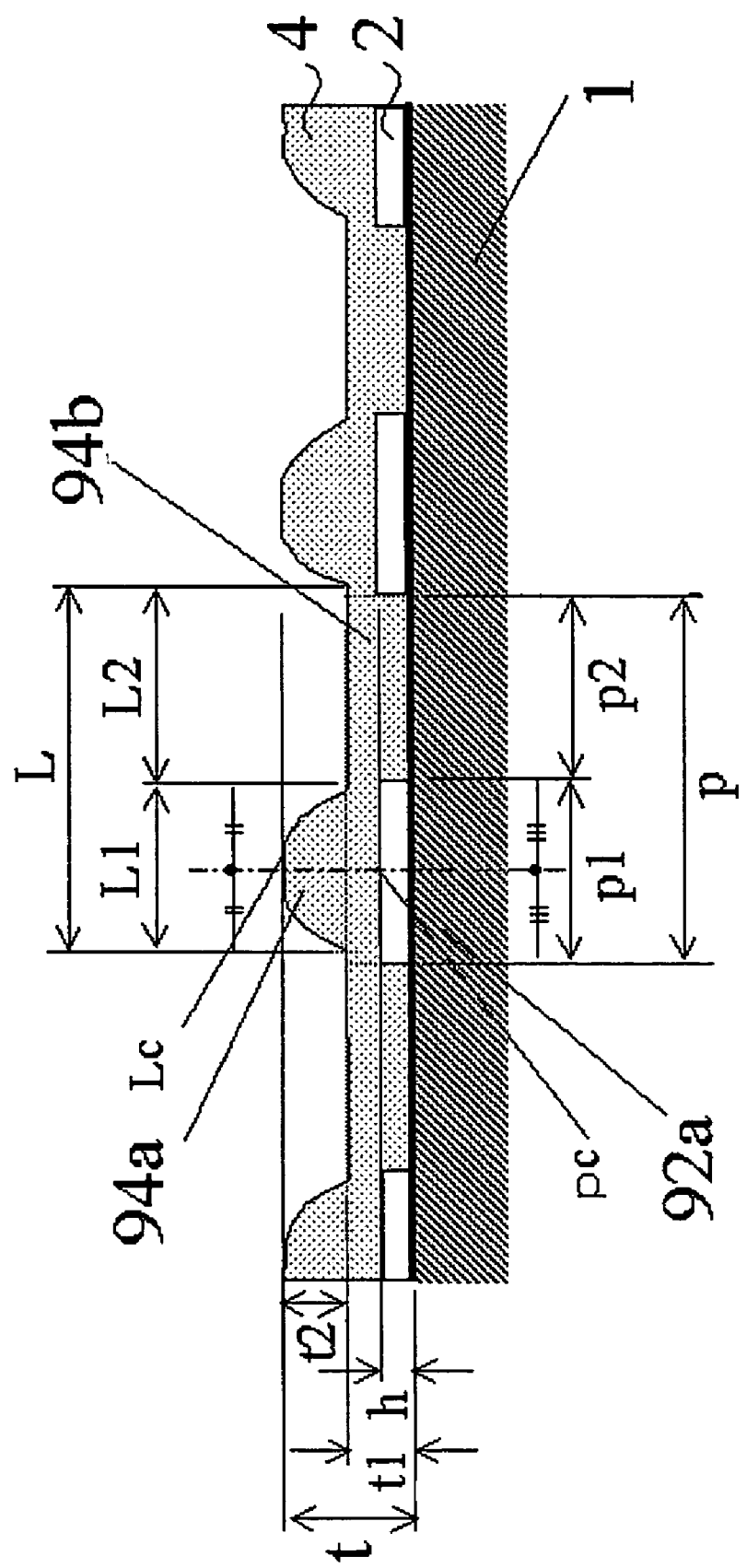
FIG. 9 is a sectional view of an electronic part according to a second embodiment of the present invention.

In this second embodiment, the same SAW device is used as that according to the first embodiment. FIG. 9 is a sectional view of the SAW device according to the second embodiment of the present invention. In this figure, the same configurations are given their identical reference numeral and character as those of FIG. 1B used in the first embodiment. Thus, their description is omitted.

The protective film 4 is preferably made of SiO2, and as shown in FIG. 9, its top surface has an uneven shape. A convex portion 94a of the protective film 4 is provided over the part where the comb-type electrode 2 is disposed on the upper surface of the substrate 1. On the other hand, a concave portion 94b of the protective film 4 is provided, in the part where no comb-type electrode 2 is disposed on the upper surface of the substrate 1 between the convex portions 94a, and in its vicinity.

Herein, the height from the surface of the substrate 1 which is in contact with the protective film 4 to the top part of the convex portion 94a of the protective film 4 is t, the height from the surface of the substrate 1 which is in contact with the protective film 4 to the bottom part of the concave portion 94b of the protective film 4 is t1, and the height (t-t1) from the bottom part of the concave portion 94b of the protective film 4 to the top part of the convex portion 94a of the protective film 4 is t2.

Besides, one convex portion 94a and one concave portion 94b of the protective film 4 are one pitch, the pitch width of one pitch is L, the width of the convex portion 94a of the protective film 4 is L1, and the width of the concave portion 94b of the protective film 4 is L2 (herein, L=L1+L2 is satisfied).

This second embodiment is different from FIG. 1B according to the first embodiment in the following respect. In FIG. 1B of the first embodiment, the height t2 from the bottom part of the concave portion 4b of the protective film 4 to the top part of the convex portion 4a is equal to, or less than, the height h of the comb-type electrode 2. In contrast, in FIG. 9 of the second embodiment, the height t2 from the bottom part of the concave portion 34b of the protective film 34 to the top part of the convex portion 34a is equal to, or more than, the height h of the comb-type electrode 2.

According to the second embodiment of the present invention, the following correlation is satisfied, $$h \leq t2$$

(herein, the correlations of L≈p, p1+p2=p, L1+L2=L, L1≦p1 and L2≧p2 are satisfied).

As the method of obtaining the shape which satisfies this correlation, its production method will be described below with reference to the drawings. In this figure, the same materials and configurations are given their identical reference numeral and character as those of FIG. 2 used in the first embodiment. Thus, their description is omitted.

FIG. 10A to FIG. 10I are each a sectional view of the SAW device according to the second embodiment of the present invention, showing its production method.

First, as shown in FIG. 10A, using a method such as vapor deposition and sputtering, an electrode film 22 as a comb-type electrode or/and a reflector which is made of Al or an Al alloy is formed on the upper surface of an LT substrate 21.

Next, as shown in FIG. 10B, using a method such as vapor deposition and sputtering, a part 24a of the protective film 24 is formed.

Next, as shown in FIG. 10C, a resist film 23 is formed on the upper surface of the electrode film 22.

Next, as shown in FIG. 10D, using an exposure-development technique or the like, the resist film 23 is processed so as to turn into a desirable shape.

Next, as shown in FIG. 10E, using a dry-etching technique or the like, the electrode film 22, the protective film 24a are processed so as to turn into the desirable shape, such as a comb-type electrode and a reflector, and thereafter, the resist film 23 is removed. At this time, the etching of SiO2 and the etching of the electrode film are executed by changing the etching gas midway from fluorine-system gas to chlorine-system gas.

Next, as shown in FIG. 10F, using a method such as vapor deposition and sputtering, the protective film 24 is made of SiO2 so as to cover the electrode film 22 and the protective film 24a. At this point of time, the protective film 24a becomes a part of the protective film 24.

Next, further, as shown in FIG. 10G, a resist film 25 is formed on the surface of the protective film 24.

Next, as shown in FIG. 10H, using a technique such as exposure and development, the resist film 25 is processed so as to turn into a desirable shape.

Next, as shown in FIG. 10I, using a dry-etching technique or the like, a protective film which is the part unnecessary for the protective film 24, such as a pad 26 for taking out an electrical signal, is removed, and thereafter, the resist film 25 is removed.

Finally, using dicing, it is divided into pieces, and thereafter, mounted in a ceramic package using die bonding or the like. After wire bonding, a lid is welded to execute a hermetic seal.

According to this second embodiment, in such a way as the shape satisfies the correlations of L≈p, p1+p2=p, L1+L2=L, L1≦p1 and L2≧p2, the formation of the SiO2 film of FIG. 10F is executed by applying an RF bias on the substrate side and forming a film, or using a so-called bias-sputtering method. is used.

This second embodiment takes into account how the height t2 from the top part of the convex portion of the protective film to the bottom part of the concave portion of this protective film should be correlated to the film thickness h of the electrode. Thereby, even if the protective film is formed, it can be seen that good characteristics can be obtained. In addition to the comparative example 2 which is created by the production method shown in FIG. 10A to FIG. 10I, a comparative example 3 in which an SiO2 film is not formed, and a comparative example 4 which is created by the production method shown in FIG. 2A to FIG. 2H and by bias sputtering in FIG. 2E, are described. With respect to these three kinds of SAW devices, electrical characteristics are measured.

Herein, in this second embodiment, the normalized film thickness h/(2×p) of the electrode of each SAW device is 4%, and the normalized film thickness of the SiO2 normalized film thickness t1/(2×p) is 20%.

Figure 11A:
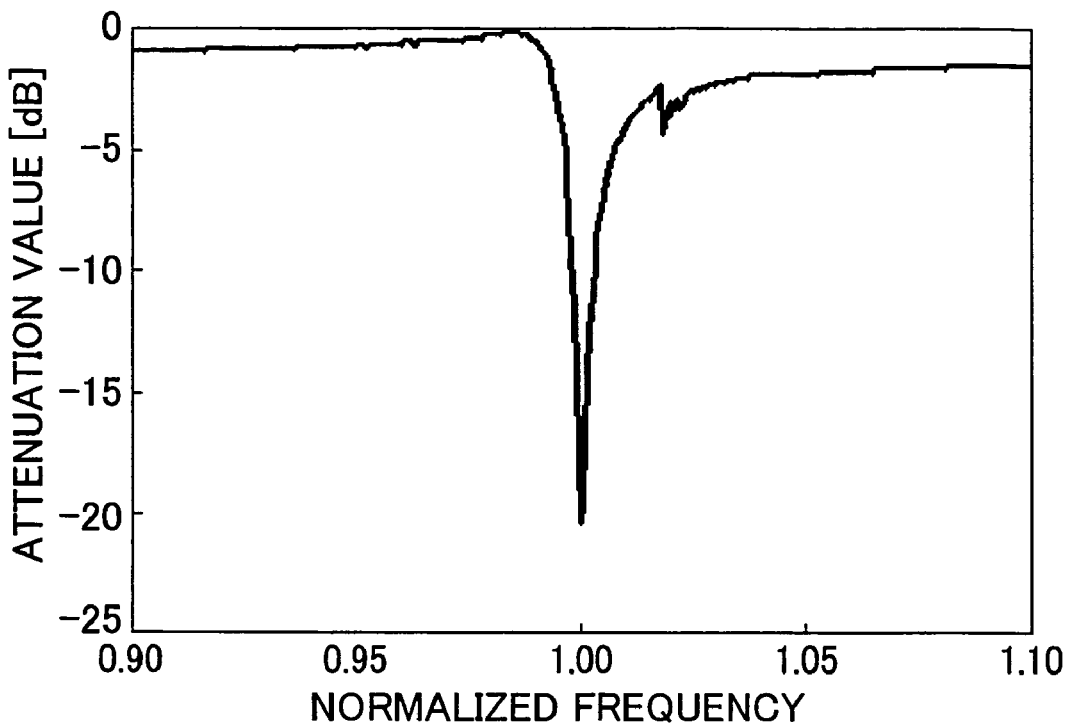
FIG. 11A is a graphical representation, showing an electrical characteristic of an SAW resonator according to the second embodiment of the present invention.
Figure 11B:
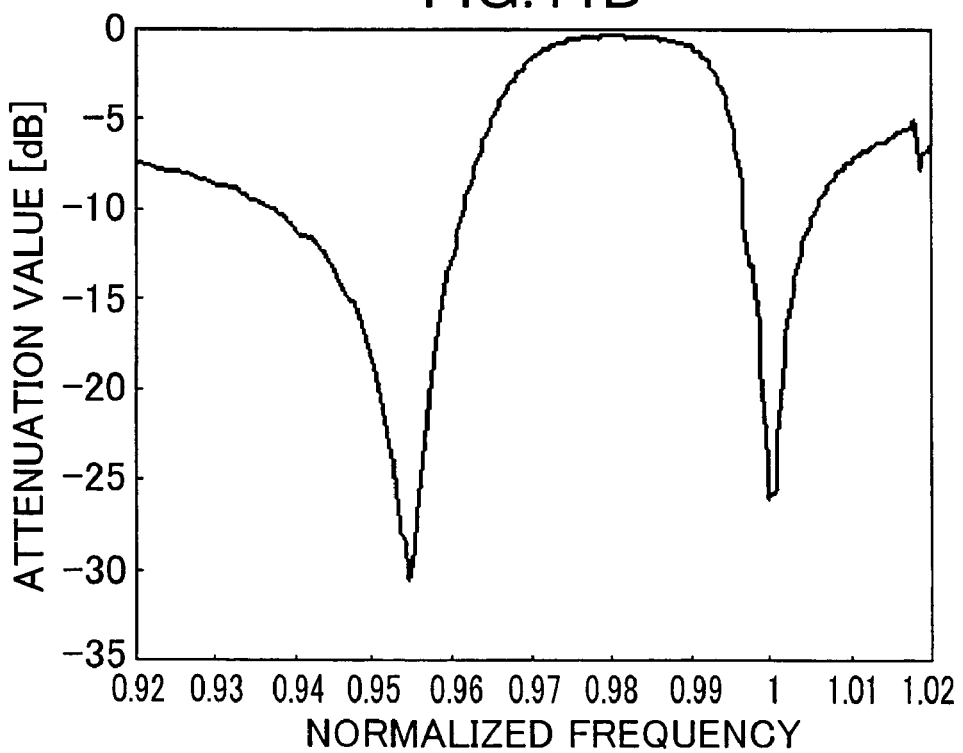
FIG. 11B is a graphical representation, showing an electrical characteristic of an SAW filter according to the second embodiment of the present invention.
Figure 12A:
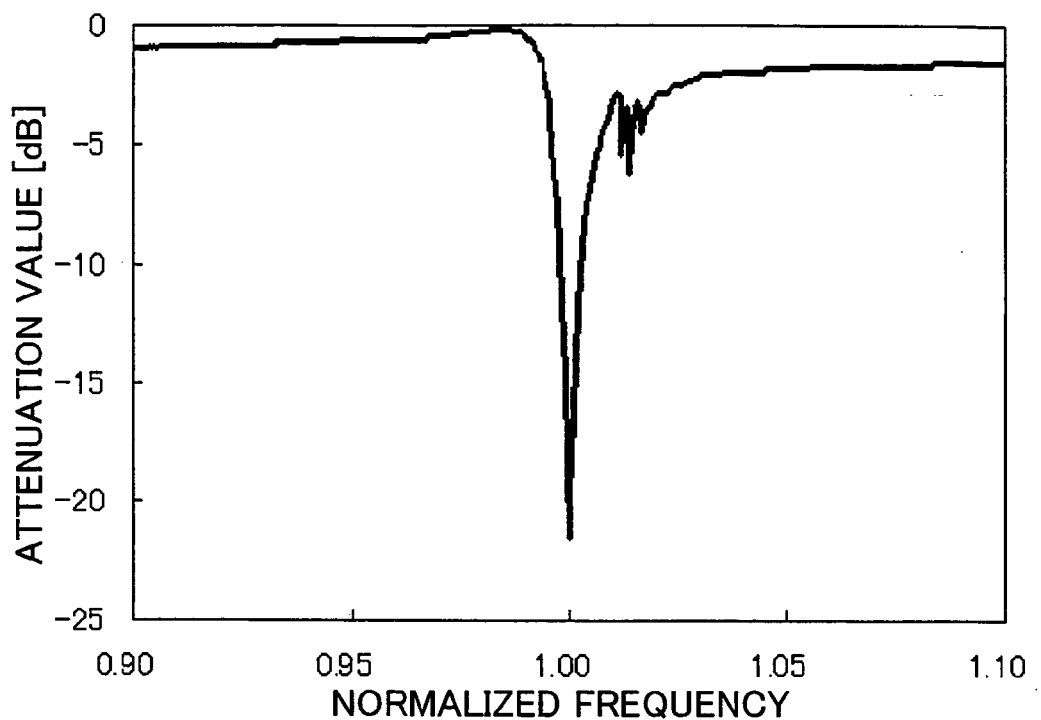
FIG. 12A is a graphical representation, showing an electrical characteristic of the SAW resonator according to the second embodiment of the present invention.
Figure 12B:
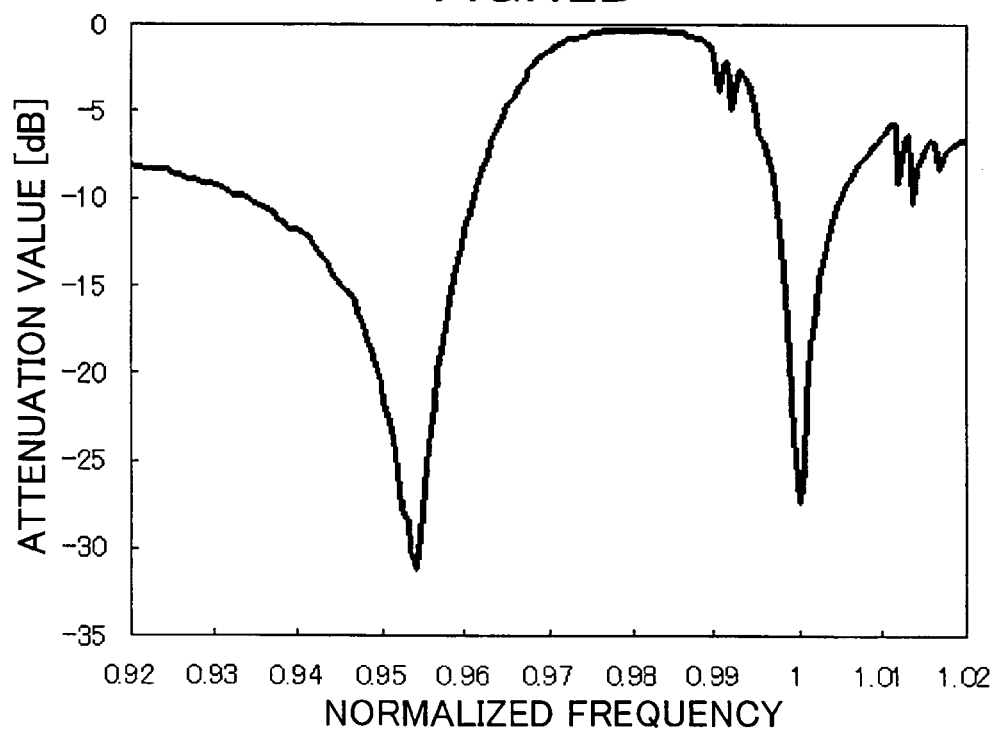
FIG. 12B is a graphical representation, showing an electrical characteristic of the SAW filter according to the second embodiment of the present invention.
Figure 13A:
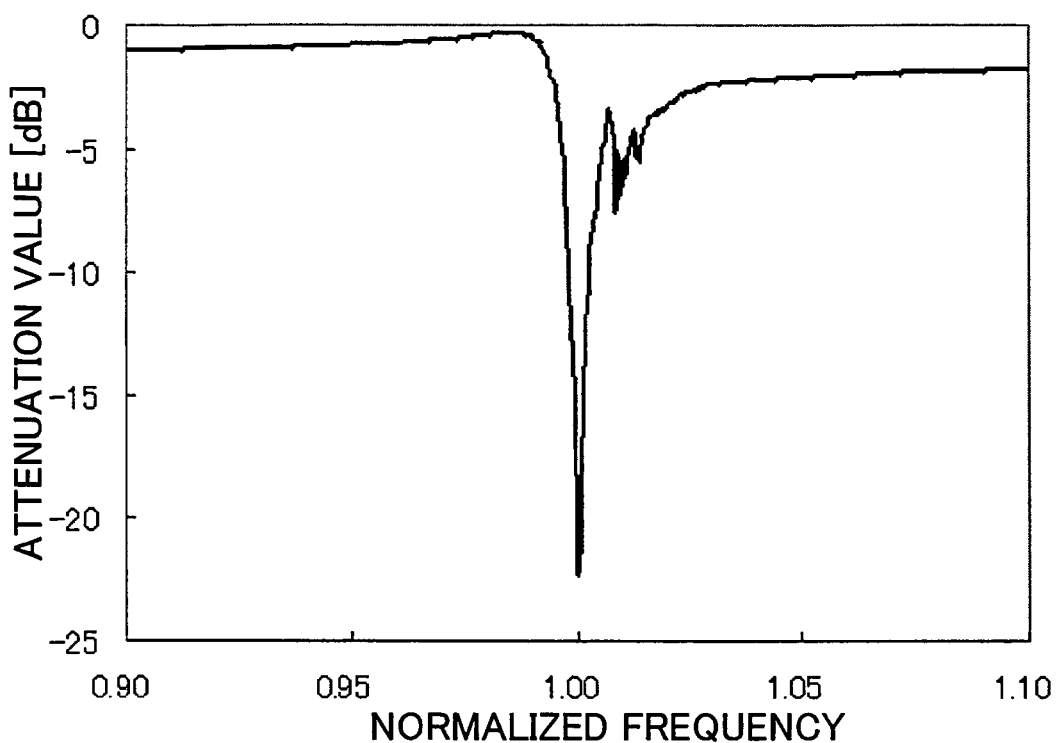
FIG. 13A is a graphical representation, showing an electrical characteristic of the SAW resonator according to the second embodiment of the present invention.
Figure 13B:
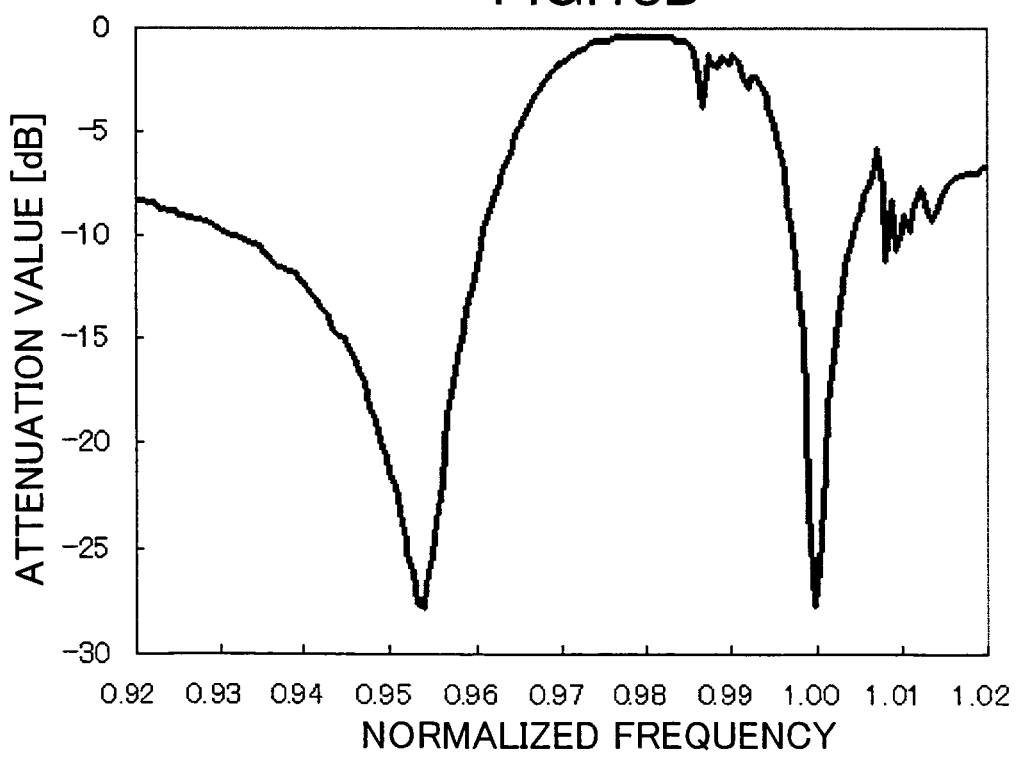
FIG. 13B is a graphical representation, showing an electrical characteristic of the SAW filter according to the second embodiment of the present invention.

FIG. 11A shows an electrical characteristic of the SAW resonator in the embodiment 2 according to the embodiments of the present invention. FIG. 11B shows an electrical characteristic of the SAW filter according to the embodiment 2. In addition, FIG. 12A shows an electrical characteristic of the SAW resonator in the comparative example 3 and FIG. 12B shows an electrical characteristic of the SAW filter in the comparative example 3. FIG. 13A shows an electrical characteristic of the SAW resonator in the comparative example 4 and FIG. 13B shows an electrical characteristic of the SAW filter in the comparative example 4. The SAW resonator used in this second embodiment is an SAW resonator which has the same configuration as FIG. 1A. The SAW filter has the configuration shown in FIG. 3. In FIG. 11A to FIG. 13B, with respect to the electrical characteristics, in order to take into account the frequency shift between the devices and clarify the distinction in characteristics between the devices, the characteristics of the resonators are normalized using an anti-resonant frequency. Besides, the SAW filter is normalized and shown, using an attenuation-pole frequency on the high-frequency side. Furthermore, a table 2 shows parameters on the structure in these embodiment and comparative examples.

TABLE 2

|  | t2, h | h/(2p) | t1/(2p) | L1, p1 |
|---|---|---|---|---|
| Embodiment 2 | h ≦ t2 | 0.04 | 0.20 | L1 ≦ p1 |
| Comparative Example 3 | h ≦ t2 | 0.04 | — | — |
| Comparative Example 4 | t2 < h | 0.04 | 0.20 | L1 ≦ p1 |

As can be seen from FIG. 12A, with respect to the SAW device used in this second embodiment, the normalized film thickness of its electrode film is thin at 4%. Even if there is no SiO2, a ripple which is generated on the high-frequency side of the anti-resonant frequency is generated at a place relatively near the anti-resonant frequency. In addition, if the comparative example 3 of FIG. 12A is compared with the characteristics of the SAW resonator of the comparative example 4 of FIG. 13A, as the SiO2 film is formed, a ripple which is generated on the high-frequency side of the anti-resonant frequency comes closer to the side of the anti-resonant frequency. Therefore, in the characteristics of the SAW filter which is configured using the resonator of the comparative example 3 in which no SiO2 film is formed which is shown in FIG. 12B, the ripple which is barely out of the passing band is generated within the passing band, as shown in FIG. 13B in the comparative example 4. In contrast, in the embodiment 2, reversely, it can be seen from FIG. 11A that the ripple is shifted on the high-frequency side. This is because it is h≦t2, and thus, the SiO2 which is formed on the electrode makes the film thickness of the electrode apparently thicker. Consequently, in the SAW filter which is configured by the SAW resonator of FIG. 11A which is shown in FIG. 11B, no ripple is generated within the passing band.

As described so far, in the filter which is obtained by connecting SAW resonators so that they are shaped like a ladder with several steps, as one method of preventing a ripple which is generated on the higher-frequency side than the anti-resonant frequency of the SAW resonator which configures the filter from appearing as a ripple within the filter band, the shape of SiO2 of the SAW resonator which configures the filter should satisfy t2≦h (herein, the correlations of L≈p, p1+p2=p, L1+L2=L, L1≦p1 and L2≧p2 are satisfied). This is found out by the inventors. Especially, since a reflection coefficient is largely affected by the film thickness of the electrode, this is effective if the electrode film thickness is thin, particularly, based on the examination of FIG. 7 in the first embodiment, if a resonator whose electrode film thickness is 5% or less is used.

Third Embodiment

Figure 14:
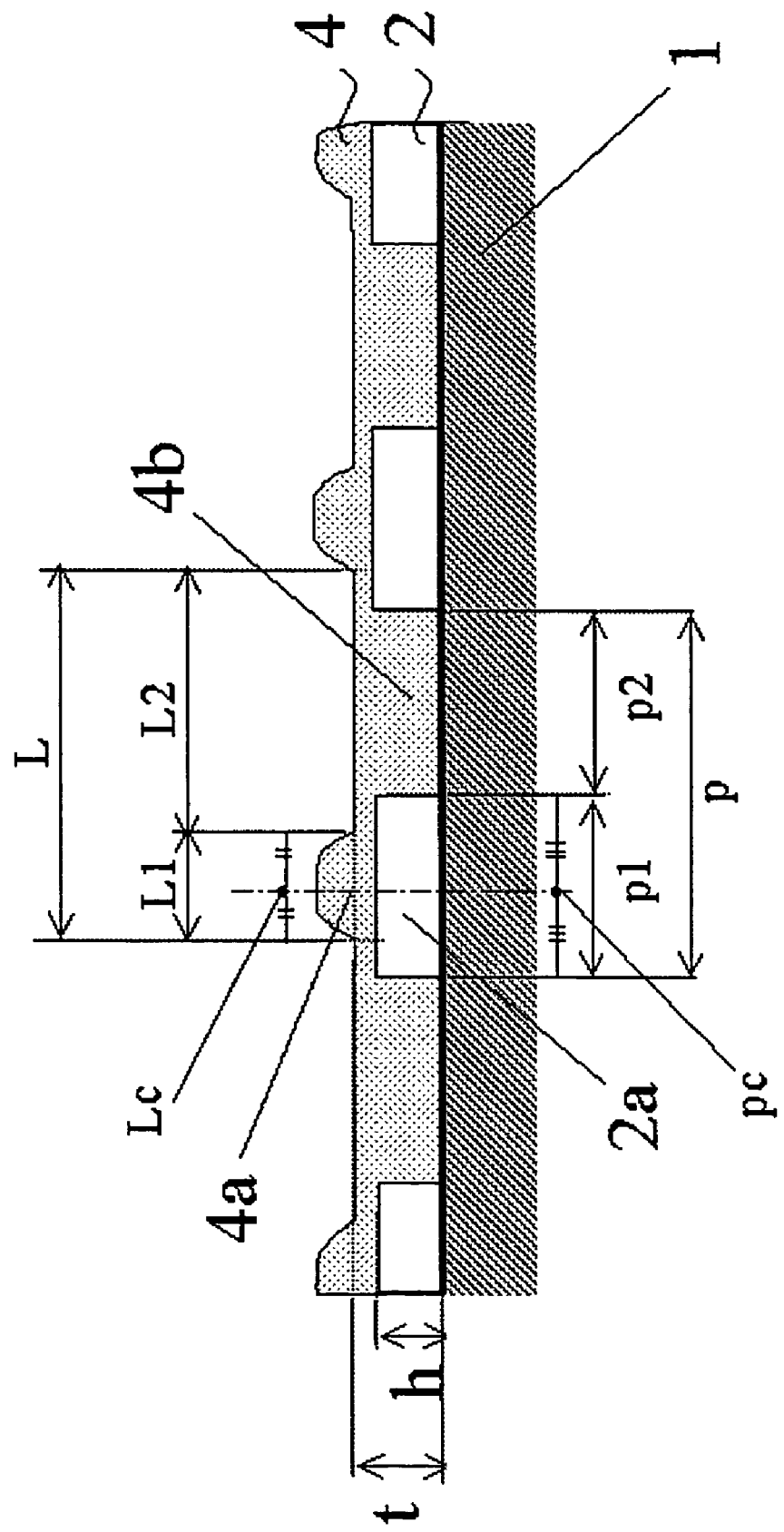
FIG. 14 is a sectional view of an electronic part according to a third embodiment of the present invention.

FIG. 14 is a sectional view of an SAW device as the electronic part according to a third embodiment of the present invention. Its top view is identical to FIG. 1A.

As shown in FIG. 1A and FIG. 14, the SAW device according to this third embodiment includes a comb-type electrode 2 on the upper surface of a substrate 1, a reflector 3 on both sides of this comb-type electrode 2, and a protective film 4 which covers at least these comb-type electrode 2 and reflector 3. In addition, the comb-type electrode 2 is provided with a pad 5 for taking out an electric signal which is electrically connected to the comb-type electrode 2. Thereby, the SAW device is configured.

The substrate 1 is made of lithium tantalate which is cut out of a Y-sheet that is turned by several degrees around the X-axis in the Z-axis direction. It is a 36° YLT substrate which is obtained at a turning angle of 36°.

The comb-type electrode 2 is made of aluminum (hereinafter, referred to as "Al"), or an aluminum alloy.

The protective film 4 is preferably made of silicon dioxide (hereinafter, referred to as "SiO2"), or an aluminum alloy. As shown in FIG. 14, an uneven shape is formed at its upper surface. A convex portion 4a of the protective film 4 is provided over the part where the comb-type electrode 2 is disposed on the upper surface of the substrate 1. On the other hand, a concave portion 4b of the protective film 4 is provided, in the part where no comb-type electrode 2 is disposed on the upper surface of the substrate 1 between the convex portions 4a, and in its vicinity.

Herein, one convex portion 4a and one concave portion 4b of the protective film 4 are one pitch, the pitch width of one pitch is L, the width of the convex portion 4a of the protective film 4 is L1, and the width of the concave portion 4b of the protective film 4 is L2 (herein, L=L1+L2 is satisfied). Further, in the same way as one pitch of the protective film 4, the width of one pitch of the comb-type electrode 2 from one electrode finger 2a of the comb-type electrode 2 to the part in which the adjacent electrode finger 2a is disposed on one side is p. Moreover, the width of each electrode finger is p1, the width between the adjacent electrode fingers is p2 (herein, p=p1+p2 is satisfied). In addition, the ratio L1/L of the width L1 of one pitch of the convex portion of the unevenness in the uneven shape of the protective film to the pitch width L of one pitch of the protective film is η and the ratio p1/p of the width p1 of each electrode finger which configures the comb-type electrode to the pitch width p of one pitch of the comb-type electrode is η.

In addition, the height from the surface of the substrate 1 which is in contact with the protective film 4 to the concave portion 4b of the protective film 4 is t, and the thickness of the comb-type electrode 2 (i.e., the height from the surface of the substrate 1 to the top surface of the comb-type electrode 2) is h.

A manufacturing method for the SAW device according to the third embodiment of the present invention is the same as that of FIG. 2A to FIG. 2H, and thus, its description is omitted.

According to the third embodiment of the present invention, the shape of the electrode and the SiO2 film satisfies, $L1 \leq p1$ and $L2 \geq p2$ (herein, the correlations of L≈p, p1+p2=p and L1+pL2=L are satisfied).

As the method of obtaining the shape which satisfies this correlation, a so-called bias-sputtering method is used. This is the method of applying a bias on the substrate side and forming a film by sputtering in the formation of the SiO2 film of FIG. 2E which shows the production method. In that case, in order to control the shape of the SiO2 film, it is executed by changing the ratio of the bias which is applied on the substrate to the sputtering power.

This third embodiment takes into account the shape of the SiO2 film, so that even if the protective film is formed, it can be seen that good characteristics can be obtained. The following six kinds of SAW devices are created (embodiments 3 to 5 and comparative examples 5 to 7). The comparative example 5 is an ordinary SAW device in which no SiO2 film is formed. The comparative example 6 is an SAW device in which an ordinary sputtering (i.e., a bias is not applied on the substrate side) is used in the formation of an SiO2 film. The comparative example 7 is the one in which a bias sputtering is used in forming an SiO2 film, but the SiO2 film is formed so that L1≦p1 and L2≧p2 can be satisfied by changing the ratio of a bias which is applied on the substrate to a sputtering power. Herein, in this third embodiment, the normalized film thickness h/(2×p) of the electrode in all the embodiments and comparative examples is 4%, and the normalized film thickness t/(2×p) of the SiO2 film is 20%. FIG. 15A to FIG. 15E each show a sectional shape in the embodiments 3 to 5 and the comparative examples 6, 7. FIG. 16 shows electrical characteristics. In addition, a table 3 shows a minimum insertion loss and an attenuation value at an anti-resonance point (or a maximum attenuation value), and the difference in frequency (Δf) between a resonance frequency and an anti-resonant frequency which is an index of steepness and the ratio η/η' of η to η' which is measured from the section of each SAW device shown in FIG. 15A to FIG. 15E, in each embodiment and comparative example shown in FIG. 16.

TABLE 3

| | Δf | Minimum Insertion Loss | Maximum Attenuation Value | η'/η |
|---|---|---|---|---|
| Comparative Example 5 | 3.41 | −0.42 | −26.50 | — |
| Embodiment 3 | 2.82 | −0.44 | −24.74 | 0.82 |
| Embodiment 4 | 2.71 | −0.46 | −26.28 | 0.59 |
| Embodiment 5 | 2.67 | −0.42 | −27.12 | 0.47 |
| Comparative Example 6 | 2.44 | −0.51 | −19.13 | 1.57 |
| Comparative Example 7 | 2.82 | −0.42 | −21.37 | 1.12 |

In FIG. 16 and the table 3, it can be seen that in the comparative examples 6, 7 where the shape of the SiO2 film does not satisfy the correlations of [L1≦p1 and L2≧p2 (herein, the correlations of L≈p, p1+p2=p and L1+pL2=L are satisfied)], compared with the attenuation value of the comparative example 5, the attenuation value of the anti-resonant frequency is approximately −20 dB and is largely degraded in the formation of the SiO2 film. In contrast, in the embodiments 3, 4, 5 where the shape of the SiO2 film satisfies the above described correlations, the attenuation value in the anti-resonant frequency is approximately −25 dB or more and is as great as that of the comparative example 5. Particularly, if the embodiments 3, 4, 5 are compared, they become steeper and greater in the attenuation value in the order of the embodiments 3, 4, 5. Besides, in the embodiments 4, 5, the attenuation value is −26 dB or more and is substantially equal to that before the SiO2 film is formed.

Figure 17:
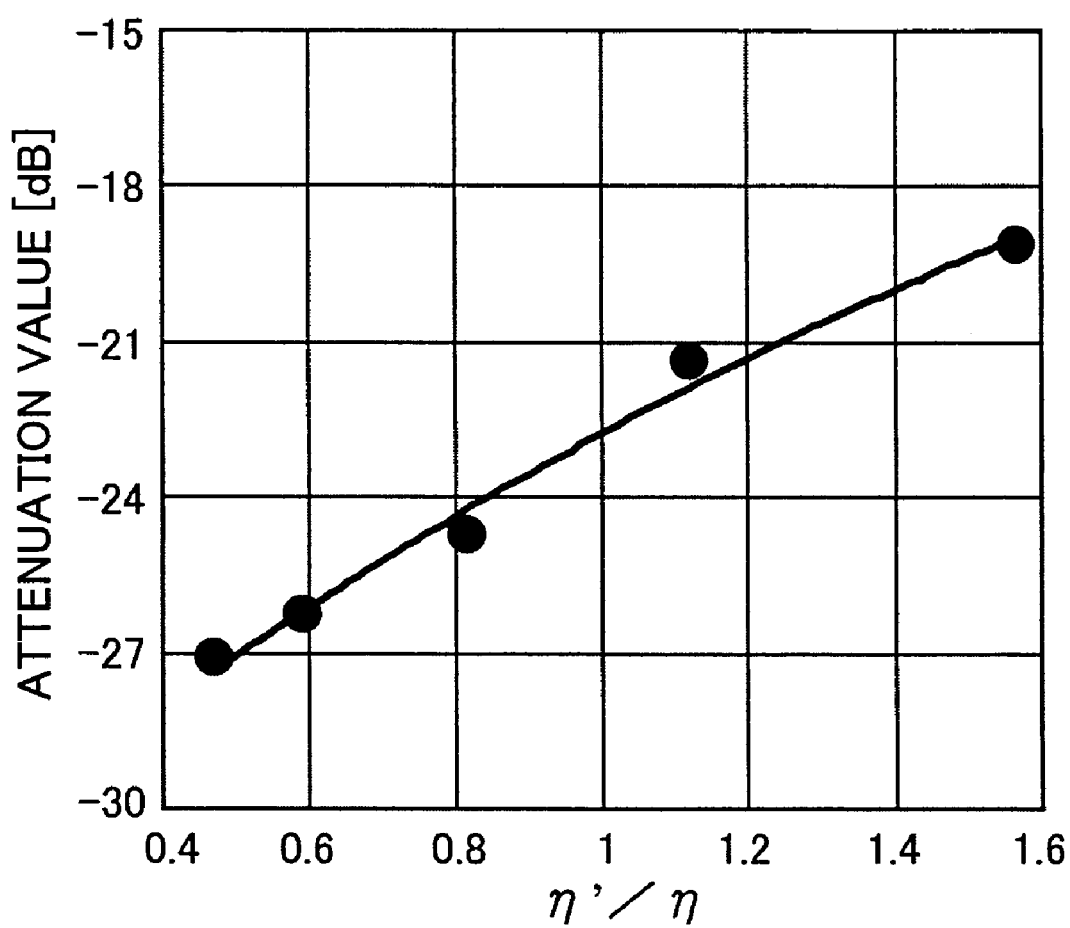
FIG. 17 is a graphical representation, showing the correlation between the structure of the electronic part and an electrical characteristic thereof according to the third embodiment of the present invention.

FIG. 17 is a graphical representation, showing the correlation between the maximum attenuation value and η'/η. From this graph, the smaller η'/η becomes, the attenuation value becomes better. Especially, at 0.86 or below, the attenuation value is 90% or more of that in the case where no SiO2 film is formed. Even after the SiO2 film is formed, substantially the same level of performance can be obtained as that before the SiO2 film is formed.

As described so far, the inventors have found out the following fact. If the shape of the SiO2 film is created so as to satisfy the correlations of [L1≦p1 and L2≧p2 (herein, the correlations of L≈p, p1+p2=p and L1+pL2=L are satisfied)], good characteristics can be obtained even in the case where a protective film is formed. Especially, if η'/η≦0.86, the same attenuation value can be realized as that in the case where no protective film is formed.

In this third embodiment, the SiO2 film is used as the protective film. However, the protective film is not limited to this. Even if another dielectric film such as SiN, SiON and Ta2O5 is used, needless to say, the same advantages can be obtained, as long as its shape meets the above described conditions. In addition, in the third embodiment, the 36° LT is used as the substrate. However, the substrate is not limited to this. In an SAW device where LT which is cut out at another angle, or another piezo-electric substrate of, for example, LiNbO3, LiB2O3, KnbO3, or the like, is used, or in an SAW device where an electrode is formed on a piezo-electric film, in the case where a protective film is formed on its surface, needless to say, the same advantages can be obtained, as long as its shape meets the above described conditions.

Besides, as the method of obtaining such a shape, in this third embodiment, bias sputtering is used, but it is not limited to this method.

Fourth Embodiment

Hereinafter, an SAW device according to a fourth embodiment of the present invention will be described with reference to the drawings.

In this fourth embodiment, the same SAW device is used as the SAW device which is used in the third embodiment, even though it is different in the number of its electrodes or reflectors, or the pitch p. Therefore, its structure and production method are the same as those shown in each of FIG. 1A, FIG. 14, and FIG. 2A to FIG. 2H. Thus, their description is omitted. The SAW device according to this fourth embodiment also satisfies the correlations of [L1≦p1 and L2≧p2 (herein, the correlations of L≈p, p1+p2=p and L1+pL2=L are satisfied)].

Figure 18A:
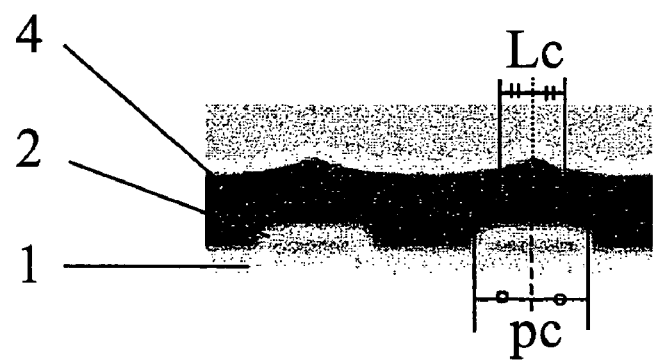
FIG. 18A is a sectional SEM photograph of an electronic part according to a fourth embodiment of the present invention.
Figure 18B:
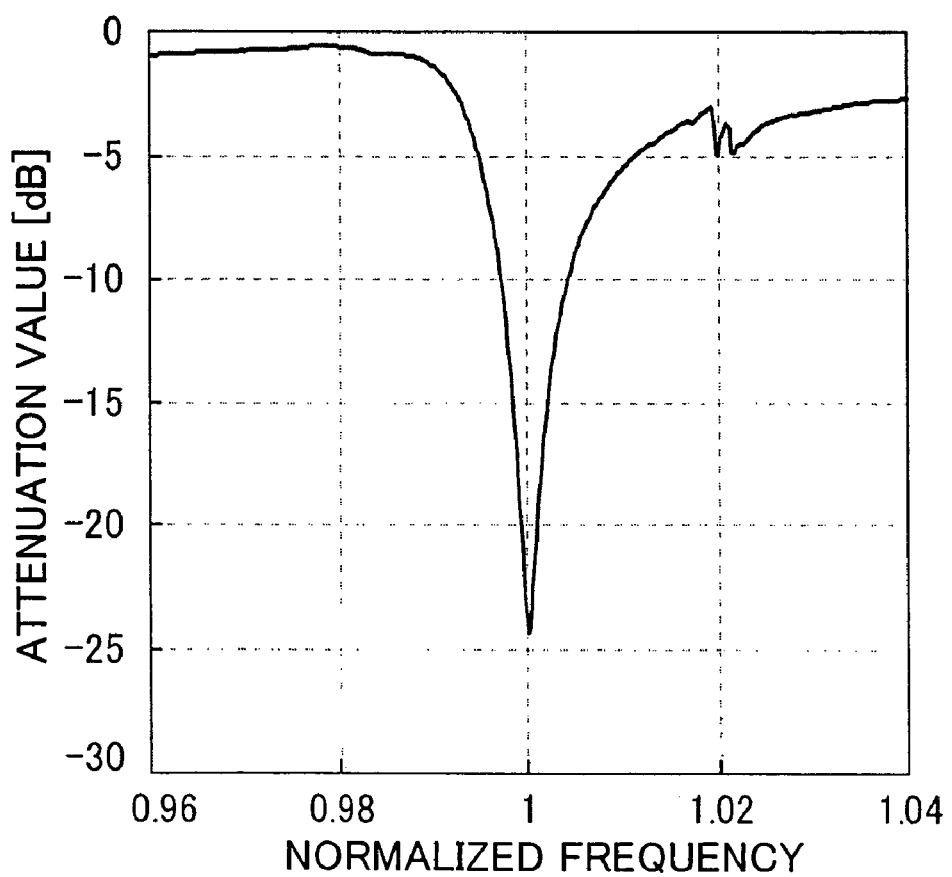
FIG. 18B is a graphical representation, showing an electrical characteristic of the electronic part according to the fourth embodiment of the present invention.
Figure 19A:
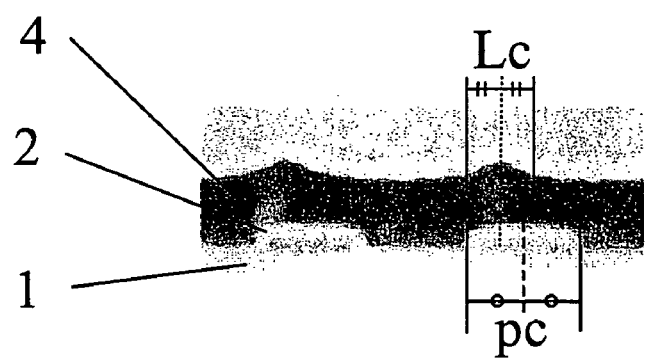
FIG. 19A is a sectional SEM photograph of the electronic part according to the fourth embodiment of the present invention.
Figure 19B:
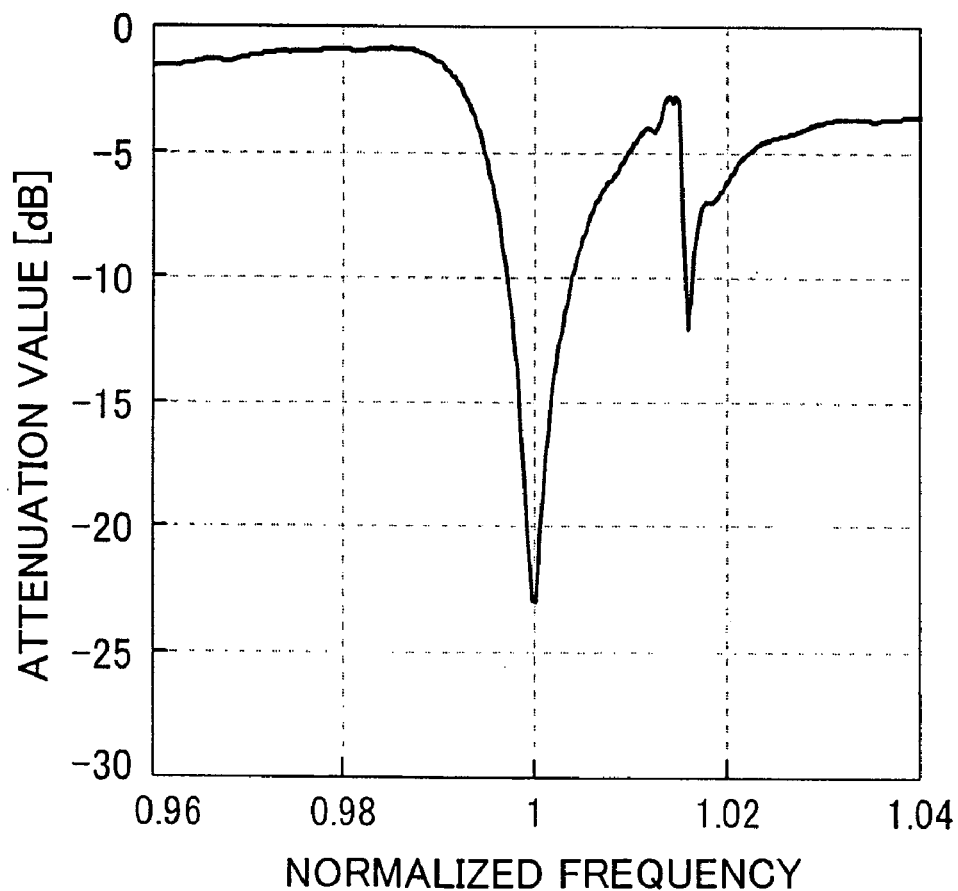
FIG. 19B is a graphical representation, showing an electrical characteristic of the electronic part according to the fourth embodiment of the present invention.

In this fourth embodiment, in order to show the correlation between: the positional relation between a center Lc of a convex portion in the unevenness of a protective film and a center pc of an electrode finger of a comb-type electrode; and the electrical characteristics of the SAW device in which a protective film with the shape shown in the third embodiment is formed, two kinds of SAW devices are created. One is, as an embodiment 6, an SAW device in which the center Lc of the convex portion in the unevenness of the protective film and the center pc of the electrode finger of the comb-type electrode are almost on the same straight line. The other is, as a comparative example 8, an SAW device in which the center Lc of the convex portion in the unevenness of the protective film is shifted from the center pc of the electrode finger of the comb-type electrode. FIG. 18A and FIG. 19A show the sectional shape of the device according to the embodiment 6 and according to a comparative example 7, respectively. FIG. 18B and FIG. 19B show the electrical characteristic of the device according to the embodiment 6 and according to the comparative example 8, respectively. Herein, in FIG. 18B and FIG. 19B, in order to take into account the frequency shift between the devices and clarify the distinction in characteristics between the devices, their dependence is shown by using the normalized frequency which is normalized with the anti-resonant frequency of each SAW device.

It can be seen that the center Lc of the convex portion in the unevenness of the protective film is shifted from the center pc of the electrode finger of the comb-type electrode, so that the insertion loss and the attenuation value can be deteriorated. In addition, a ripple which is generated near a normalized frequency of 1.02 is largely generated in FIG. 19B. Besides, it can be seen that the difference in frequency between the anti-resonance point and this ripple is narrow. When a ladder-type SAW filter is configured using this SAW device, if this ripple is largely generated, filter characteristics becomes worse. Further, if this ripple is located near the anti-resonance point, it appears as a large ripple in the filter band.

Therefore, from the above described results, the inventors have found out the following fact. In the device which is created so that the shape of the SiO2 film satisfies the correlations of [L1≦p1 and L2≧p2 (herein, the correlations of L≈p, p1+p2=p and L1+pL2=L are satisfied)], in order to obtain good characteristics, if the center of the width L1 of the convex portion 4a of the protective film 4 is Lc and the center of the width p1 of the electrode finger 2 which is located under and near the convex portion 4a of the protective film 4 and is pc, then preferably, Lc and pc should be located, if seen from the upper surface of the substrate 1, substantially on the same straight line, or in plan view, substantially on the same straight line.

Fifth Embodiment

Hereinafter, an SAW device according to a fifth embodiment of the present invention will be described with reference to the drawings.

In this fifth embodiment, the same SAW device is used as the SAW device which is used in the third embodiment, even though it is different in the number of its electrodes or reflectors, or the pitch p. Therefore, its structure and production method are the same as those shown in each of FIG. 1A, FIG. 14, and FIG. 2A to FIG. 2H. Thus, their description is omitted. The SAW device according to this fifth embodiment also satisfies the correlations of [L1≦p1 and L2≧p2 (herein, the correlations of L≈p, p1+p2=p and L1+pL2=L are satisfied)].

In this fifth embodiment, in order to show the correlation between the cutout angle of the substrate 1 and the electrical characteristics of the SAW device in which a protective film with the shape shown in the third embodiment is formed, SAW devices are created using the total five kinds of substrates which are different in the cutout angle in comparative examples 9, 10 and embodiments 7, 8, 9. A table 4 shows the cutout angle of an LT substrate which is used in each SAW device.

TABLE 4

|  | Cutout Angle |
| --- | --- |
| Embodiment 7 | 39° |
| Embodiment 8 | 42° |
| Embodiment 9 | 46° |

TABLE 4-continued

|  | Cutout Angle |
| --- | --- |
| Comparative Example 9 | 34° |
| Comparative Example 10 | 36° |

In addition, FIG. 20 shows the electrical characteristic of each SAW device. Herein, in FIG. 20, in order to take into account the frequency shift between the devices and clarify the distinction in characteristics between the devices, their dependence is shown by using the normalized frequency which is normalized with the anti-resonant frequency of each SAW device.

FIG. 20 shows that as the cutout angle of the substrate 1 becomes wider from 34°, the attenuation value and the steepness are improved. Especially, in the SAW device used in this fifth embodiment, in order to make the attenuation value −20 dB or more which is approximately 80% of the attenuation value when no SiO2 film is formed, the cutout angle of the substrate should be about 38° or more. Therefore, from the above described results, the inventors have confirmed that good temperature characteristics and electrical properties can be obtained, if the substrate 1 is LT which is cut out of a Y-sheet that is turned by D° around the X-axis in the Z-axis direction, and the D° YLT substrate is used for which the rotational angle D° is, $$38° < D°.$$

Sixth Embodiment

Hereinafter, an SAW device according to a sixth embodiment of the present invention will be described with reference to the drawings.

In this sixth embodiment, the same SAW device is used as the SAW device which is used in the third embodiment, even though it is different in the number of its electrodes or reflectors, or the pitch p. Therefore, its structure and production method are the same as those shown in each of FIG. 1A, FIG. 14, and FIG. 2A to FIG. 2H. Thus, their description is omitted. The SAW device according to this sixth embodiment also satisfies the correlations of [L1≦p1 and L2≧p2 (herein, the correlations of L≈p, p1+p2=p and L1+pL2=L are satisfied)]. Herein, the normalized film thickness h/(2×p) of the electrode is 5%.

Figure 22:
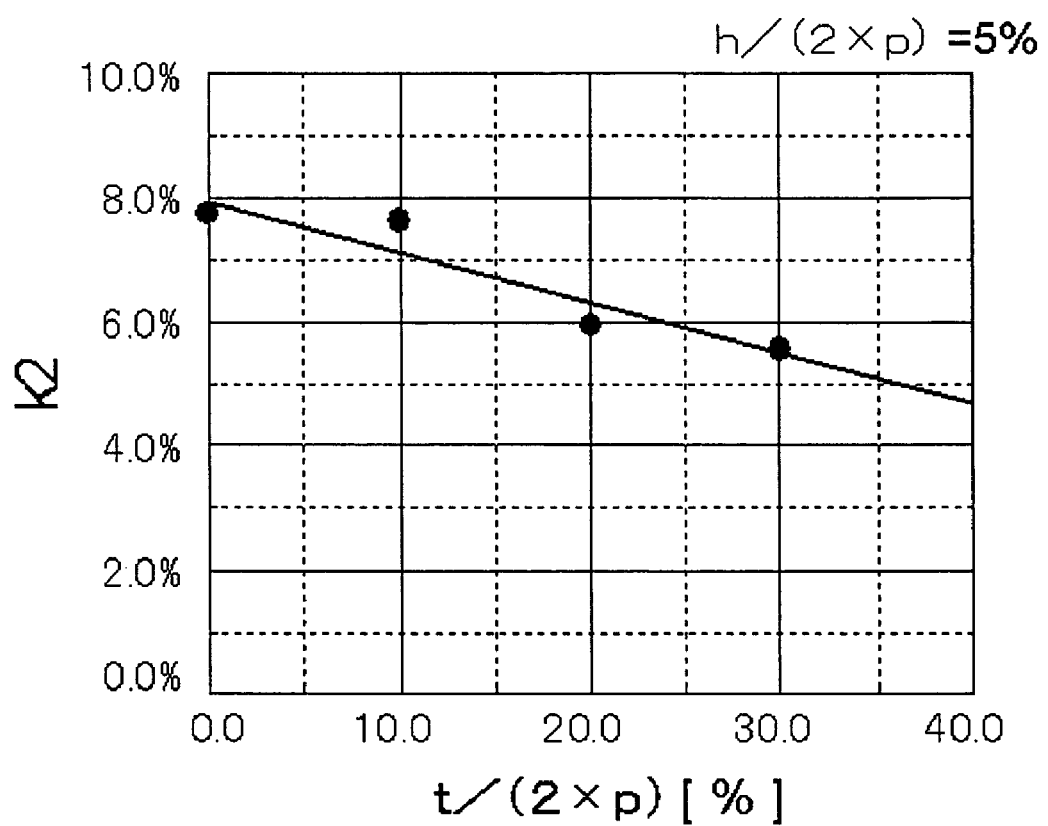
FIG. 22 is a graphical representation, showing the correlation between the structure of the electronic part and an electrical characteristic thereof according to the sixth embodiment of the present invention.
Figure 23:
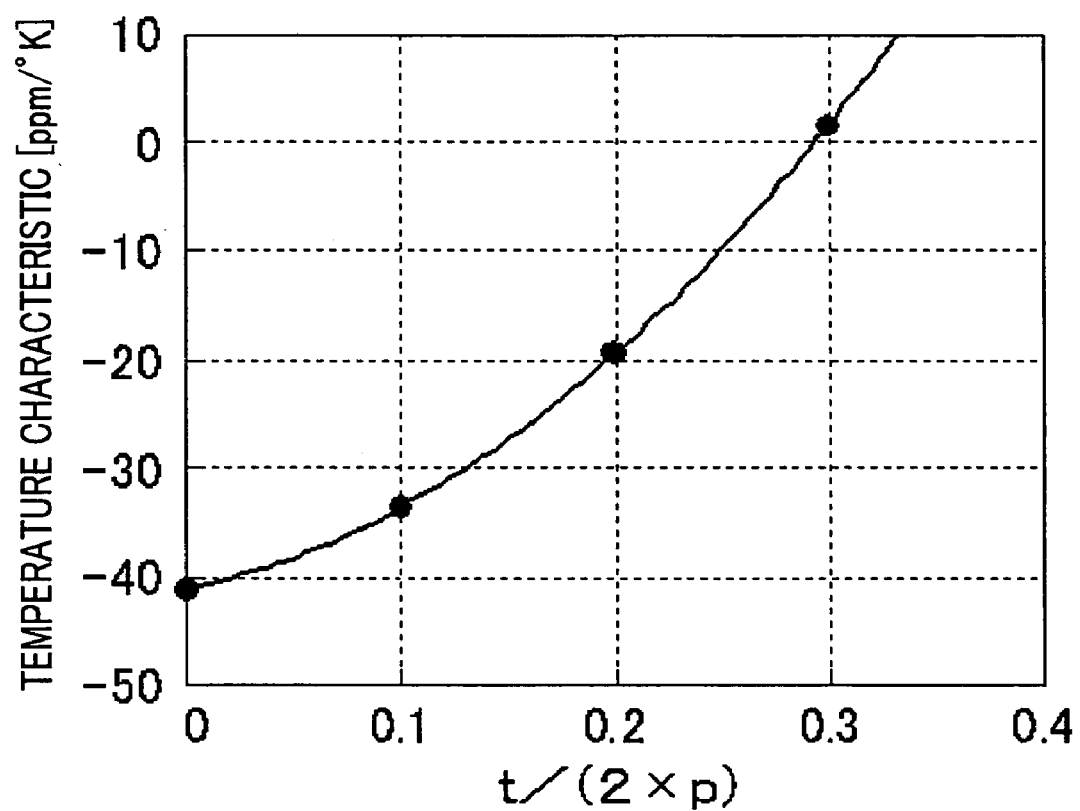
FIG. 23 is a graphical representation, showing the correlation between the structure of the electronic part and a temperature characteristic thereof according to the sixth embodiment of the present invention.

In this sixth embodiment, in order to show the correlations between the film thickness of an SiO2 film, and the temperature characteristics and the electrical characteristics, three kinds of SAW devices which each have a different SiO2 film-thickness t are created as embodiments 10, 11, 12, and an SAW device in which no SiO2 is formed as a comparative example 1 1. The electrical characteristic of each device is shown in FIG. 21, and the correlation between an electromechanical coupling coefficient (k2) which is calculated from the electrical characteristic shown in FIG. 21 and the SiO2 film-thickness is shown in FIG. 22. Herein, with respect to the frequency dependence of the electrical characteristics in FIG. 21, in order to take into account the frequency shift between the devices and clarify the distinction in characteristics between the devices, their dependence is shown by using the normalized frequency which is standardized with the anti-resonant frequency of each SAW device. In addition, FIG. 23 shows a temperature characteristic which is measured using the anti-resonant frequency of each SAW device. Besides, a table 5 shows the standardized film thickness h/(2× p) of the SiO2 film of each device, the electro-mechanical coupling coefficient and the temperature characteristics.

TABLE 5

|  | t/(2 × p) (%) | k2 (%) | Temperature Characteristics (ppm/K°) |
|---|---|---|---|
| Comparative Example 11 | 0.0 | 7.7 | −41.2 |
| Embodiment 10 | 10.0 | 7.6 | −33.8 |
| Embodiment 11 | 20.0 | 5.9 | −19.5 |
| Embodiment 12 | 30.0 | 5.6 | 1.4 |

FIG. 23 shows that the greater the film thickness of the SiO2 film becomes, the better the temperature characteristics become. Especially, if the standardized film thickness of the SiO2 film becomes approximately 0.13 or above, the temperature characteristics also become −30 ppm/K or below, and further, become a zero temperature coefficient at about 30%. However, simultaneously, FIG. 22 shows the electro-mechanical coupling coefficient K2 becomes smaller. As the electro-mechanical coupling coefficient K2 becomes smaller, the steepness is increased. At the same time, when a ladder-type SAW filter is configured using this SAW device, its band width becomes narrower. In order to secure a filter band width necessary for a mobile-phone system which has been popular at present, preferably, the coupling coefficient should be some 6% or higher. In FIG. 22, in order to obtain a coupling coefficient of 6%, if the standardized film thickness of SiO2 is approximately 20% or below, the coupling coefficient becomes 5% or less when the film thickness of the SiO2 film becomes about 35% or higher. Hence, it is extremely difficult to secure the band width of the filter. On the other hand, the electro-mechanical coupling coefficient is too great, the steepness is lost, even though the band width becomes larger. Therefore, a passing band cannot be adequately shifted to an attenuation band between the transmission band and the reception band. Thus, a disadvantage arises in that adequate suppression cannot be obtained in the attenuation band, or a loss becomes greater in the passing band. Besides, taking the temperature coefficient into account, the transition region from the passing band to the attenuation band which is allowed for filter characteristics needs to be equal to, or less than, (the frequency gap between the transmission band and the reception band—a drift frequency width by temperature). Hence, considering FIG. 22 and FIG. 23, it is preferable that the film thickness of the SiO2 film be greater than the case where the film thickness of the SiO2 film is 13% in which the electromechanical coupling coefficient is approximately 7% and the temperature characteristic is −30 ppm/° K. Therefore, from the above described results, the inventors have confirmed that good temperature characteristics and electrical properties can be obtained, if SiO2 is used as the protective film, and the thickness t of the protective film which is defined as the height from the surface of the substrate to the concave portion of the protective film meets the condition of, $$13\% \leq t/(2 \times p) \leq 35\%.$$

Seventh Embodiment

Hereinafter, electronic equipment according to a seventh embodiment of the present invention will be described with reference to the drawings.

In this embodiment, a mobile telephone is described as an example of the electronic equipment.

Figure 24A:
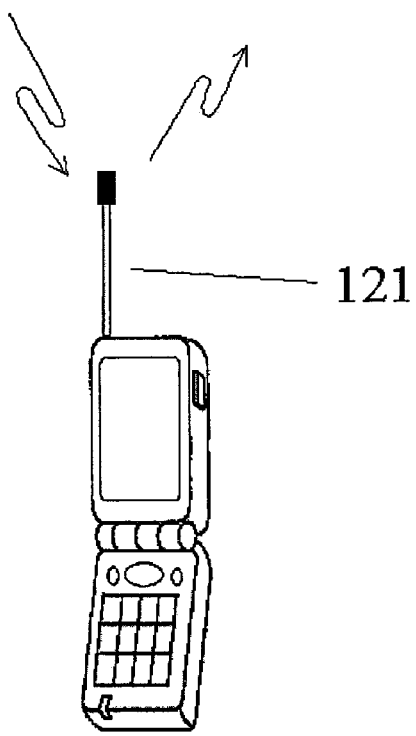
FIG. 24A is a schematic perspective view of electronic equipment according to a seventh embodiment of the present invention.
Figure 24B:
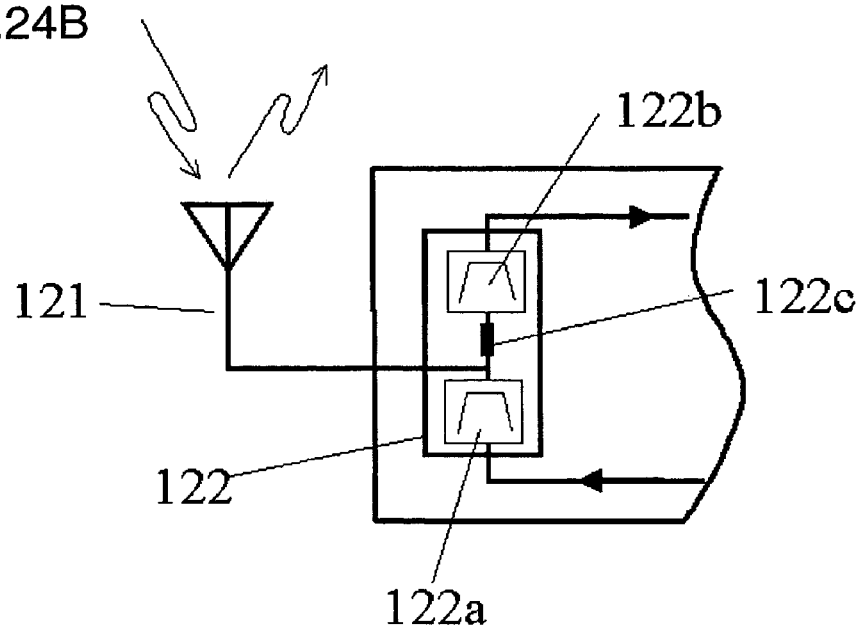
FIG. 24B is an electric-circuit diagram, showing the main part inside of the electronic equipment according to the seventh embodiment of the present invention.

FIG. 24A is a schematic perspective view of the mobile telephone according to the seventh embodiment of the present invention. FIG. 24B is an electric-circuit diagram, showing the main part inside of the same.

As shown in the figure, the mobile telephone according to this seventh embodiment includes an antenna 121, and an antenna shared device 122 which is connected to this antenna 121. This antenna shared device 122 is configured by a transmission SAW filter 122a, a reception SAW filter 122b, and a phase shifter 122c.

In the transmission SAW filter 122a and the reception SAW filter 122b according to this seventh embodiment, the SAW device described in the third embodiment is used.

Figure 25A:
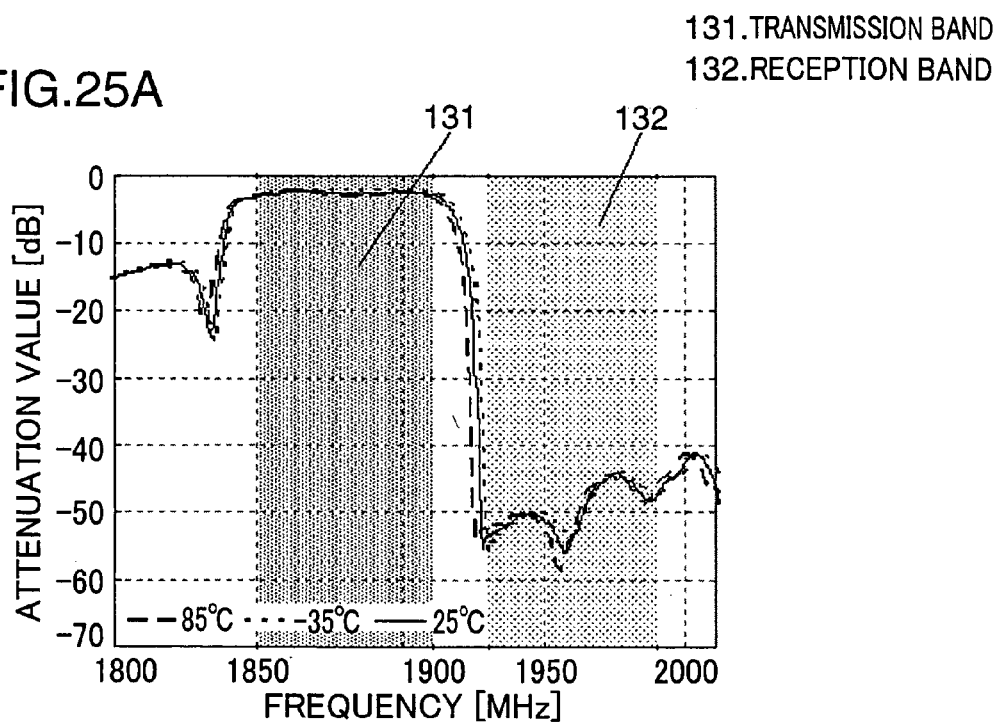
FIG. 25A is a graphical representation, showing an electrical characteristic of the electronic part according to the seventh embodiment of the present invention.

FIG. 25A shows the electrical characteristics of the SAW filter 122a which are measured at each temperature of −35° C., 25° C., +85° C.

Figure 25B:
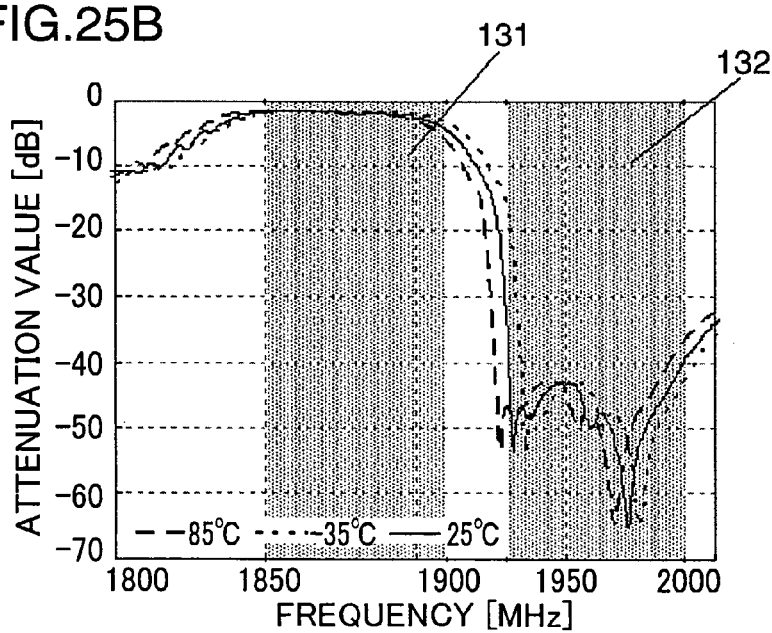
FIG. 25B is a graphical representation, showing an electrical characteristic of the electronic part according to the seventh embodiment of the present invention.

In addition, for its comparison, FIG. 25B shows the electrical characteristics of an SAW filter which has the same frequency band as the SAW filter 122a and where no SiO2 film is formed, which are measured at each temperature of −35° C., 25° C., +85° C. Besides, FIG. 25A and FIG. 25B show, using hatching, a transmission band 131 and a reception band 132 in a mobile-phone system which is adopted as an example of this seventh embodiment. In this mobile-phone system, within a temperature range of −35° C. to +85° C., in the case of a transmission filter, an insertion loss of −3.5 dB or below is required in the transmission band, and a suppression level of −42 dB or above is required in the reception band.

If FIG. 25A is compared with FIG. 25B, the filter with the characteristic of FIG. 25A in which the SAW device described in the third embodiment is used, has a steep filter characteristic. In addition, a frequency drift is not caused so much by a change in temperature. Therefore, within a temperature range of −35° C. to +85° C. which is the performance required for this mobile-phone system, an insertion loss of −3.5 dB or below is realized in the transmission band, and a suppression level of −42 dB or above is realized in the reception band. In contrast, the filter with the characteristic of FIG. 25A in which no SiO2 film is formed cannot realize a steep characteristic. Even at a room temperature, the requirements cannot be met, and in addition, a frequency drift by temperature is large so that the characteristics cannot be satisfied within a temperature range of −35° C. to +85° C.

In the mobile telephone where the SAW device described in the first embodiment is used for the transmission SAW filter 122a and the reception SAW filter 122b, in the same way, the inventors also measure its sensibility under an environment of −35° C. to +85° C. They have confirmed that even if the temperature changes, there is little change in the sensibility.

Eighth Embodiment

Figure 26:
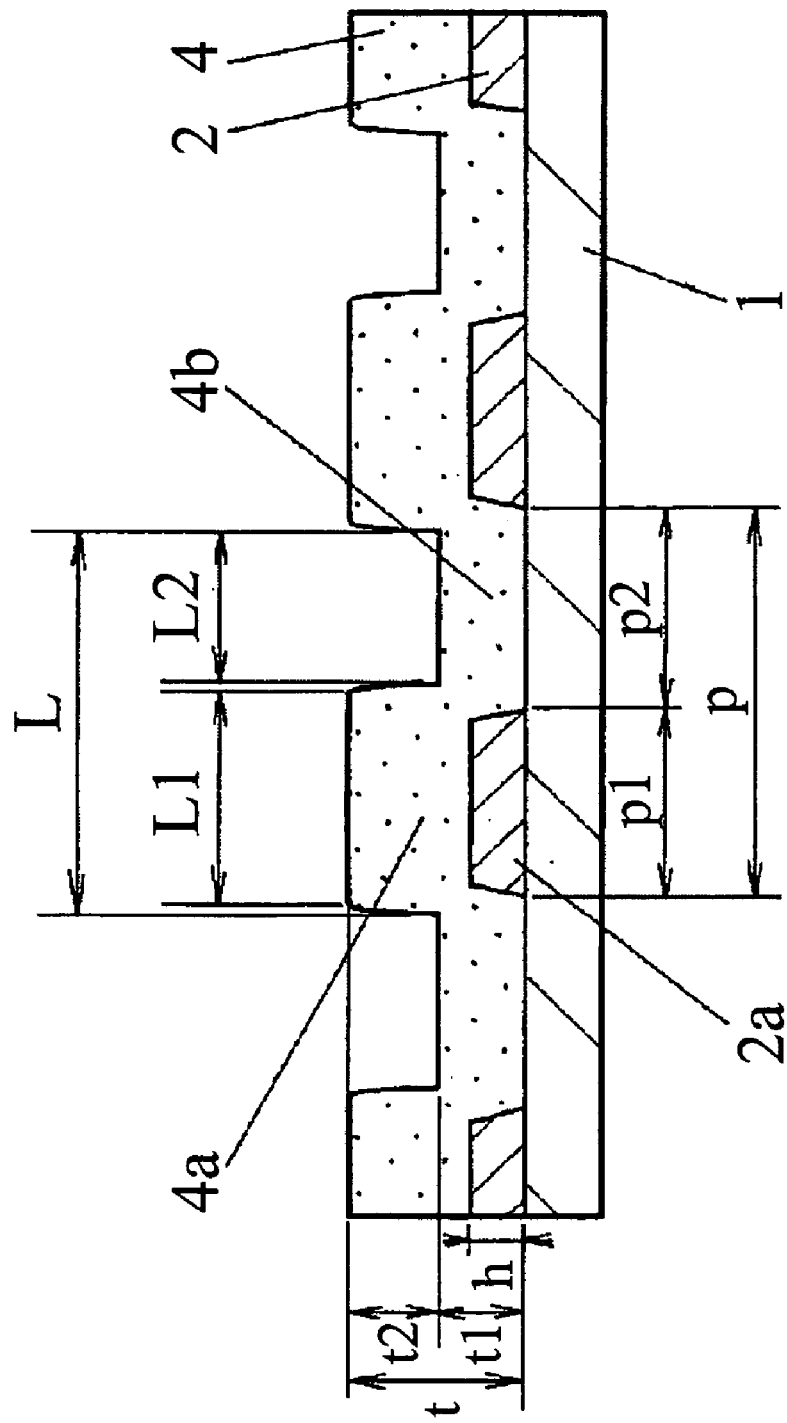
FIG. 26 is a sectional view of an electronic part according to an eighth embodiment of the present invention.

FIG. 26 is a sectional view of an SAW device according to an eighth embodiment of the present invention. Its top view is identical to FIG. 1A.

As shown in FIG. 1A and FIG. 26, the SAW device according to this eighth embodiment includes a comb-type electrode 2 on the upper surface of a substrate 1, a reflector 3 on both sides of this comb-type electrode 2, and a protective film 4 which covers at least these comb-type electrode 2 and reflector 3. In addition, the comb-type electrode 2 is provided with a pad 5 for taking out an electric signal which is electrically connected to the comb-type electrode. Thereby, the SAW device is configured.

The substrate 1 is made of lithium tantalate which is cut out of a Y-sheet that is turned by several degrees around the X-axis in the Z-axis direction. It is a 36° YLT substrate which is obtained at a turning angle of 36°.

The comb-type electrode 2 is made of aluminum (hereinafter, referred to as "Al"), or an aluminum alloy.

The protective film 4 is preferably made of silicon dioxide (hereinafter, referred to as "SiO2"), or an aluminum alloy. As shown in FIG. 26, an uneven shape is formed at its upper surface. A convex portion 4a of the protective film 4 is provided, over the part where the comb-type electrode 2 is disposed on the upper surface of the substrate 1, and in its vicinity. On the other hand, a concave portion 4b of the protective film 4 is provided, in the part where no comb-type electrode 2 is disposed on the upper surface of the substrate 1 between the convex portions 4a.

Herein, the height from the surface of the substrate 1 which is in contact with the protective film 4 to the top part of the convex portion 4a of the protective film 4 is t, the height from the surface of the substrate 1 which is in contact with the protective film 4 to the bottom part of the concave portion 4b of the protective film 4 is t1, and the height (t-t1) from the bottom part of the concave portion 4b of the protective film 4 to the top part of the convex portion 4a of the protective film 4 is t2.

In addition, the height of the comb-type electrode 2 from the surface of the substrate 1 which is in contact with the protective film 4 to the top part of an electrode finger 2a is h.

Besides, one convex portion 4a and one concave portion 4b of the protective film 4 are one pitch, the pitch width of one pitch is L, the width of the top part of the convex portion 4a of the protective film 4 is L1, and the width of the bottom part of the concave portion 4b of the protective film 4 is L2. Further, in the same way as one pitch of the protective film 4, the width of one pitch of the comb-type electrode 2 from one electrode finger 2a of the comb-type electrode 2 to the part in which the adjacent electrode finger 2a is disposed on one side is p.

Moreover, the width of each electrode finger is p1, the width between the adjacent electrode fingers is p2 (herein, p=p1+p2 is satisfied).

In addition, the ratio (L−L2)/L of (L−L2) to the pitch width L is η' and the ratio p1/p of the width p1 of each electrode finger to the width p of one pitch of the comb-type electrode 2 is η.

According to the eighth embodiment of the present invention, the following correlation is satisfied, $h \leq t2$ (herein, the correlations of $\eta'-0.3 < \eta \leq \eta'$, $L \approx p$, $p1+p2 \approx p$ and $L1 > p1$ are satisfied).

Herein, as described above, the 36° YLT is used in the substrate 1. However, the same advantage can be obtained, if this substrate 1 is LT which is cut out of a Y-sheet that is turned by D° around the X-axis in the Z-axis direction, and the D° YLT substrate is used for which the rotational angle D° is, $38° \leq D°$.

A creation method for the SAW device according to this eighth embodiment is the same as that shown in FIG. 2A to FIG. 2H, and thus, its description is omitted.

Herein, the inventors have discovered that in terms of the above described SAW-device creation, in this eighth embodiment, the necessary protective-film shape can be relatively easily obtained, if the correlation between the height h of the comb-type electrode 2 and the pitch width p of one pitch of the comb-type electrode 2 is, $h/(2 \times p) \leq 0.05$.

With respect to the SAW device which is created as described above, electrical characteristics are examined. As a result, the inventors have confirmed that good characteristics can be obtained.

In addition, the inventors also examine temperature characteristics. Consequently, they have also confirmed that good temperature characteristics can be obtained, if SiO2 is used as the protective film, and the height t1 from the surface of the substrate to the concave portion of the protective film meets the condition of, $18\% \leq t1/(2 \times p) \leq 35\%$.

Ninth Embodiment

Hereinafter, an SAW device according to a ninth embodiment of the present invention will be described with reference to the drawings.

Figure 27:
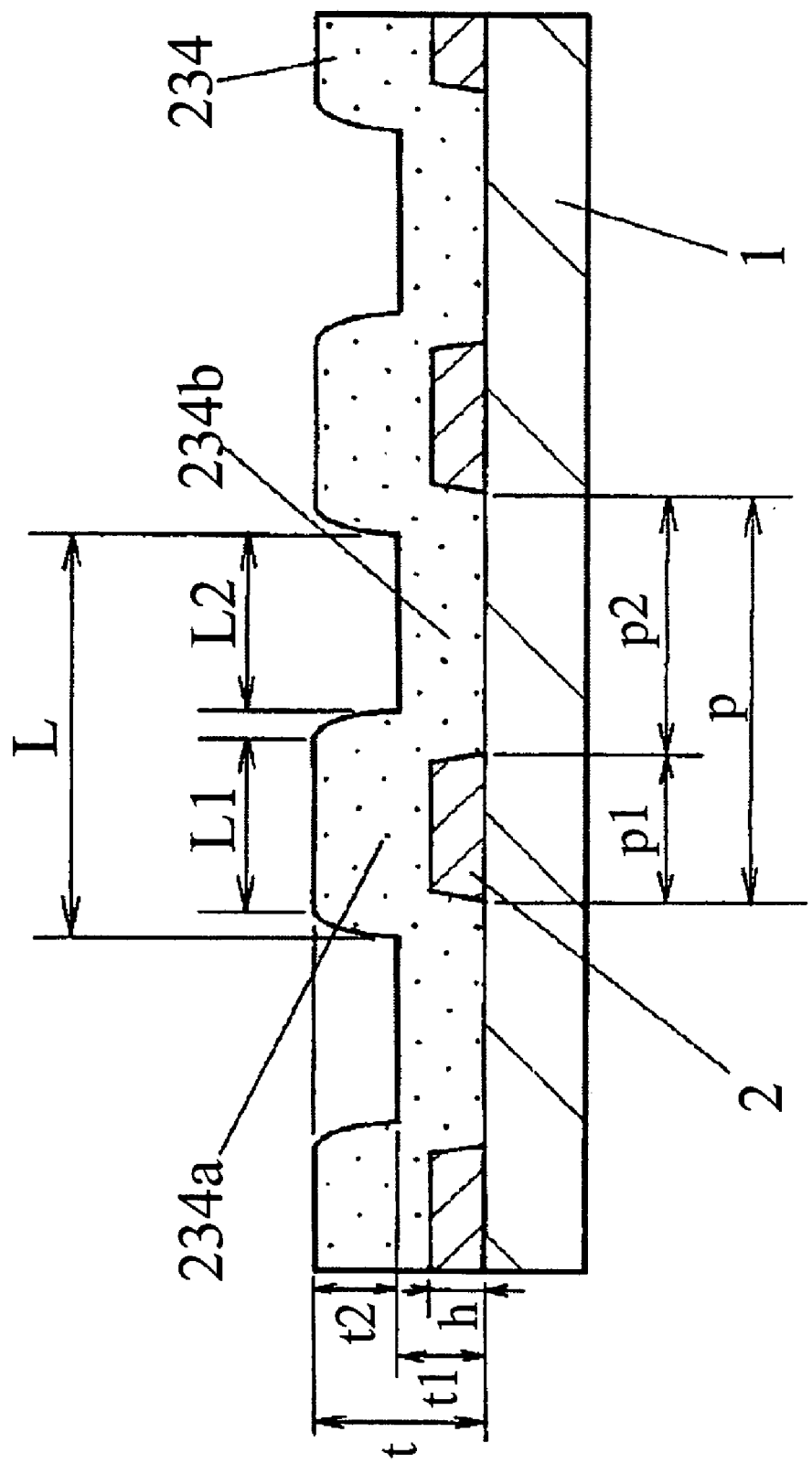
FIG. 27 is a sectional view of an electronic part according to a ninth embodiment of the present invention.

In this ninth embodiment, the same SAW device is used as the SAW device which is used in the eighth embodiment. FIG. 27 is a sectional view of the SAW device according to the ninth embodiment of the present invention. In this figure, the same configurations as those of FIG. 26 which is used in the eighth embodiment are given the identical numeral and character, and thus, their description is omitted.

In FIG. 27, the protective film 234 is preferably made of SiO2. As shown in FIG. 27, an uneven shape is formed at its upper surface. A convex portion 234a of the protective film 234 is provided, over the part where the comb-type electrode 2 is disposed on the upper surface of the substrate 1, and in its vicinity. On the other hand, a concave portion 234b of the protective film 234 is provided, in the part where no comb-type electrode 2 is disposed on the upper surface of the substrate 1 between the convex portions 234a. Herein, one convex portion 234a and one concave portion 234b of the protective film 234 are one pitch, the pitch width of one pitch is L, the width of the top part of the convex portion 234a of the protective film 234 is L1, and the width of the bottom part of the concave portion 234b of the protective film 234 is L2. The ratio (L−L2)/L of (L−L2) to the pitch width L is η'. Furthermore, the height from the surface of the substrate 1 which is in contact with the protective film 234 to the top part of the convex portion 234a of the protective film 234 is t, the height from the surface of the substrate 1 which is in contact with the protective film 234 to the bottom part of the concave portion 234b of the protective film 234 is t1, and the height (t-t1) from the bottom part of the concave portion 234b of the protective film 234 to the top part of the convex portion 4a of the protective film 234 is t2.

This ninth embodiment is different from FIG. 26 of the eighth embodiment, in the following respect. In FIG. 26 of the eighth embodiment, the shape of the convex portion 4a of the protective film 4 is nearly square and its corner is roughly 90°. In contrast, in FIG. 27 of this ninth embodiment, the shape of the convex portion 234a of the protective film 234 is rounded at its corner.

According to the ninth embodiment of the present invention, the following correlation is satisfied, $h \leq t2$ (herein, the correlations of $\eta'-0.3 < \eta \leq \eta'$, $L \approx p$, $p1+p2 \approx p$ and $L1 > p1$ are satisfied). In addition, the following correlations are also satisfied, $L1+L2 < L$ and $L2 < p2$.

A creation method for the SAW device according to this ninth embodiment is the same as that described in the eighth embodiment, and thus, its description is omitted.

Herein, the inventors have discovered that in terms of the above described SAW-device creation, even in this ninth embodiment, the necessary protective-film shape can be relatively easily obtained, if the correlation between the height of the comb-type electrode 2 and the pitch width p of one pitch of the comb-type electrode 2 is, $$h/(2 \times p) \leq 0.05.$$

With respect to the SAW device which is configured as described above, electrical characteristics are examined. As a result, the inventors have confirmed that good characteristics can be obtained. In addition, the inventors also examine temperature characteristics. Consequently, they have also confirmed that good temperature characteristics can be obtained, if SiO2 is used as the protective film, and the height t1 from the surface of the substrate to the concave portion of the protective film meets the condition of, $$18\% \leq t1/(2 \times p) \leq 35\%.$$

Tenth Embodiment

Hereinafter, an SAW device according to a tenth embodiment of the present invention will be described with reference to the drawings.

Figure 28:
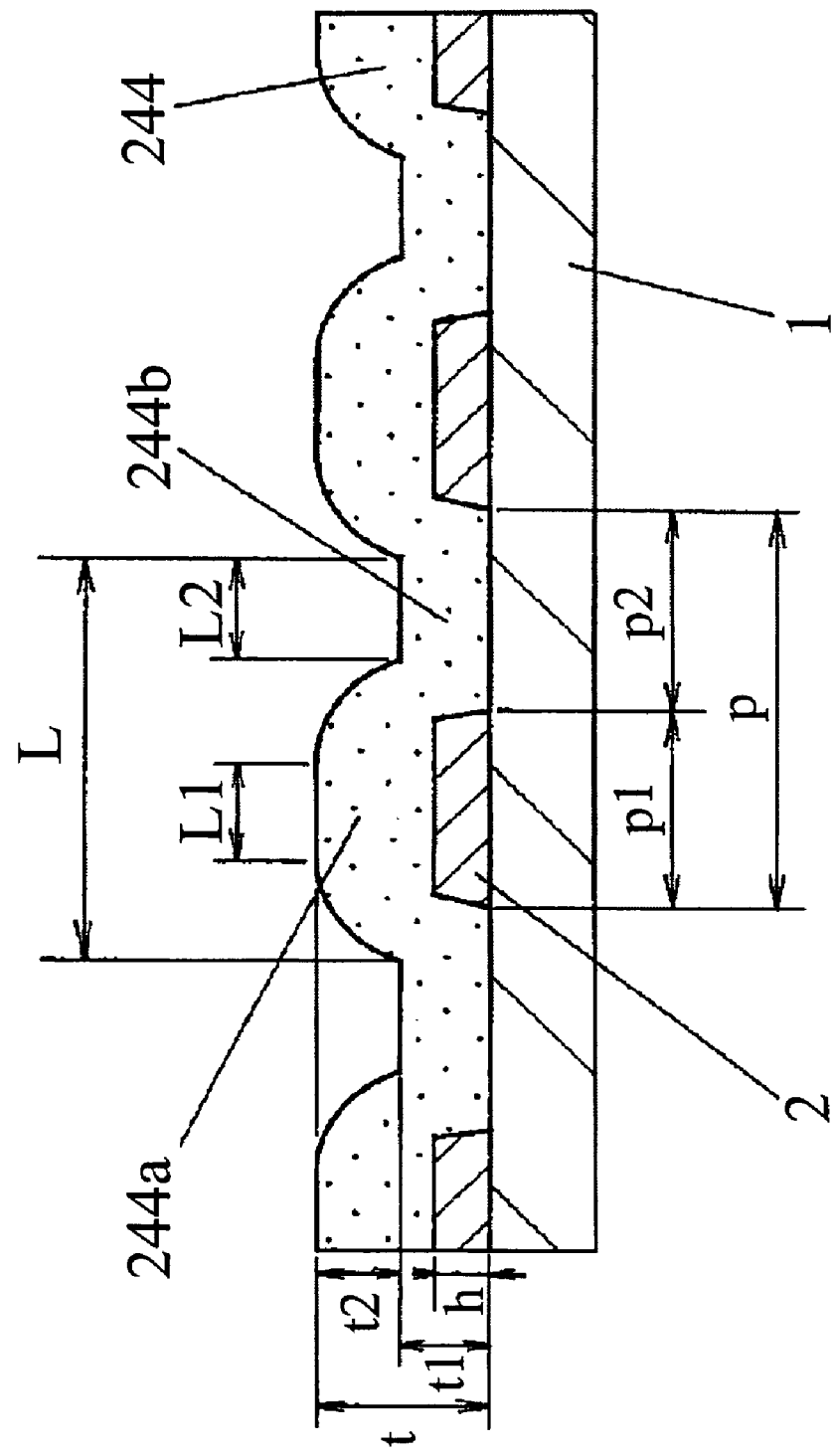
FIG. 28 is a sectional view of an electronic part according to a tenth embodiment of the present invention.

In this tenth embodiment, the same SAW device is used as the SAW device which is used in the eighth embodiment. FIG. 28 is a sectional view of the SAW device according to the tenth embodiment of the present invention. In this figure, the same configurations as those of FIG. 26 which is used in the eighth embodiment are given the identical numeral and character, and thus, their description is omitted.

In FIG. 28, the protective film 44 is preferably made of SiO2. As shown in FIG. 28, an uneven shape is formed at its upper surface. A convex portion 244a of the protective film 244 is provided, over the part where the comb-type electrode 2 is disposed on the upper surface of the substrate 1, and in its vicinity. On the other hand, a concave portion 244b of the protective film 244 is provided, in the part where no comb-type electrode 2 is disposed on the upper surface of the substrate 1 between the convex portions 244a. Herein, one convex portion 244a and one concave portion 244b of the protective film 244 are one pitch, the pitch width of one pitch is L, the width of the top part of the convex portion 244a of the protective film 244 is L1, and the width of the bottom part of the concave portion 244b of the protective film 244 is L2. The ratio (L−L2)/L of (L−L2) to the pitch width L is η'. Furthermore, the height from the surface of the substrate 1 which is in contact with the protective film 244 to the top part of the convex portion 244a of the protective film 244 is t, the height from the surface of the substrate 1 which is in contact with the protective film 244 to the bottom part of the concave portion 44b of the protective film 44 is t1, and the height (t-t1) from the bottom part of the concave portion 44b of the protective film 44 to the top part of the convex portion 44a is t2.

This tenth embodiment is different from FIG. 26 of the eighth embodiment, in the following respect. In FIG. 26 of the eighth embodiment, the width L1 of the top part of the convex portion 4a of the protective film 4 is greater than the width p1 of the electrode 2a. Therefore, the convex portion 4a of the protective film 4 is located over the electrode 2a and in its vicinity. In contrast, in this tenth embodiment, the width L1 of the top part of the convex portion 244a of the protective film 244 is narrower than the width p1 of the electrode 2a.

According to the tenth embodiment of the present invention, the following correlation is satisfied, $$h \leq t2$$

(herein, the correlations of L1+L2<L, L2<p2, L1≦p1, L≈p and p1+p2≈p are satisfied).

A creation method for the SAW device according to this tenth embodiment is the same as that described in the eighth embodiment, and thus, its description is omitted.

Herein, the inventors have discovered that in terms of the above described SAW-device creation, even in this tenth embodiment, the necessary protective-film shape can be relatively easily obtained, if the correlation between the height of the comb-type electrode 2 and the pitch width p of one pitch of the comb-type electrode 2 is, $$h/(2 \times p) \leq 0.05.$$

With respect to the SAW device which is configured as described above, electrical characteristics are examined. As a result, the inventors have confirmed that good characteristics can be obtained. In addition, the inventors also examine temperature characteristics. Consequently, they have also confirmed that good temperature characteristics can be obtained, if SiO2 is used as the protective film, and the height t1 from the surface of the substrate to the concave portion of the protective film meets the condition of, $$18\% \leq t1/(2 \times p) \leq 35\%.$$

Eleventh Embodiment

Hereinafter, an SAW device according to an eleventh embodiment of the present invention will be described with reference to the drawings.

Figure 29:
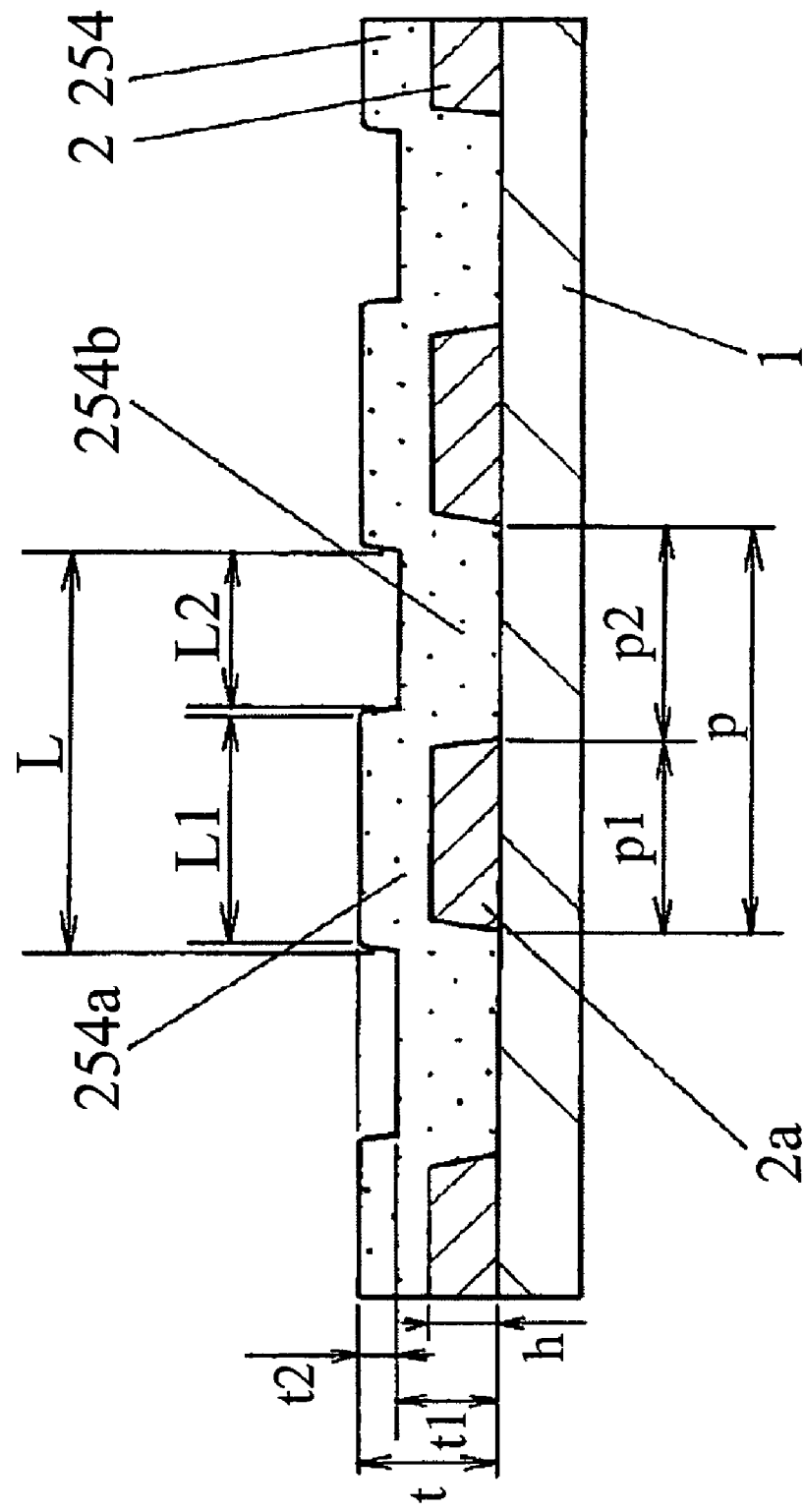
FIG. 29 is a sectional view of an electronic part according to an eleventh embodiment of the present invention.

In this eleventh embodiment, the same SAW device is used as the SAW device which is used in the eighth embodiment. FIG. 29 is a sectional view of the SAW device according to the eleventh embodiment of the present invention. In this figure, the same configurations as those of FIG. 26 which is used in the eighth embodiment are given the identical numeral and character, and thus, their description is omitted.

In FIG. 29, a protective film 254 is preferably made of SiO2. As shown in FIG. 29, an uneven shape is formed at its upper surface. A convex portion 254a of the protective film 254 is provided, over the part where the comb-type electrode 2 is disposed on the upper surface of the substrate 1, and in its vicinity. On the other hand, a concave portion 254b of the protective film 254 is provided, in the part where no comb-type electrode 2 is disposed on the upper surface of the substrate 1 between the convex portions 254a. Herein, one convex portion 254a and one concave portion 254b of the protective film 254 are one pitch, the pitch width of one pitch is L, the width of the top part of the convex portion 254a of the protective film 254 is L1, and the width of the bottom part of the concave portion 254b of the protective film 254 is L2. The ratio (L−L2)/L of (L−L2) to the pitch width L is η'. Furthermore, the height from the surface of the substrate 1 which is in contact with the protective film 254 to the top part of the convex portion 254a of the protective film 254 is t, the height from the surface of the substrate 1 which is in contact with the protective film 254 to the bottom part of the concave portion 254b of the protective film 254 is t1, and the height (t-t1) from the bottom part of the concave portion 254b of the protective film 254 to the top part of the convex portion 254a is t2.

This eleventh embodiment is different from FIG. 26 of the eighth embodiment, in the following respect. In FIG. 26 of the eighth embodiment, the height t2 from the bottom part of the concave portion 4b of the protective film 4 to the top part of the convex portion 4a is equal to, or more than, the height h of the comb-type electrode 2. In contrast, in FIG. 29 of this eleventh embodiment, the height t2 from the bottom part of the concave portion 254b of the protective film 254 to the top part of the convex portion 254a is below the height h of the comb-type electrode 2.

According to the eleventh embodiment of the present invention, the following correlation is satisfied, $$0 < t2 < h$$

(herein, the correlations of $\eta' - 0.3 < \eta \leq \eta$, $L \approx p$, $p1 + p2 \approx p$ and $L1 > p1$ are satisfied).

Herein, in this eleventh embodiment, taking characteristics into account, it is preferable that the correlation between the height h of the comb-type electrode and the pitch width p of one pitch of this comb-type electrode be, $$0.05 \leq h/(2 \times p)$$

A creation method for the SAW device according to this eleventh embodiment is the same as that described in the eighth embodiment, and thus, its description is omitted.

With respect to the SAW device which is configured as described above, electrical characteristics are examined. As a result, the inventors have confirmed that good characteristics can be obtained. In addition, the inventors also examine temperature characteristics. Consequently, they have also confirmed that good temperature characteristics can be obtained, if SiO2 is used as the protective film, and the height t1 from the surface of the substrate to the concave portion of the protective film meets the condition of, $$18\% \leq t1/(2 \times p) \leq 35\%.$$

Twelfth Embodiment

Hereinafter, an SAW device according to a twelfth embodiment of the present invention will be described with reference to the drawings.

Figure 30:
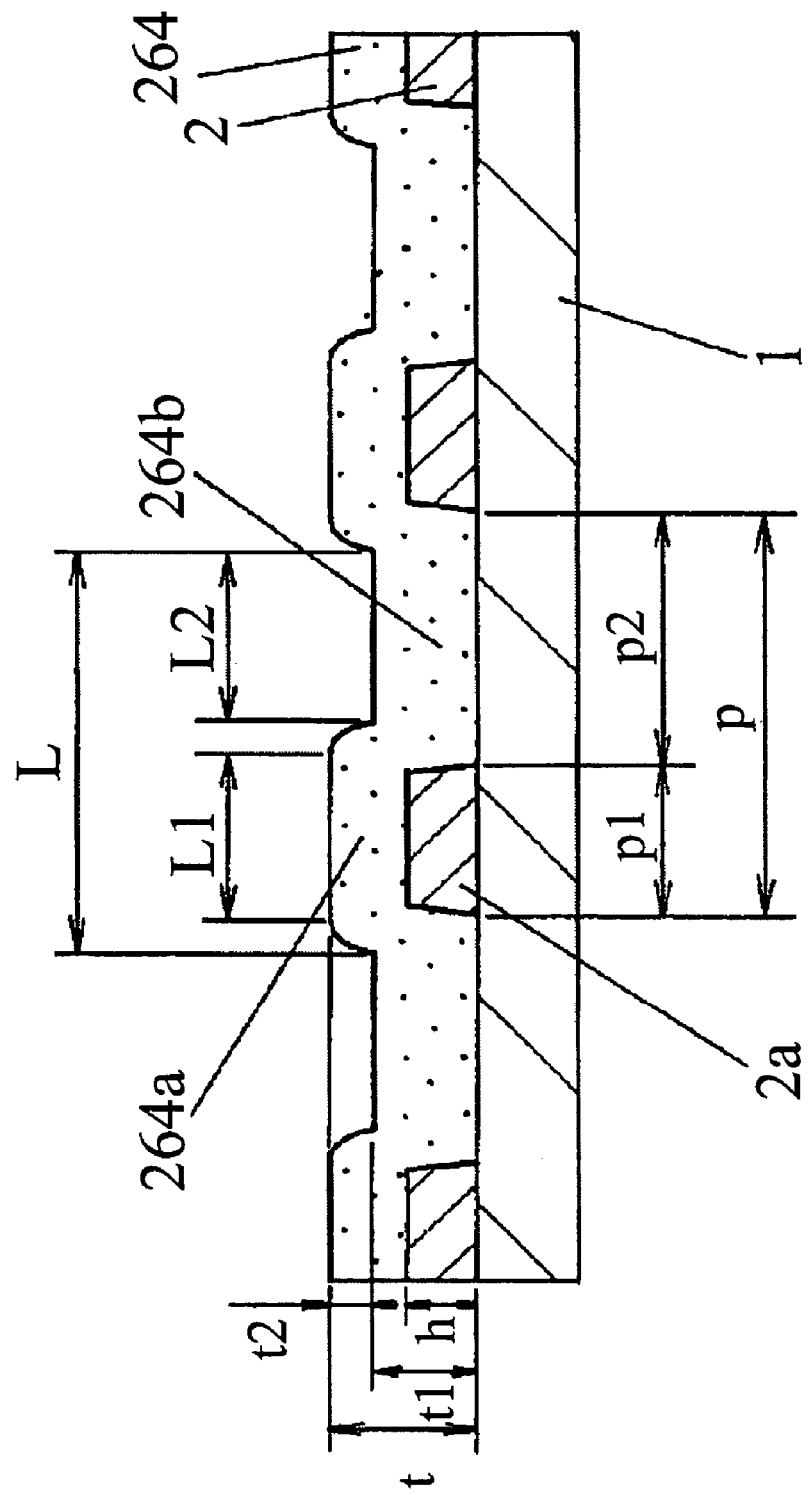
FIG. 30 is a sectional view of an electronic part according to a twelfth embodiment of the present invention.

In this twelfth embodiment, the same SAW device is used as the SAW device which is used in the eighth embodiment. FIG. 30 is a sectional view of the SAW device according to the twelfth embodiment of the present invention. In this figure, the same configurations as those of FIG. 26 which is used in the eighth embodiment are given the identical numeral and character, and thus, their description is omitted.

In FIG. 30, a protective film 264 is preferably made of SiO2. As shown in FIG. 30, an uneven shape is formed at its upper surface. A convex portion 264a of the protective film 264 is provided, over the part where the comb-type electrode 2 is disposed on the upper surface of the substrate 1, and in its vicinity. On the other hand, a concave portion 264b of the protective film 264 is provided, in the part where no comb-type electrode 2 is disposed on the upper surface of the substrate 1 between the convex portions 264a. Herein, one convex portion 264a and one concave portion 264b of the protective film 64 are one pitch, the pitch width of one pitch is L, the width of the top part of the convex portion 264a of the protective film 264 is L1, and the width of the bottom part of the concave portion 264b of the protective film 264 is L2. The ratio (L−L2)/L of (L−L2) to the pitch width L is η'. Furthermore, the height from the surface of the substrate 1 which is in contact with the protective film 264 to the top part of the convex portion 264a of the protective film 264 is t, the height from the surface of the substrate 1 which is in contact with the protective film 264 to the bottom part of the concave portion 264b of the protective film 264 is t1, and the height (t-t1) from the bottom part of the concave portion 264b of the protective film 264 to the top part of the convex portion 264a is t2.

This twelfth embodiment is different from FIG. 26 of the eighth embodiment, in the following respect. In FIG. 26 of the eighth embodiment, the shape of the convex portion 4a of the protective film 4 is nearly square and its corner is roughly 90°. In contrast, in FIG. 30 of this twelfth embodiment, the shape of the convex portion 264a of the protective film 264 is rounded at its corner. Furthermore, in FIG. 26 of the eighth embodiment, the height t2 from the bottom part of the concave portion 4b of the protective film 4 to the top part of the convex portion 4a is equal to, or more than, the height h of the comb-type electrode 2. In contrast, in FIG. 30 of this twelfth embodiment, the height t2 from the bottom part of the concave portion 264b of the protective film 264 to the top part of the convex portion 264a is below the height h of the comb-type electrode 2.

According to the twelfth embodiment of the present invention, the following correlation is satisfied, $$0 < h < t2$$

(herein, the correlations of $\eta' - 0.3 < \eta \leq \eta'$, $L \approx p$, $p1 + p2 \approx p$ and $L1 > p1$ are satisfied). In addition, the following correlations are also satisfied, $$L1 + L2 < L \text{ and } L2 < p2.$$

Herein, even in this twelfth embodiment, taking characteristics into account, it is preferable that the correlation between the height h of the comb-type electrode and the pitch width p of one pitch of this comb-type electrode be, $$0.05 \leq h/(2 \times p)$$

A creation method for the SAW device according to this twelfth embodiment is the same as that described in the eighth embodiment, and thus, its description is omitted.

With respect to the SAW device which is configured as described above, electrical characteristics are examined. As a result, the inventors have confirmed that good characteristics can be obtained.

In addition, the inventors also examine temperature characteristics. Consequently, they have also confirmed that good temperature characteristics can be obtained, if SiO2 is used as the protective film, and the height t1 from the surface of the substrate to the concave portion of the protective film meets the condition of, $$18\% \leq t1/(2 \times p) \leq 35\%.$$

Thirteenth Embodiment

Hereinafter, an SAW device according to a thirteenth embodiment of the present invention will be described with reference to the drawings.

Figure 31:
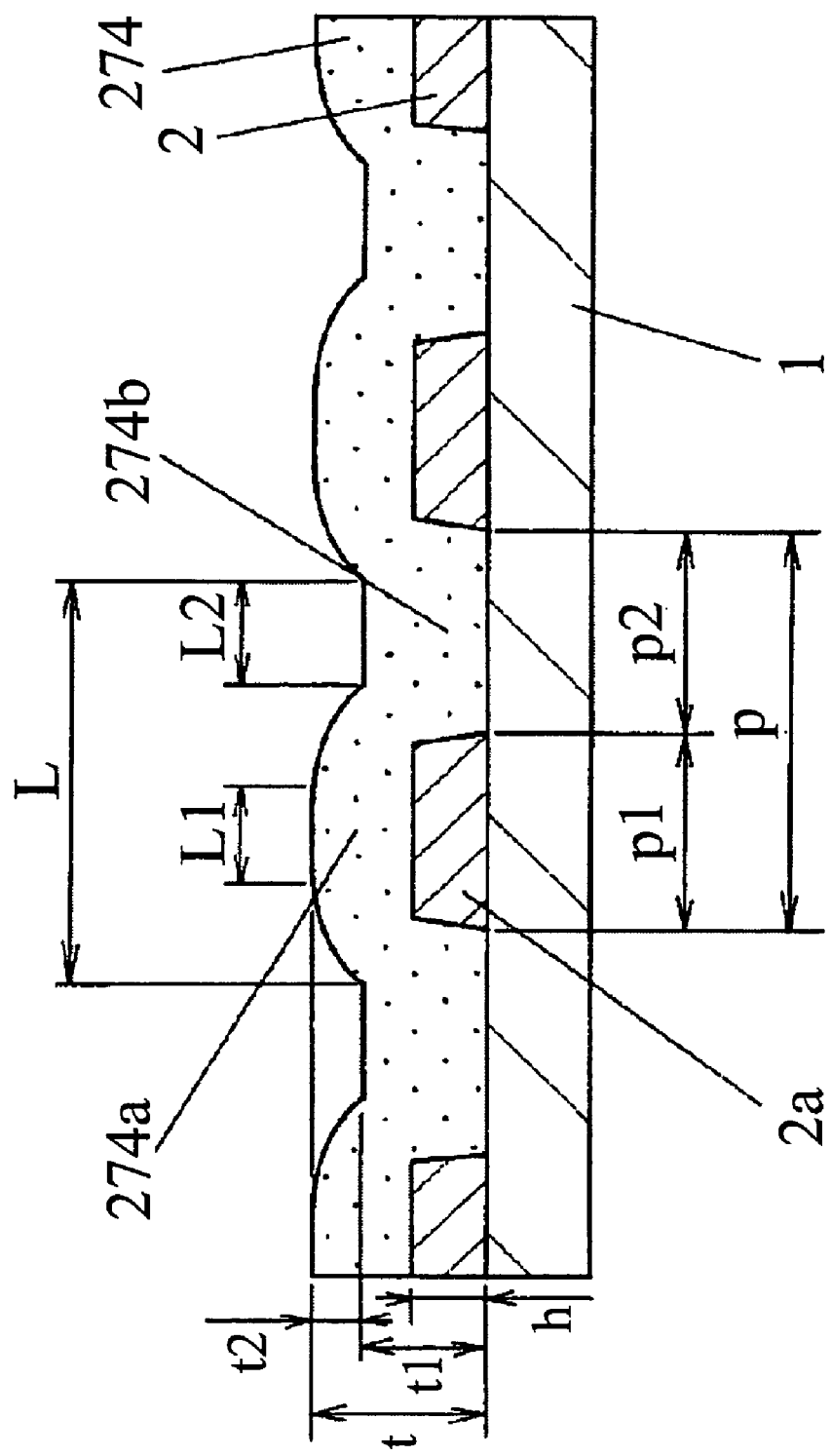
FIG. 31 is a sectional view of an electronic part according to a thirteenth embodiment of the present invention.

In this thirteenth embodiment, the same SAW device is used as the SAW device which is used in the eighth embodiment. FIG. 31 is a sectional view of the SAW device according to the thirteenth embodiment of the present invention. In this figure, the same configurations as those of FIG. 26 which is used in the eighth embodiment are given the identical numeral and character, and thus, their description is omitted.

In FIG. 31, a protective film 274 is preferably made of SiO2. As shown in FIG. 31, an uneven shape is formed at its upper surface. A convex portion 274a of the protective film 274 is provided, over the part where the comb-type electrode 2 is disposed on the upper surface of the substrate 1, and in its vicinity. On the other hand, a concave portion 274b of the protective film 274 is provided, in the part where no comb-type electrode 2 is disposed on the upper surface of the substrate 1 between the convex portions 274a. Herein, one convex portion 274a and one concave portion 274b of the protective film 274 are one pitch, the pitch width of one pitch is L, the width of the top part of the convex portion 274a of the protective film 274 is L1, and the width of the bottom part of the concave portion 274b of the protective film 74 is L2. The ratio (L−L2)/L of (L−L2) to the pitch width L is η'. Furthermore, the height from the surface of the substrate 1 which is in contact with the protective film 274 to the top part of the convex portion 274a of the protective film 274 is t, the height from the surface of the substrate 1 which is in contact with the protective film 274 to the bottom part of the concave portion 274b of the protective film 274 is t1, and the height (t−t1) from the bottom part of the concave portion 274b of the protective film 274 to the top part of the convex portion 274a is t2.

This thirteenth embodiment is different from FIG. 26 of the eighth embodiment, in the following respect. In FIG. 26 of the eighth embodiment, the width L1 of the top part of the convex portion 4a of the protective film 4 is greater than the width p1 of the electrode 2a. Therefore, the convex portion 4a of the protective film 4 is located over the electrode 2a and in its vicinity. In contrast, in this thirteenth embodiment, the width L1 of the top part of the convex portion 274a of the protective film 274 is narrower than the width p1 of the electrode 2a. Further, in FIG. 26 of the eighth embodiment, the height t2 from the bottom part of the concave portion 4b of the protective film 4 to the top part of the convex portion 4a is equal to, or more than, the height h of the comb-type electrode 2. In contrast, in FIG. 31 of this thirteenth embodiment, the height t2 from the bottom part of the concave portion 274b of the protective film 274 to the top part of the convex portion 274a is below the height h of the comb-type electrode 2.

According to the thirteenth embodiment of the present invention, the following correlation is satisfied, $0 < t2 < h$ (herein, the correlations of L1+L2<L, L2<p2, L1≦p1, L≈p and p1+p2≈p are satisfied). In addition, the following correlations are also satisfied, $L1+L2<L$ and $L2<p2$.

Herein, even in this thirteenth embodiment, taking characteristics into account, it is preferable that the correlation between the height h of the comb-type electrode and the pitch width p of one pitch of this comb-type electrode be, $0.05 \leq h/(2 \times p)$.

A creation method for the SAW device according to this thirteenth embodiment is the same as that described in the eighth embodiment, and thus, its description is omitted.

With respect to the SAW device which is configured as described above, electrical characteristics are examined. As a result, the inventors have confirmed that good characteristics can be obtained.

In addition, the inventors also examine temperature characteristics. Consequently, they have also confirmed that good temperature characteristics can be obtained, if SiO2 is used as the protective film, and the height t from the surface of the substrate to the concave portion of the protective film meets the condition of, $18\% \leq t/(2 \times p) \leq 35\%$.

Herein, any of the SAW devices described as the eighth to thirteenth embodiments can be used for the transmission SAW filter 122a and the reception SAW filter 122b which are shown in FIG. 24B. In the mobile telephone which is config- ured in this way, the inventors measure its sensibility under an environment of −25° C. to 85° C. They have confirmed that even if the temperature changes, there is little change in the sensibility.

Fourteenth Embodiment

Figure 32:
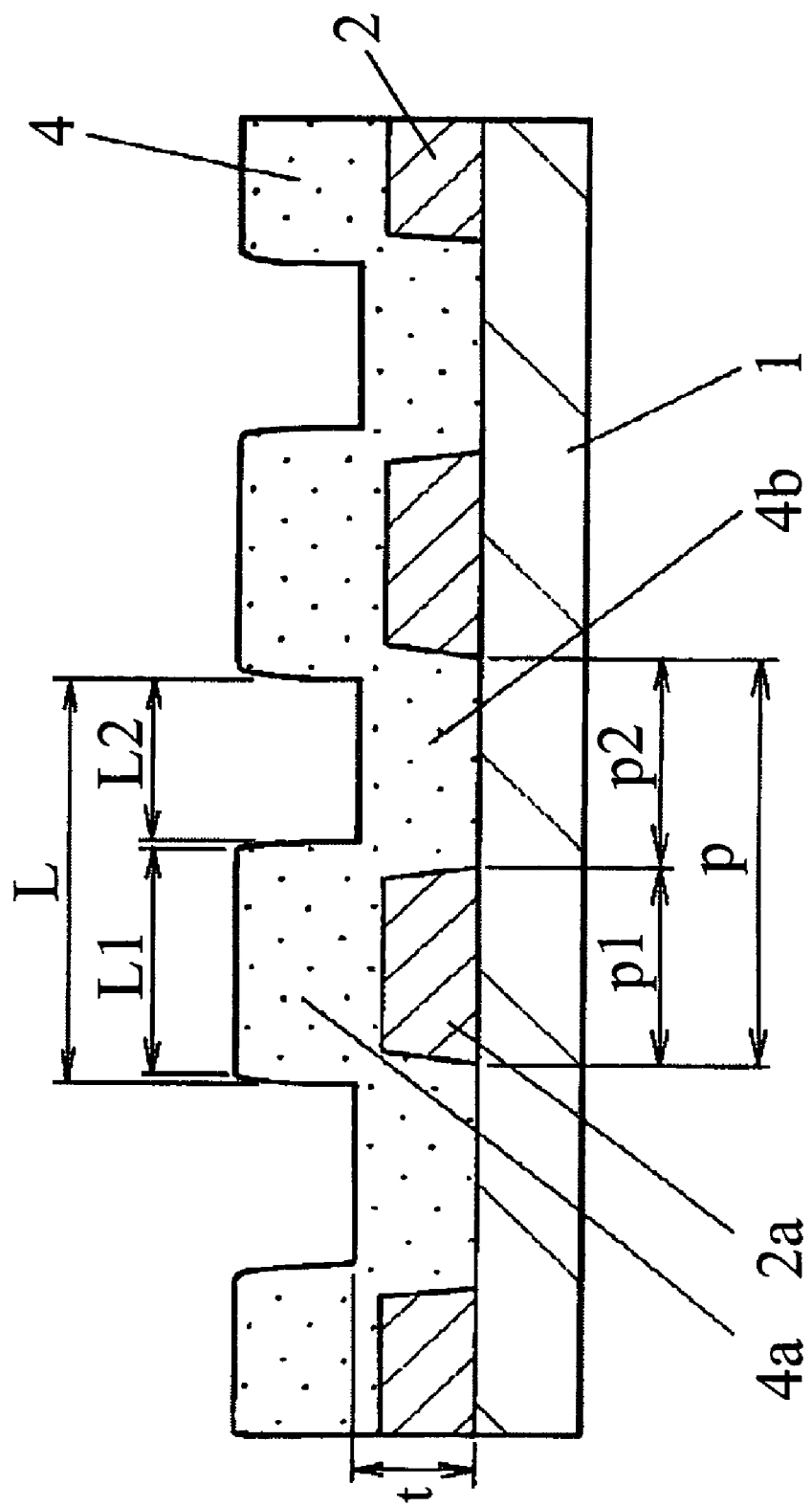
FIG. 32 is a sectional view of an electronic part according to a fourteenth embodiment of the present invention.

FIG. 32 is a sectional view of an SAW device according to a fourteenth embodiment of the present invention. Its top view is identical to FIG. 1A.

As shown in FIG. 1A and FIG. 32, the SAW device according to this fourteenth embodiment includes a comb-type electrode 2 on the upper surface of a substrate 1, a reflector 3 on both sides of this comb-type electrode 2, and a protective film 4 which covers at least these comb-type electrode 2 and reflector 3. In addition, the comb-type electrode 2 is provided with a pad 5 for taking out an electric signal which is electrically connected to the comb-type electrode 2. Thereby, the SAW device is configured.

The substrate 1 is made of lithium tantalate which is cut out of a Y-sheet that is turned by several degrees around the X-axis in the Z-axis direction. It is a 36° YLT substrate which is obtained at a turning angle of 36°.

The comb-type electrode 2 is made of aluminum (hereinafter, referred to as "Al"), or an aluminum alloy.

The protective film 4 is preferably made of silicon dioxide (hereinafter, referred to as "SiO2"), or an aluminum alloy. As shown in FIG. 32, an uneven shape is formed at its top surface. A convex portion 4a of the protective film 4 is provided, over the part where the comb-type electrode 2 is disposed on the upper surface of the substrate 1, and in its vicinity. On the other hand, a concave portion 4b of the protective film 4 is provided in the part where no comb-type electrode 2 is disposed on the upper surface of the substrate 1 between the convex portions 4a.

Herein, one convex portion 4a and one concave portion 4b of the protective film 4 are one pitch, the pitch width of one pitch is L, the width of the top part of the convex portion 4a of the protective film 4 is L1, and the width of the bottom part of the concave portion 4b of the protective film 4 is L2. Further, in the same way as one pitch of the protective film 4, the width of one pitch of the comb-type electrode 2 from one electrode finger 2a of the comb-type electrode 2 to the part in which the adjacent electrode finger 2a is disposed on one side is p. Moreover, the width of each electrode finger is p1, the width between the adjacent electrode fingers is p2 (herein, p=p1+p2 is satisfied).

In addition, the height from the surface of the substrate 1 which is in contact with the protective film 4 to the bottom part of the concave portion 4b of the protective film 4 is the thickness t of the protective film 4.

Furthermore, the ratio (L−L2)/L of (L−L2) to the pitch width L is η' and the ratio p1/p of the width p1 of each electrode finger to the width p of one pitch of the comb-type electrode 2 is η.

According to the fourteenth embodiment of the present invention, the following correlation is satisfied, $\eta' - 0.3 < \eta \leq \eta'$ (herein, the correlations of L≈p, p1+p2≈p and L1>p1 are satisfied).

Herein, as described above, the 36° YLT is used in the substrate 1. However, the same advantage can be obtained, if this substrate 1 is LT which is cut out of a Y-sheet that is turned by D° around the X-axis in the Z-axis direction, and the D° YLT substrate is used for which the rotational angle D° is, $$38° \leq D°$$

A creation method for the SAW device according to this fourteenth embodiment is the same as that shown in FIG. 2A to FIG. 2H, and thus, its description is omitted.

With respect to the SAW device which is created as described above, electrical characteristics (i.e., resonator characteristics) are examined. As a result, the inventors have confirmed that good characteristics can be obtained.

In addition, the inventors also examine temperature characteristics. Consequently, they have also confirmed that good temperature characteristics can be obtained, if SiO2 is used as the protective film, and the thickness t of the protective film which is defined as the height from the surface of the substrate to the concave portion of the protective film meets the condition of, $$[18\% \leq t/(2 \times p) \leq 35\%].$$

Fifteenth Embodiment

Hereinafter, an SAW device according to a fifteenth embodiment of the present invention will be described with reference to the drawings.

Figure 33:
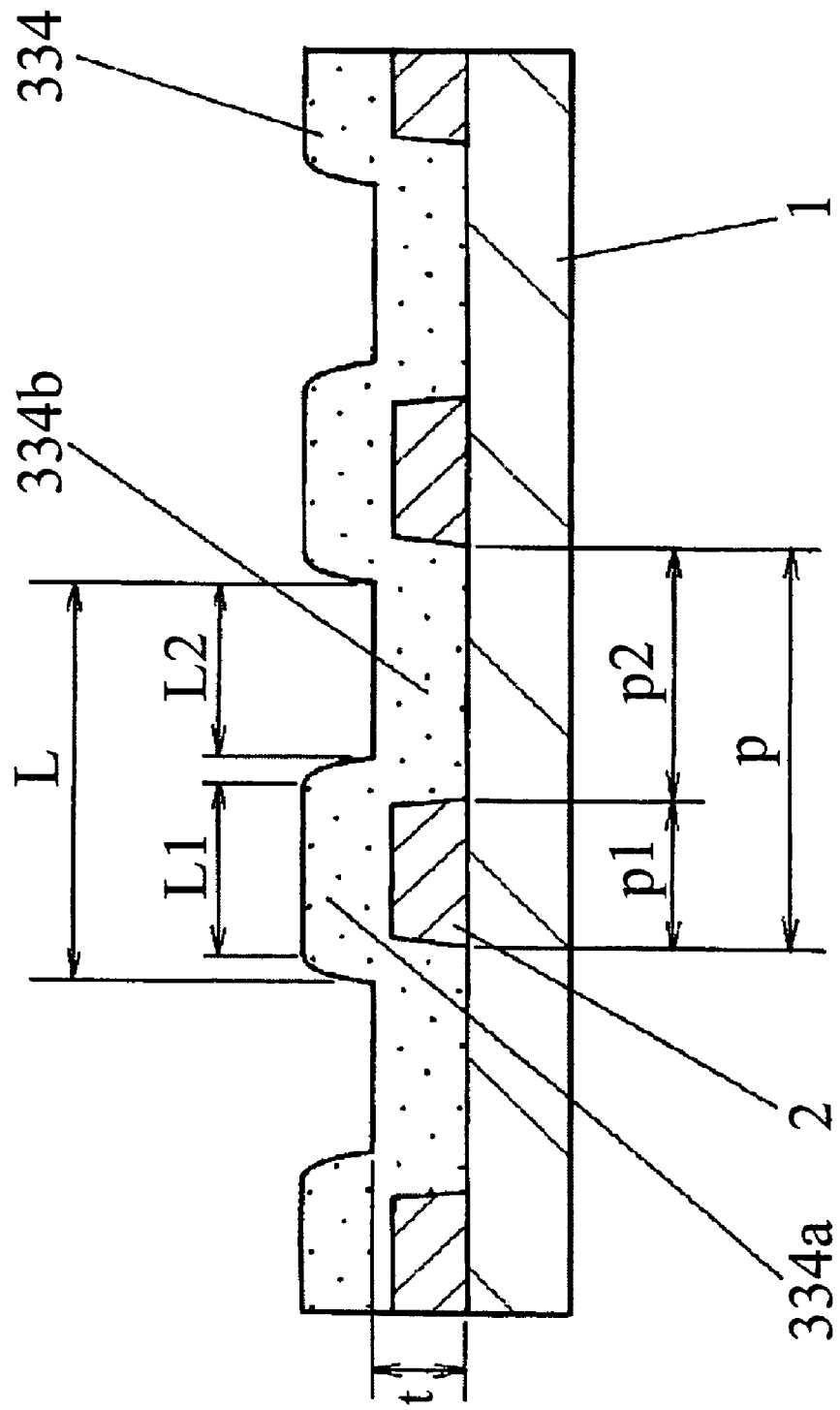
FIG. 33 is a sectional view of an electronic part according to a fifteenth embodiment of the present invention.

In this fifteenth embodiment, the same SAW device is used as the SAW device of the fourteenth embodiment. FIG. 33 is a sectional view of the SAW device according to the fifteenth embodiment of the present invention. In this figure, the same configurations as those of FIG. 32 which is used in the fourteenth embodiment are given the identical numeral and character, and thus, their description is omitted.

In FIG. 33, a protective film 334 is preferably made of silicon dioxide (hereinafter, referred to as "SiO2"). As shown in FIG. 33, an uneven shape is formed at its upper surface. A convex portion 334a of the protective film 334 is provided, over the part where the comb-type electrode 2 is disposed on the upper surface of the substrate 1, and in its vicinity. On the other hand, a concave portion 334b of the protective film 334 is provided, in the part where no comb-type electrode 2 is disposed on the upper surface of the substrate 1 between the convex portions 334a. Herein, one convex portion 334a and one concave portion 334b of the protective film 334 are one pitch, the pitch width of one pitch is L, the width of the top part of the convex portion 334a of the protective film 334 is L1, and the width of the bottom part of the concave portion 334b of the protective film 334 is L2.

This fifteenth embodiment is different from the fourteenth embodiment shown in FIG. 32, in the following respect. In FIG. 32 of the fourteenth embodiment, the shape of the convex portion 4a of the protective film 4 is nearly square and its corner is roughly 90°. In contrast, in the fifteenth embodiment of the present invention, the shape of the convex portion 334a of the protective film 334 is rounded at its corner.

According to the fifteenth embodiment of the present invention, the following correlation is satisfied, $$\eta' - 0.3 < \eta \leq \eta'$$

(herein, the correlations of L≈p, p1+p2≈p and L1>p1 are satisfied). In addition, the following correlations are also satisfied, $$L1+L2<L \text{ and } L2<p2.$$

A creation method for the SAW device according to this fifteenth embodiment is the same as that described in the fourteenth embodiment, and thus, its description is omitted.

With respect to the SAW device which is configured as described above, electrical characteristics (i.e., resonator characteristics) are examined. As a result, the inventors have confirmed that good characteristics can be obtained. In addition, the inventors also examine temperature characteristics. Consequently, they have also confirmed that good temperature characteristics can be obtained, if SiO2 is used as the protective film, and the height t from the surface of the substrate to the concave portion of the protective film meets the condition of, $$18\% \leq t/(2 \times p) \leq 35\%.$$

Sixteenth Embodiment

Hereinafter, an SAW device according to a sixteenth embodiment of the present invention will be described with reference to the drawings.

Figure 34:
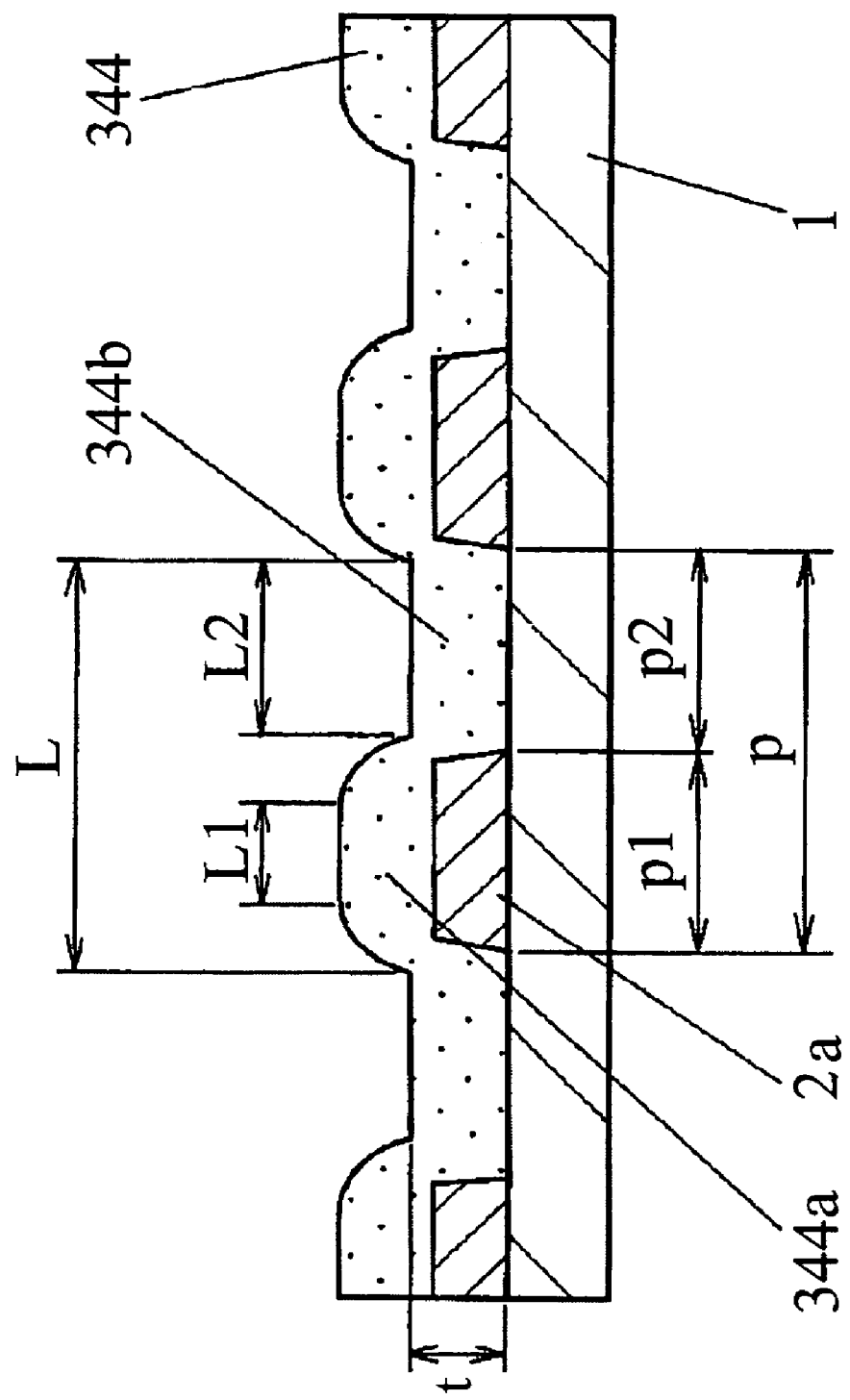
FIG. 34 is a sectional view of an electronic part according to a sixteenth embodiment of the present invention.

In this sixteenth embodiment, the same SAW device is used as the SAW device of the fourteenth embodiment. FIG. 34 is a sectional view of the SAW device according to the sixteenth embodiment of the present invention. In this figure, the same configurations as those of FIG. 32 which is used in the fourteenth embodiment are given the identical numeral and character, and thus, their description is omitted.

In FIG. 34, a protective film 344 (or reference numeral 4 in FIG. 32) is preferably made of SiO2. As shown in FIG. 34, an uneven shape is formed at its upper surface. A convex portion 344a of the protective film 344 is provided, over the part where the electrode finger 2a is disposed on the upper surface of the substrate 1, and in its vicinity. On the other hand, a concave portion 344b of the protective film 44 is provided, in the part where no comb-type electrode 2 is disposed on the upper surface of the substrate 1 between the convex portions 344a. Herein, one convex portion 344a and one concave portion 344b of the protective film 344 are one pitch, the pitch width of one pitch is L, the width of the top part of the convex portion 344a of the protective film 344 is L1, and the width of the bottom part of the concave portion 344b of the protective film 344 is L2.

This sixteenth embodiment is different from the fourteenth embodiment shown in FIG. 32, in the following respect. In FIG. 32 of the fourteenth embodiment, the width L1 of the top part of the convex portion 4a of the protective film 4 is greater than the width p1 of the electrode finger 2a. Therefore, the convex portion 4a of the protective film 4 is located over the electrode finger 2a and in its vicinity. In contrast, in this sixteenth embodiment, the width L1 of the top part of the convex portion 344a of the protective film 344 is narrower than the width p1 of the electrode finger 2a.

According to the sixteenth embodiment of the present invention, the following correlations need to be satisfied, $$L1+L2<L, L2<p2, \text{and} L1 \leq p1$$

(herein, the correlations of L≈p and p1+p2≈p are satisfied).

A creation method for the SAW device according to this sixteenth embodiment is the same as that described in the fourteenth embodiment, and thus, its description is omitted.

With respect to the SAW device which is configured as described above, electrical characteristics (i.e., resonator characteristics) are examined. As a result, the inventors have confirmed that good characteristics can be obtained. In addition, the inventors also examine temperature characteristics. Consequently, they have also confirmed that good temperature characteristics can be obtained, if SiO2 is used as the protective film, and the height t from the surface of the substrate to the concave portion of the protective film meets the condition of, $$18\% \leq t/(2 \times p) \leq 35\%.$$

Herein, any of the SAW devices described as the fourteenth to sixteenth embodiments can be used for the transmission SAW filter 122a and the reception SAW filter 122b which are shown in FIG. 24B. In the mobile telephone which is configured in this way, the inventors measure its sensibility under an environment of −25° C. to 85° C. They have confirmed that even if the temperature changes, there is little change in the sensibility.

The present invention is described in detail, but the above described description is illustrations in all aspects. The present invention is not limited to those. Numerous variations which are not illustrated can be expected without departing from the scope of the present invention.

(How to Decide the Widths L1, L2)

Figure 35A:
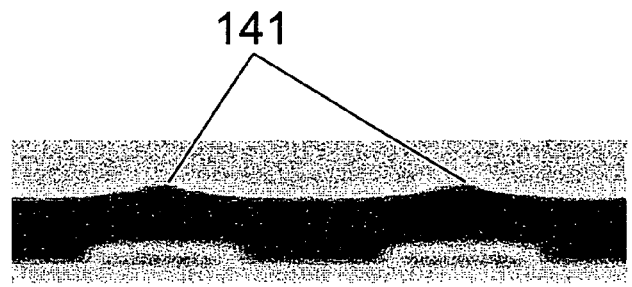
FIG. 35A is a sectional SEM photograph of an electronic part according to an embodiment of the present invention.
Figure 35B:
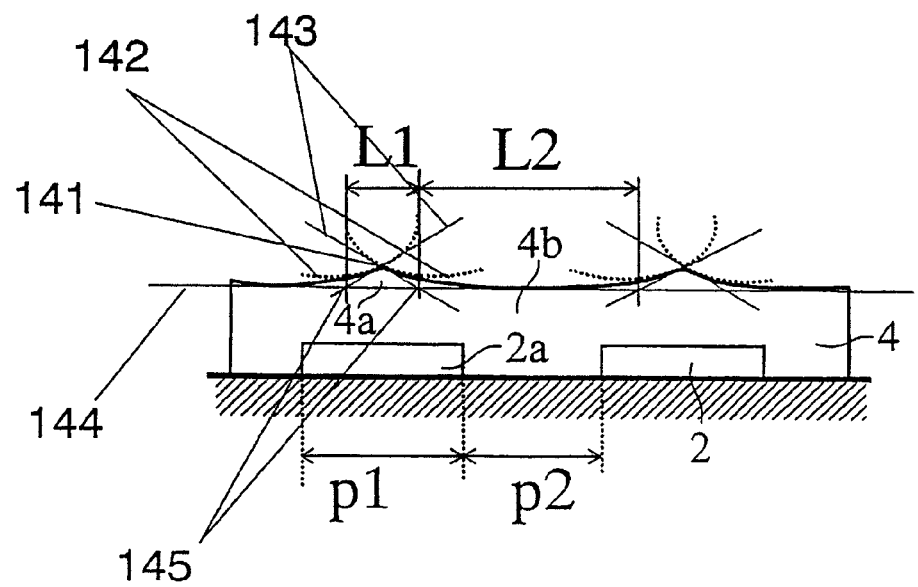
FIG. 35B is a sectional view of an electronic part according to an embodiment of the present invention, showing the definition of its structure.

Herein, in the embodiments 1 to 12 and the comparative examples 1 to 11, the method of determining the width L1 of the convex portion of the protective film and the width L2 of the concave portion is described. With respect to the sectional shape of the SAW device, the surface of the SAW device is coated with metal, then the electrode is cut off using an FIB (or focused ion beam) in the propagation direction of the SAW, next it is observed using an electron microscope (or SEM) as shown in FIG. 15A to FIG. 15E or the like, and as a result, the shape is specified. Herein, for example, as can be seen from the sectional shape of the electrode shown in FIG. 35A, in the case where a top part 141 of the convex portion of the protective film 4 of SiO2 is substantially a point, and it is curved and rounded to the bottom part from the top part 141 of the convex portion so that the boundary between the width L1 and the width L2 is unclear, as shown in FIG. 35B, the side near the top part 141 of the convex portion from the bottom part to the top part is approximated using a curved line 142, an intersection point 145 between a tangential line 143 in the top part 141 of the convex portion of the curved line and a straight line 144 which connects the bottom portions of the adjacent protective films 4 is defined as the boundary between the width L1 and the width L2.

OUTLINE OF INVENTION

A first aspect of the present invention is an electronic part, and in a protective film which has an uneven shape at its top surface that is provided in the electronic part, if a height from the surface of the substrate which is in contact with the protective film to a top part of a convex portion of the protective film is t, a height from the surface of the substrate which is in contact with the protective film to a bottom part of a concave portion of the protective film is t1, a height (t-t1) from the top part of the convex portion of the protective film to the bottom part of the concave portion of the protective film is t2, a pitch width of one pitch in the uneven shape of the protective film is L, a width of one pitch of the convex portion of an unevenness in the uneven shape of the protective film is L1, a width of one pitch of the concave portion is L2, a pitch width of one pitch of the comb-type electrode is p, a width of one of electrode fingers which form the comb-type electrode is p1, a width between the electrode fingers is p2, and a film thickness of the comb-type electrode is h, that satisfies, $$t2 \leq h$$

(herein, correlations of L≈p, p1+p2=p, L1+L2=L, L1≦p1 and L2≧p2 are satisfied). Therefore, the shape of a protective film on an electrode produces less effect, and an unnecessary SAW is restrained from being reflected. As a result, even if the protective film is formed to cover the electrode and there is an uneven shape on its surface, then there is an advantage in that an electronic part which has good characteristics can be obtained.

Furthermore, a second aspect of the present invention is an electronic part, and in a protective film which has an uneven shape at its top surface that is provided in the electronic part, if a height from the surface of the substrate which is in contact with the protective film to a top part of a convex portion of the protective film is t, a height from the surface of the substrate which is in contact with the protective film to a bottom part of a concave portion of the protective film is t1, a height (t-t1) from the top part of the convex portion of the protective film to the bottom part of the concave portion of the protective film is t2, a pitch width of one pitch in the uneven shape of the protective film is L, a width of one pitch of the convex portion of an unevenness in the uneven shape of the protective film is L1, a width of one pitch of the concave portion is L2, a pitch width of one pitch of the comb-type electrode is p, a width of one of electrode fingers which form the comb-type electrode is p1, a width between the electrode fingers is p2, and a film thickness of the comb-type electrode is h, that satisfies, $$h = < t2$$

(herein, correlations of L≈p, p1+p2=p, L1+L2=L, L1≦p1 and L2≧p2 are satisfied). Therefore, even if the protective film is formed to cover the electrode, because a difference in the mass which is borne on a substrate is provided between the part of the electrode and the part between electrode fingers, the reflection coefficient of an SAW can be kept from being reduced at the end part of the electrode, or it can be improved. This presents an advantage in that an electronic part which is small and has good characteristics can be obtained.

Moreover, a third aspect of the present invention is an electronic part, and in a protective film which has a substantially-flat top surface that is provided in the electronic part, when a height from the surface of the substrate which is in contact with the protective film to the top surface of the protective film is t and a pitch width of one pitch of the comb-type electrode is p, if the substrate is a lithium-tantalate substrate and a cutout angle of the lithium-tantalate substrate is D° as a rotational angle thereof around an X-axis against a Z-axis direction, then the substrate is cut out of a Y-sheet at an angle which satisfies, $$38° \leq D°, \text{ and}$$

that satisfies, $$18\% \leq t/(2 \times p) \leq 35\%.$$

This presents an advantage in that an electronic part whose temperature characteristic changes less and whose characteristics are good can be obtained.

Furthermore, a fourth aspect of the present invention is an electronic part, and in a protective film which has an uneven shape at its top surface that is provided in the electronic part, if a height from the surface of the substrate which is in contact with the protective film to the top part of a convex portion of the protective film is t, a height from the surface of the substrate which is in contact with the protective film to a bottom part of a concave portion of the protective film is t1, a height (t-t1) from the top part of the convex portion of the protective film to the bottom part of the concave portion of the protective film is t2, a pitch width of one pitch in the uneven shape of the protective film is L, a width of one pitch of the convex portion of an unevenness in the uneven shape of the protective film is L1, a width of one pitch of the concave portion is L2, a ratio (L−L2)/L of (L−L2) to the pitch width L is η', a height of the comb-type electrode is h, a pitch width of one pitch of the comb-type electrode is p, a width of one of electrode fingers which form the comb-type electrode is p1, a width between the electrode fingers is p2, and a ratio p1/p of the width p1 of the electrode finger to the pitch p of the comb-type electrode is 77, that satisfies, $$h \leq t2$$

(herein, correlations of η'−0.3<η≦η', L≈p, p1+p2≈p and L1>p1 are satisfied). Therefore, the shift of the physical SAW reflection surface at the end surface of the electrode finger from the physical reflection surface at the end part of the convex portion of the protective film can be kept within a certain range. Even if the protective film is formed to cover the electrode, because a certain or larger difference in level is provided between the top part of the convex portion of the protective film and the bottom part of the concave portion of the protective film, an adequate SAW reflection coefficient can be secured. This presents an advantage in that an electronic part which is smaller and has good performance can be obtained.

Furthermore, a fifth aspect of the present invention is an electronic part, and in a protective film which has an uneven shape at its top surface that is provided in the electronic part, if a height from the surface of the substrate which is in contact with the protective film to a top part of a convex portion of the protective film is t, a height from the surface of the substrate which is in contact with the protective film to a bottom part of a concave portion of the protective film is t1, a height (t−t1) from the top part of the convex portion of the protective film to the bottom part of the concave portion of the protective film is t2, a pitch width of one pitch in the uneven shape of the protective film is L, a width of one pitch of the top part of the convex portion of an unevenness in the uneven shape of the protective film is L1, a width of one pitch of the concave portion is L2, a height of the comb-type electrode is h, a pitch width of one pitch of the comb-type electrode is p, a width of one of electrode fingers which form the comb-type electrode is p1, and a width between the electrode fingers is p2, that satisfies, $$h \leq t2$$

(herein, correlations of L1+L2<L, L2<p2, L1≦p1, L≈p and p1+p2≦p are satisfied). Therefore, between the end part of the top part of the convex portion in the unevenness of the protective film and the end part of the bottom part of the concave portion, the height t2 from the top part of the convex portion of the protective film to the bottom part of the concave portion of the protective film can be gently changed. Thereby, the effect of the unevenness of the protective film on the characteristics can be relieved. At the same time, a certain or larger difference in the mass which is borne on the substrate is provided at the part of the electrode finger and between the electrode fingers. Thus, the reflection coefficient of an SAW can be secured. Even if the protective film is formed to cover the electrode, there is an advantage in that an electronic part which is small and has good performance can be obtained.

Furthermore, a sixth aspect of the present invention is an electronic part, and in a protective film which has an uneven shape at its top surface that is provided in the electronic part, if a height from the surface of the substrate which is in contact with the protective film to the top part of a convex portion of the protective film is t, a height from the surface of the substrate which is in contact with the protective film to a bottom part of a concave portion of the protective film is t1, a width (t−t1) from the top part of the convex portion of the protective film to the bottom part of the concave portion of the protective film is t2, a pitch width of one pitch in the uneven shape of the protective film is L, a width of one pitch of the convex portion of an unevenness in the uneven shape of the protective film is L1, a width of one pitch of the concave portion is L2, a ratio (L−L2)/L of (L−L2) to the pitch width L is η', a height of the comb-type electrode is h, a pitch width of one pitch of the comb-type electrode is p, a width of one of electrode fingers which form the comb-type electrode is p1, a width between the electrode fingers is p2, and a ratio p1/p of the width p1 of the electrode finger to the pitch p of the comb-type electrode is η, that satisfies, $$0 < t2 < h$$

(herein, correlations of η'−0.3<η≦η', L≈p, p1+p2≈p and L1>p1 are satisfied). Therefore, the shift of the electrical SAW reflection surface at the end surface of the electrode finger from the physical reflection surface at the end part of the convex portion of the protective film can be kept within a certain range. In addition, the level of the unevenness in the uneven shape of the protective film is set within a certain range. This restrains the shape of an SiO2 film from affecting the propagation of an SAW. Even if the protective film is formed to cover the electrode, there is an advantage in that an electronic part which has good performance can be obtained.

Furthermore, a seventh aspect of the present invention is an electronic part, and in a protective film which has an uneven shape at its top surface that is provided in the electronic part, if a height from the surface of the substrate which is in contact with the protective film to a top part of a convex portion of the protective film is t, a height from the surface of the substrate which is in contact with the protective film to a bottom part of a concave portion of the protective film is t1, a width (t−t1) from the top part of the convex portion of the protective film to the bottom part of the concave portion of the protective film is t2, a pitch width of one pitch in the uneven shape of the protective film is L, a width of one pitch of the top part of the convex portion of an unevenness in the uneven shape of the protective film is L1, a width of one pitch of the concave portion is L2, a height of the electrode finger is h, a pitch width of one pitch of the comb-type electrode is p, a width of one of the electrode fingers which form the comb-type electrode is p1, and a width between the electrode fingers is p2, that satisfies, $$0 < t2 < h$$

(herein, correlations of L1+L2<L, L2<p2, L1≦p1, L≈p and p1+p2≈p are satisfied). Therefore, between the top part of the convex portion and the end part of the bottom part of the concave portion in the uneven shape of the protective film, the level of the unevenness of the protective film is set within a certain range. In addition, the height t2 from the top part of the convex portion of the protective film to the bottom part of the concave portion of the protective film can be gently changed. Thereby, the effect of the unevenness of the protective film on the characteristics can be relieved. Even if the protective film is formed to cover the electrode, there is an advantage in that an electronic part which has good performance can be obtained.

Furthermore, an eighth aspect of the present invention is an electronic part, and in a protective film which has an uneven shape at its top surface that is provided in the electronic part, if a pitch width of one pitch in the uneven shape of the protective film is L, a width of one pitch of a convex portion of an unevenness in the uneven shape of the protective film is L1, a width of one pitch of the concave portion is L2, a ratio (L−L2)/L of (L−L2) to the pitch width L is η', a pitch width of one pitch of the comb-type electrode is p, a width of one of electrode fingers which form the comb-type electrode is p1, a width between the electrode fingers is p2, and a ratio p1/p of the width p1 of the electrode finger to the pitch p of the comb-type electrode is η, that satisfies, $$\eta'-0.3<\eta\leq\eta'$$

(herein, correlations of L≈p, p1+p2=p and L1>p1 are satisfied). Therefore, the positional shift of the end surface of the electrode finger which is a physical SAW reflection surface from the end part of the convex portion of the protective film which is also a physical SAW reflection surface can be kept within a certain range. Even if the protective film is formed to cover the electrode and there is an uneven shape on its surface, then there is an advantage in that an electronic part which has good characteristics can be obtained.

Furthermore, a ninth aspect of the present invention is an electronic part, and in a protective film which has an uneven shape at its top surface that is provided in the electronic part, if a pitch width of one pitch in the uneven shape of the protective film is L, a width of one pitch of a convex portion of an unevenness in the uneven shape of the protective film is L1, a width of one pitch of the concave portion is L2, a pitch width of one pitch of the comb-type electrode is p, a width of one of electrode fingers which form the comb-type electrode is p1, and a width between the electrode fingers is p2, that satisfies, $$L1+L2<L, L2<p2 \text{ and } L1\leq p1$$

(herein, correlations of L≈p and p1+p2≈p are satisfied) Therefore, between the top part of the convex portion and the end part of the bottom part of the concave portion in the uneven shape of the protective film, the thickness of the protective film which is defined as the height from the surface of the substrate to the surface of the protective film can be gently changed. Thereby, the influence of the reflection of an SAW on the boundary of the unevenness of the protective film is less. Even if the protective film is formed to cover the electrode and there is an uneven shape on its surface, then there is an advantage in that an surface acoustic-wave device which has good characteristics can be obtained.

As described so far, according to the present invention, an electronic part which is excellent in temperature characteristics and electrical properties can be obtained by forming a protective film so that it covers an electrode that is formed on a substrate and setting the shape or thickness of the protective film within a specific range.

INDUSTRIAL APPLICABILITY

The present invention realizes an electronic part and electronic equipment which are excellent in temperature characteristics and electrical properties can be obtained by forming a protective film so that it covers an electrode that is formed on a substrate and setting the shape or thickness of the protective film within a specific range. It is industrially useful.

The invention claimed is:

1. An electronic part which includes a substrate, a comb-type electrode that is disposed on an upper surface of the substrate, and a protective film that covers the comb-type electrode and has an uneven shape at a top surface thereof, wherein a height from the surface of the substrate which is in contact with the protective film to a top part of a convex portion of the protective film is t, a height from the surface of the substrate which is in contact with the protective film to a bottom part of a concave portion of the protective film is t1, a height (t-t1) from the top part of the convex portion of the protective film to the bottom part of the concave portion of the protective film is t2, a pitch width of one pitch in the uneven shape of the protective film is L, a width of one pitch of the convex portion of an unevenness in the uneven shape of the protective film is L1, a width of one pitch of the concave portion is L2, a pitch width of one pitch of the comb-type electrode is p, a width of one of electrode fingers which form the comb-type electrode is p1, a width between the electrode fingers is p2, and a film thickness of the comb-type electrode is h so as to satisfy t2≤h, and wherein correlations of L≈p, p1+p2=p, L1+L2=L, L1<p1 and L2>p2 are satisfied).

2. The electronic part according to claim 1, wherein a correlation between the film thickness h of the comb-type electrode and the pitch width p of one pitch of the comb-type electrode is, $$0.05\leq h/(2\times p).$$

3. The electronic part according to claim 1, wherein a ratio L1/L of the width L1 of one pitch of the convex portion of the unevenness in the uneven shape of the protective film to the pitch width L of one pitch of the protective film is η' and a ratio p1/p of the width p1 of one of the electrode fingers which form the comb-type electrode to the pitch width p of one pitch of the comb-type electrode isη, and a correlation betweemη-andη' is, $$\eta'/\eta\leq 0.86$$

wherein correlations of L≈p, p1+p2=p and L1+L2=L are satisfied.

4. The electronic part according to claim 1, wherein a center of the width L1 of one pitch of the convex portion of the unevenness of the protective film is Lc and a center of the width p1 of the electrode finger of the comb-type electrode which is located under the pitch of the convex portion of the protective film is pc, and Lc and pc are, in plan view, substantially on a same straight line.

5. The electronic part according to claim 1, wherein the substrate is a lithium-tantalate substrate and a cutout angle of the lithium-tantalate substrate is D° as a rotational angle thereof around an X-axis against a Z-axis direction and the substrate is cut out of a Y-sheet at an angle which satisfies, $$38°\leq D°.$$

6. The electronic part according to claim 1, wherein with respect to the comb-type electrode which is disposed on the upper surface of the substrate and the protective film which covers the comb-type electrode and has the uneven shape at the top surface thereof, a correlation between the height t1 from the surface of a substrate which is in contact with the protective film to the bottom part of the concave portion of the protective film and the pitch width p of one pitch of the comb-type electrode is, $$13\%\leq t1/(2\times p)\leq 35\%.$$

7. The electronic part according to claim 1, wherein the protective film is silicon dioxide.

8. Electronic equipment which includes at least one antenna and an electric circuit that is electrically connected to the antenna, wherein the electric circuit is provided with a plurality of electronic parts, and at least one of the electronic parts is the electronic part according to claim 1.

* * * * *